US012808079B2

(12) United States Patent
Wang et al.

(10) Patent No.: US 12,808,079 B2
(45) Date of Patent: Nov. 24, 2026

(54) METHODS FOR PRODUCING COMPOSITE CRYSTALS USING A MUTI-CHAMBER DEVICE AND APPLYING TEMPERATURE/PRESSURE CONTROL

(71) Applicant: BOYA ADVANCED MATERIALS CO., LTD., Meishan (CN)

(72) Inventors: Yu Wang, Meishan (CN); Zhenxing Liang, Meishan (CN); Min Li, Meishan (CN); Peng Gu, Meishan (CN)

(73) Assignee: BOYA ADVANCED MATERIALS CO., LTD., Meishan (CN)

( * ) Notice: Subject to any disclaimer, the term of this patent is extended or adjusted under 35 U.S.C. 154(b) by 439 days.

(21) Appl. No.: 18/482,847

(22) Filed: Oct. 6, 2023

(65) Prior Publication Data

US 2024/0110307 A1 Apr. 4, 2024

Related U.S. Application Data

(60) Continuation-in-part of application No. 17/815,219, filed on Jul. 27, 2022, now abandoned, which is a
(Continued)

(30) Foreign Application Priority Data

May 6, 2020 (CN) ........................ 202010373329.8
Jul. 2, 2020 (CN) ........................ 202010626511.X

(51) Int. Cl.
*C30B 25/16* (2006.01)
*C30B 23/00* (2006.01)
(Continued)

(52) U.S. Cl.
CPC ............ *C30B 23/002* (2013.01); *C30B 23/06* (2013.01); *C30B 29/36* (2013.01); *C30B 33/06* (2013.01);
(Continued)

(58) Field of Classification Search
CPC ....... C30B 25/00; C30B 25/02; C30B 25/025; C30B 25/10; C30B 25/16; C30B 25/18;
(Continued)

(56) References Cited

U.S. PATENT DOCUMENTS 4,582,720 A * 4/1986 Yamazaki ............ H01J 37/185
136/258
5,186,718 A 2/1993 Tepman et al.
(Continued)

FOREIGN PATENT DOCUMENTS

CN 1544715 A 11/2004
CN 101150055 A * 3/2008
(Continued)

OTHER PUBLICATIONS

Notice of Rejection in Japanese Application No. 2023-561027 mailed on Nov. 25, 2024, 9 pages.
(Continued)

*Primary Examiner* — Kenneth A Bratland, Jr.
(74) *Attorney, Agent, or Firm* — Poseidon Advanced IP LLC

(57) ABSTRACT

The present disclosure provides a method for producing a composite crystal, the method is performed in a multi-chamber growth device, and the multi-chamber growth device includes a plurality of chambers. The method includes conveying and processing at least one substrate between a plurality of chambers and obtaining at least one composite crystal by growing a target crystal through vapor deposition in one of the plurality of chambers, the at least one composite crystal including the at least one substrate and the target crystal.

12 Claims, 13 Drawing Sheets

1100

Related U.S. Application Data division of application No. 17/520,815, filed on Nov. 8, 2021, now Pat. No. 11,408,089, and a continuation-in-part of application No. 17/451,647, filed on Oct. 21, 2021, now abandoned, which is a continuation of application No. PCT/CN2021/085469, filed on Apr. 2, 2021, said application No. 17/520,815 is a continuation of application No. PCT/CN2021/085468, filed on Apr. 2, 2021.

(51) Int. Cl.
*C30B 23/06* (2006.01)
*C30B 29/36* (2006.01)
*C30B 33/06* (2006.01)

(52) U.S. Cl.
CPC ........ *Y10T 117/00* (2015.01); *Y10T 117/1008* (2015.01)

(58) Field of Classification Search
CPC ..... C30B 25/183; C30B 25/186; C30B 29/00; C30B 29/10; C30B 29/36; C30B 23/002; C30B 23/06; C30B 33/06; C23C 16/02; C23C 16/0218; C23C 16/0227; C23C 16/0236; C23C 16/0254; C23C 16/0272; C23C 16/30; C23C 16/32; C23C 16/325; C23C 16/54; Y10T 117/00; Y10T 117/1008
USPC .......... 117/84, 88–90, 94, 97, 105–106, 200, 117/204, 937, 951, 1
See application file for complete search history.

(56) References Cited

U.S. PATENT DOCUMENTS

| | | | | |
|---|---|---|---|---|
| 5,225,032 | A * | 7/1993 | Golecki | C30B 25/02 117/97 |
| 5,343,827 | A | 9/1994 | Bordui et al. | |
| 5,882,807 | A | 3/1999 | Funato et al. | |
| 5,911,834 | A * | 6/1999 | Fairbairn | C23C 16/45574 134/1.2 |
| 10,533,264 | B1 * | 1/2020 | Sherrill | C30B 29/02 |
| 2001/0013313 | A1 * | 8/2001 | Droopad | C30B 25/18 257/E27.012 |
| 2003/0037724 | A1 | 2/2003 | Snyder et al. | |
| 2005/0016959 | A1 * | 1/2005 | Tan | C23F 1/44 216/83 |
| 2006/0130742 | A1 | 6/2006 | Carter, Jr. et al. | |
| 2006/0254505 | A1 | 11/2006 | Tsvetkov et al. | |
| 2010/0139552 | A1 | 6/2010 | Rengarajan et al. | |
| 2010/0206229 | A1 * | 8/2010 | He | C23C 16/4412 118/719 |
| 2011/0124169 | A1 | 5/2011 | Ye et al. | |
| 2012/0017973 | A1 | 1/2012 | Beck et al. | |
| 2012/0032191 | A1 | 2/2012 | Harada et al. | |
| 2012/0068195 | A1 | 3/2012 | Harada et al. | |
| 2012/0168774 | A1 | 7/2012 | Masuda et al. | |
| 2012/0280363 | A1 | 11/2012 | Sumida et al. | |
| 2013/0029158 | A1 * | 1/2013 | Aigo | H10P 14/2904 117/89 |
| 2013/0280466 | A1 | 10/2013 | Zwieback et al. | |
| 2014/0027787 | A1 | 1/2014 | Gunjishima et al. | |
| 2015/0113799 | A1 | 4/2015 | Takada et al. | |
| 2015/0329968 | A1 | 11/2015 | Tamagaki et al. | |
| 2016/0122902 | A1 | 5/2016 | Harada et al. | |
| 2016/0343570 | A1 | 11/2016 | Watanabe | |
| 2017/0145591 | A1 | 5/2017 | Yoshida | |
| 2018/0057925 | A1 | 3/2018 | Ma et al. | |
| 2018/0216251 | A1 | 8/2018 | Aigo et al. | |
| 2019/0211472 | A1 | 7/2019 | Hoshino et al. | |
| 2019/0323145 | A1 | 10/2019 | Xu et al. | |

FOREIGN PATENT DOCUMENTS

| | | | |
|---|---|---|---|
| CN | 101323973 | A | 12/2008 |
| CN | 202131367 | U | 2/2012 |
| CN | 102978691 | A | 3/2013 |
| CN | 203007478 | U | 6/2013 |
| CN | 103262215 | A | 8/2013 |
| CN | 102592976 | B | 4/2014 |
| CN | 104313693 | A | 1/2015 |
| CN | 104630738 | A | 5/2015 |
| CN | 204417642 | U | 6/2015 |
| CN | 105040104 | A | 11/2015 |
| CN | 105140102 | A | 12/2015 |
| CN | 106048715 | A | 10/2016 |
| CN | 106048729 | A | 10/2016 |
| CN | 106637410 | A | 5/2017 |
| CN | 106906515 | A | 6/2017 |
| CN | 107916454 | A | 4/2018 |
| CN | 108186056 | A | 6/2018 |
| CN | 108277534 | A | 7/2018 |
| CN | 208151525 | U | 11/2018 |
| CN | 110541199 | A | 12/2019 |
| CN | 110592672 | A | 12/2019 |
| CN | 111074348 | A | 4/2020 |
| CN | 111254486 | A | 6/2020 |
| CN | 111501096 | A | 8/2020 |
| EP | 1803840 | B1 | 2/2009 |
| JP | 2001026495 | A | 1/2001 |
| JP | 2001158694 | A | 6/2001 |
| JP | 2006222402 | A | 8/2006 |
| JP | 2008258561 | A | 10/2008 |
| JP | 2009218575 | A | 9/2009 |
| JP | 2010182979 | A | 8/2010 |
| JP | 2012151401 | A | 8/2012 |
| JP | 2016068605 | A | 5/2016 |
| WO | 2020055937 | A1 | 3/2020 |

OTHER PUBLICATIONS

International Search Report in PCT/CN2021/085469 mailed on Jan. 5, 2022, 8 pages.

Written Opinion in PCT/CN2021/085469 mailed on Jan. 5, 2022, 8 pages.

First Office Action in Chinese Application No. 202010373329.8 mailed on Jun. 16, 2020, 26 pages.

First Office Action in Chinese Application No. 202010626511.X mailed on Aug. 13, 2020, 15 pages.

Zhang, Qun-She et al., Effects of Different Height and Space of a Multi-turn Inductive Coil on Temperature Distribution in the Large-size 6H—SiC Growth System, Journal of Synthetic Crystals, 36(1): 180-183, 2007.

Huang, Jie et al., Normally-off Metamorphic AlInAs/AlInAs HEMTs on Si Substrates Grown by MOCVD, Chinese Physics B, 24(7): 078102-1-078102-5, 2015.

Zhou, Lin, Study of Sapphire Crystal Growth Methods, Silicon Valley, 2013, 6 pages.

International Search Report in PCT/CN2021/065468 mailed on May 26, 2021, 8 pages.

Written Opinion in PCT/CN2021/085468 mailed on May 26, 2021, 8 pages.

The Extended European Search Report in European Application No. 21800098.2 mailed on Sep. 19, 2023, 9 pages.

Notice of Reasons for Refusal in Japanese Application No. 2022-566702 mailed on Dec. 5, 2023, 5 pages.

First Office Action in Chinese Application No. 202110363903.6 mailed on Sep. 7, 2021, 18 pages.

First Office Action in Chinese Application No. 202110362787.6 mailed on Sep. 9, 2021, 12 pages.

Zhang, Xuefu et al., Isotropic and Anisotropic Wet Etching, Micromachined Gyroscope without Griving Structure and Its Application, 2013, 5 pages.

The Second Office Action in Chinese Application No. 202011524796.2 mailed on Aug. 18, 2021, 17 pages.

(56) References Cited

OTHER PUBLICATIONS

The Extended European Search Report in European Application No. 21934135.1 mailed on Feb. 28, 2024, 9 pages.

* cited by examiner

1100

1400

METHODS FOR PRODUCING COMPOSITE CRYSTALS USING A MUTI-CHAMBER DEVICE AND APPLYING TEMPERATURE/PRESSURE CONTROL

CROSS-REFERENCE TO RELATED APPLICATIONS

This application is a continuation-in-part application of U.S. patent application Ser. No. 17/815,219, filed on Jul. 27, 2022, which is a divisional application of U.S. patent Ser. No. 17/520,815, now U.S. Pat. No. 11,408,089, filed on Nov. 8, 2021, which is a continuation of International App. No. PCT/CN2021/085468, filed on Apr. 2, 2021, which claims priority to Chinese Patent Application No. 202010373329.8, filed on May 6, 2020 and Chinese Patent Application No. 202010626511.X, filed on Jul. 2, 2020, this application is also a continuation-in-part application of U.S. patent application Ser. No. 17/451,647, filed on Oct. 21, 2021, which is a continuation of International Application No. PCT/CN2021/085469, filed on Apr. 2, 2021, the contents of all of which are hereby incorporated by reference in their entireties.

TECHNICAL FIELD

The present disclosure relates to the field of crystal production, and in particular, to methods and systems for producing composite crystals.

BACKGROUND

Semiconductor crystals (e.g., silicon carbide single crystals) have excellent physical and chemical properties, and therefore become important materials for manufacturing high-frequency and high-power devices. Accordingly, the demand for semiconductor crystals is increasing.

Physical Vapor Transport (PVT) is a technique for producing the semiconductor crystals. In this process, materials are decomposed and sublimated into vapor components under a high-temperature condition, the vapor components are transported to a seed crystal in a low-temperature region driven by an axial temperature gradient, and a crystal is generated through vapor deposition on a surface of the seed crystal. However, during crystal growth, there is not only the axial temperature gradient but also a radial temperature gradient. When the goal is to grow large-sized crystals, a relatively large radial temperature gradient can cause crystal growth defects and reduce the quality and yield of the crystals. In addition, due to the large radial temperature gradient in a source material coverage region, a molar ratio of sublimated vapor components is un-uniformly distributed along a radial direction, which is not conducive to stable crystal growth. Therefore, it is desirable to provide an improved crystal preparation device and a growth method thereof to prepare large-size and high-quality crystals.

In another aspect, the sizes of semiconductor crystals are often relatively small, thereby making it more difficult for cutting and/or polishing processes which are required for producing high quality crystals. For example, if the size and the thickness of a cut crystal are uneven or the polishing process is ineffective, the semiconductor crystals thereby produce may be defective. Therefore, it is desirable to provide methods and systems for producing composite crystals to produce semiconductor crystals without processing and cutting.

SUMMARY

One aspect of some embodiments of the present disclosure provides a method for producing a composite crystal. The method may be executed in a multi-chamber growth device. The multi-chamber growth device may include a plurality of chambers. The method may include conveying and processing at least one substrate between the plurality of chambers, successively. The method may further include, in one of the plurality of chambers, obtaining at least one composite crystal by growing a target crystal through vapor deposition. The at least one composite crystal may include the at least one substrate and the target crystal.

In some embodiments, before the conveying and processing at least one substrate between the plurality of chambers successively, the method may further include polishing the at least one substrate.

In some embodiments, before the conveying and processing at least one substrate between the plurality of chambers successively, the method may further include cleaning the at least one substrate.

In some embodiments, the method may further include obtaining the target crystal by ultrasonically cleaning, using an etching solution, the composite crystal in a first temperature range for a first time period. A basal plane dislocation density of the target crystal may be within a range of 120 to 2000 $cm^{-2}$.

In some embodiments, the multi-chamber growth device may at least include an in-situ etching chamber, a carbonization chamber, a growth chamber, a buffer chamber, and a conveyance assembly. The conveyance assembly may be configured to convey the at least one substrate through the in-situ etching chamber, the carbonization chamber, the growth chamber, and the buffer chamber successively for processing.

In some embodiments, the method may further include, before completing the conveying and processing the at least one substrate between the plurality of chambers successively, initiating conveying and processing of another batch of at least one substrate between the plurality of chambers. The substrates of the two batches may be conveyed and processed in different chambers of the multi-chamber growth device simultaneously.

In some embodiments, the multi-chamber growth device may include a vacuum chamber. The method may include placing the at least one substrate in the vacuum chamber before the at least one substrate is processed in the in-situ etching chamber; adjusting a pressure of the vacuum chamber and a pressure of the in-situ etching chamber to a first pressure range; and conveying, via the conveyance assembly, the at least one substrate to the in-situ etching chamber.

In some embodiments, processing the at least one substrate in the in-situ etching chamber may include maintaining a pressure of the in-situ etching chamber in a second pressure range and a temperature of the in-situ etching chamber in a second temperature range for a second time period; introducing hydrogen into the in-situ etching chamber to cause the pressure of the in-situ etching chamber to an atmospheric pressure; and performing an in-situ etching operation by maintaining the temperature of the in-situ etching chamber in a third temperature range for a third time period.

In some embodiments, processing the at least one substrate in the carbonization chamber may include performing a carbonization operation by maintaining a pressure of the carbonization chamber in a third pressure range and a temperature of the carbonization chamber in a fourth temperature range for a fourth time period.

In some embodiments, the performing the carbonization operation may include adjusting the temperature of the carbonization chamber to the third temperature range; conveying, via the conveyance assembly, the at least one substrate to the carbonization chamber; and adjusting the temperature of the carbonization chamber to a fifth temperature range and the pressure of the carbonization chamber to a fourth pressure range, and simultaneously introducing propane and hydrogen to cause the pressure of the carbonization chamber to the third pressure range; and performing the carbonization operation the at least one substrate by maintaining the pressure of the carbonization chamber in the third pressure range and the temperature of the carbonization chamber in the fourth temperature range for a fourth time period.

In some embodiments, processing the at least one substrate in the growth chamber may include maintaining a temperature of the growth chamber in a sixth temperature range and a pressure of the growth chamber in the fourth pressure range, introducing one or more reaction raw materials, and performing a crystal growth on the at least one substrate by adjusting the pressure of the growth chamber to a fifth pressure range.

In some embodiments, the crystal growth may include adjusting the temperature of the growth chamber to the fourth temperature range and the pressure of the growth chamber to the third pressure range; conveying, via the conveyance assembly, the at least one substrate to the growth chamber; adjusting the temperature of the growth chamber to the sixth temperature range and the pressure of the growth chamber to the fourth pressure range; performing the crystal growth on the at least one substrate by introducing silane, propane, and hydrogen to cause the pressure of the growth chamber to the fifth pressure range; and stopping the crystal growth when a thickness of the target crystal reaches a target thickness.

In some embodiments, the multi-chamber growth device may include a positioner. The conveying and processing at least one substrate between the plurality of chambers successively may include, when the positioner determines that the at least one substrate is located at a preset position in the growth chamber, stopping the conveyance assembly.

In some embodiments, processing the composite crystal in the buffer chamber may include cooling the composite crystal by maintaining a temperature of the buffer chamber in a seventh temperature range for a fifth time period.

In some embodiments, the cooling the composite crystal may include adjusting the temperature of the buffer chamber to the sixth temperature range; conveying, via the conveyance assembly, the composite crystal to the buffer chamber; adjusting the temperature of the buffer chamber to the seventh temperature range; and cooling the composite crystal by maintaining the temperature of the buffer chamber in the seventh temperature range for the fifth time period.

In some embodiments, the multi-chamber growth device may include a terminal chamber. The method may further include maintaining a temperature of the terminal chamber at room temperature; conveying, via the conveyance assembly, the composite crystal to the terminal chamber; and cooling the composite crystal to the room temperature.

Another aspect of some embodiments of the present disclosure provides a system for producing a composite crystal applied to a crystal production process. The system may include at least one storage device including a set of instructions, and at least one processor in communication with the at least one storage device. When executing the set of instructions, the system may be configured to direct the system to perform the following operations. The operations may include conveying and processing at least one substrate between a plurality of chambers, successively; and in one of the plurality of chambers, obtaining at least one composite crystal by growing a target crystal through vapor deposition, the at least one composite crystal including the at least one substrate and the target crystal.

In some embodiments, the at least one processor may be configured to direct the system to perform operations including obtaining the target crystal by ultrasonically cleaning, using an etching solution, the composite crystal in a first temperature range for a first time period. A basal plane dislocation density of the target crystal may be within a range of 120 to 2000 $cm^{-2}$.

In some embodiments, the multi-chamber growth device may at least include an in-situ etching chamber, a carbonization chamber, a growth chamber, a buffer chamber, and a conveyance assembly. The at least one processor may be configured to direct the system to perform operations including conveying, via the conveyance assembly, the at least one substrate through the in-situ etching chamber, the carbonization chamber, the growth chamber, and the buffer chamber successively for processing.

In some embodiments, the at least one processor may be configured to direct the system to perform operations including, before completing the conveying and processing of the at least one substrate between the plurality of chambers successively, initiating conveying and processing of another batch of at least one substrate between the plurality of chambers. The substrates of the two substrates may be conveyed and processed in different chambers of the multi-chamber growth device simultaneously.

Still another aspect of some embodiments of the present disclosure provides a non-transitory computer readable medium. The non-transitory computer readable medium may comprise executable instructions. When executed by at least one processor, the at least one processor may be directed to perform the method according to some embodiments of the present disclosure.

Still another aspect of some embodiments of the present disclosure provides a multi-chamber growth device applied to a crystal production process. The multi-chamber growth device may an in-situ etching chamber, a carbonization chamber, a growth chamber, a buffer chamber, and a conveyance assembly. The growth chamber may be configured to obtain at least one composite crystal by growing a target crystal through vapor deposition. The at least one composite crystal may include the at least one substrate and the target crystal. The conveyance assembly may be configured to convey the at least one substrate through the in-situ etching chamber, the carbonization chamber, the growth chamber, and the buffer chamber successively for processing.

In some embodiments, the multi-chamber growth device may further include a vacuum chamber.

In some embodiments, the multi-chamber growth device may further include a terminal chamber.

In some embodiments, the conveyance assembly may include at least two rotatable cylindrical rollers. The rotatable cylindrical rollers may be disposed parallel to each other and located under each chamber.

In some embodiments, the multi-chamber growth device may include a tray. At least one groove may be disposed on the tray and used to place the at least one substrate.

In some embodiments, the growth chamber may include a rotation shaft.

In some embodiments, the multi-chamber growth device may include a positioner.

In some embodiments, each of the in-situ etching chamber, the carbonization chamber, and the growth chamber may include at least one air inlet pipeline.

In some embodiments, each of the vacuum chamber, the in-situ etching chamber, the carbonization chamber, and the growth chamber may include at least one air pump pipeline.

In some embodiments, each of the vacuum chamber, the in-situ etching chamber, the carbonization chamber, and the growth chamber may be disposed with a heating body.

DETAILED DESCRIPTION

Figure 1:
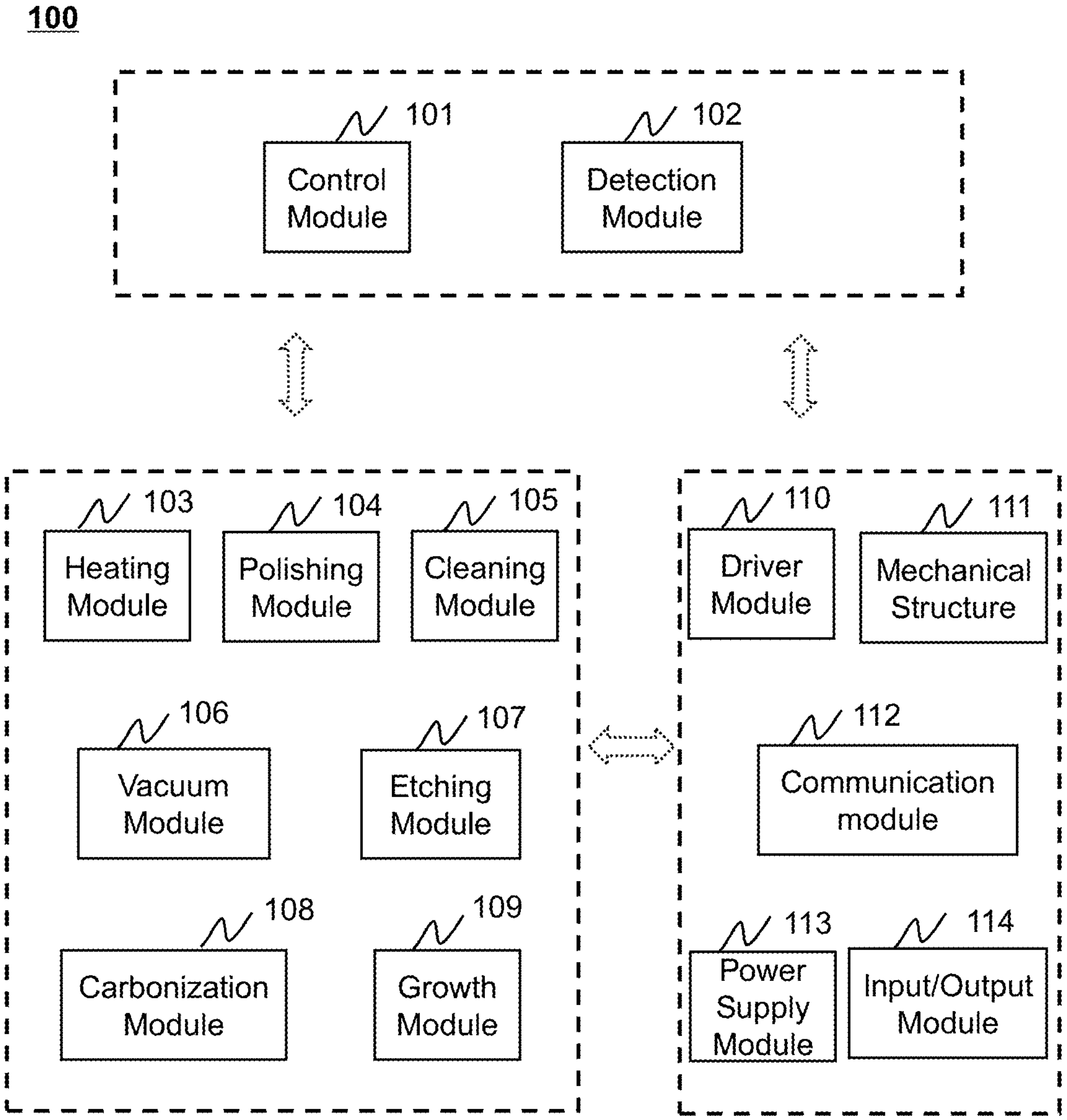
FIG. 1 is a schematic diagram illustrating exemplary hardware and/or software components of a crystal production system according to some embodiments of the present disclosure.

In the following detailed description, numerous specific details are set forth by way of examples in order to provide a thorough understanding of the relevant disclosure. Obviously, drawings described below are only some examples or embodiments of the present disclosure. Those skilled in the art, without further creative efforts, may apply the present disclosure to other similar scenarios according to these drawings. It should be understood that the purposes of these illustrated embodiments are only provided to those skilled in the art to practice the application, and not intended to limit the scope of the present disclosure. Unless obviously obtained from the context or the context illustrates otherwise, the same numeral in the drawings refers to the same structure or operation.

It will be understood that the terms "system," "device," "unit," and/or "module" used herein are one method to distinguish different components, elements, parts, sections, or assemblies of different levels. However, the terms may be displaced by another expression if they achieve the same purpose.

The terminology used herein is for the purpose of describing particular example embodiments only and is not intended to be limiting. As used herein, the singular forms "a," "an," and "the" may be intended to include the plural forms as well, unless the context clearly indicates otherwise. It will be further understood that the terms "comprise," "comprises," and/or "comprising," "include," "includes," and/or "including," when used in this specification, specify the presence of stated features, integers, steps, operations, elements, and/or components, but do not preclude the presence or addition of one or more other features, integers, steps, operations, elements, components, and/or groups thereof.

The flowcharts used in the present disclosure illustrate operations that systems implement according to some embodiments in the present disclosure. It is to be expressly understood, the operations of the flowchart may be implemented not in order. Conversely, the operations may be implemented in inverted order, or simultaneously. Moreover, one or more other operations may be added to the flowcharts. One or more operations may be removed from the flowcharts.

FIG. 1 is a schematic diagram illustrating exemplary hardware and/or software components of a crystal production system according to some embodiments of the present disclosure.

As shown in FIG. 1, a crystal production system 100 may include a control module 101, a detection module 102, a heating module 103, a polishing module 104, a cleaning module 105, a vacuum module 106, an etching module 107, a carbonization module 108, a growth module 109, a driver module 110, a mechanical structure 111, a communication module 112, a power supply module 113, and an input/output module 114. The modules, units, or sub-units mentioned in the present disclosure may be implemented by hardware, software, or a combination thereof. The implementation of the hardware may include circuitry or structures composed of entity components. The implementation of the software may include storing operations of the modules, the units, and the sub-units in the form of code in the memory, executed by appropriate hardware, for example, a microprocessor. When the modules, the units, and the sub-units mentioned in the present disclosure perform their operations, if there is no special description, it refers to that the software code including the function is executed or the hardware with the function is used. Meanwhile, the modules, the units, and the sub-units mentioned in the present disclosure may not limit the structure of their corresponding hardware when corresponding to the hardware, as long as the hardware that can realize their functions is within the protection scope of the present disclosure. For example, different modules, units, and sub-units mentioned in the present disclosure may correspond to a same hardware structure. As another example, the same module, unit, and sub-unit mentioned in the present disclosure may correspond to a plurality of separate hardware structures.

The control module 101 may be associated with other modules. In some embodiments, the control module 101 may control operation states of other modules (e.g., the detection module 102, the heating module 103, the driver module 110, the communication module 112, the power supply module 113). In some embodiments, the control module 101 may control the driver module 110 to initiate or stop. In some embodiments, the control module 101 may control a power of power supply, a time period of power supply, etc., of the power supply module 113. In some embodiments, the control module 101 may manage a data acquisition process, a data transmission process, etc., of the communication module 112.

The detection module 102 may be configured to detect process parameters of the crystal production system 100, such as a temperature, a pressure, a gas flow rate, a crystal growth thickness, etc. In some embodiments, the detection module 102 may transmit one or more detection results of the process parameters of the crystal production system 100 to the control module 101. The control module 101 may perform subsequent operations or instructions based on the one or more detection results. In some embodiments, the detection module 102 may monitor a temperature of a growth chamber and transmit temperature data to the control module 101. The control module 101 may determine whether to adjust operation parameters (e.g., a heating current, a heating power) of the heating module 103 to control the temperature of the growth chamber according to the temperature data fed back by the detection module 102 in real time. In some embodiments, the detection module 102 may monitor a pressure of the vacuum chamber and transmit pressure data to the control module 101. The control module 101 may determine whether to continue to vacuumize the vacuum chamber according to the pressure data fed back by the detection module 102 in real time. In response to continuing to vacuumize the vacuum chamber, the control module 101 may control the vacuum module 106 to vacuumize the vacuum chamber. In response to not continuing to vacuumize the vacuum chamber, the control module 101 may control the vacuum module 106 to stop vacuumizing to maintain a current vacuum. In some embodiments, the detection module 102 may monitor flow rates of a plurality of raw material gases and transmit data of the flow rates to the control module 101. The control module 101 may determine whether to adjust the flow rates of the plurality of raw material gases according to the flow rates fed back by the detection module 102 in real time to control a component proportion of the raw material gases or the crystal growth thickness.

The heating module 103 may be configured to provide required thermal energy for the crystal production system 100. In some embodiments, the heating module 103 may heat the growth chamber or the in-situ etching chamber. In some embodiments, the heating module 103 may include a heating assembly such as a resistance heater, an inductive coil, etc. The resistance heater may include a graphite resistance, a carbic silicon bar resistance, etc. In some embodiments, the heating module 103 may be applied in combination with one or more other modules or chambers. Alternatively, the heating module 103 may be mounted at an interior or an exterior of the one or more other modules or chambers to provide required thermal energy for the one or more other modules or chambers. In some embodiments, sub-systems of the heating module 103 may be mounted in the growth chamber and the in-situ etching chamber respectively to control the temperature of the growth chamber and the temperature of the in-situ etching chamber.

In some embodiments, the polishing module 104 may control a polishing process performed on a substrate. In some embodiments, before the substrate is used for crystal growth, a surface of the substrate may be preprocessed to maintain the surface of the substrate (especially a crystal growth surface) clean and flat. In some embodiments, the preprocessing may include a polishing operation and a cleaning operation. In some embodiments, the polishing operation may be performed by a polishing device. The polishing device may include a polisher. In some embodiments, the substrate may be placed on the polishing device by a mechanical structure 111 (e.g., a robotic arm) and be polished. In some embodiments, the polishing module 104 may control the polishing device to polish a rear surface (i.e., an opposite surface of the crystal growth surface) of the substrate to cause the rear surface flat; then a front surface (i.e., the crystal growth surface) of the substrate may be finely polished to remove surface cutting scratches and defects.

In some embodiments, the cleaning module 105 may control the cleaning operation of the substrate. In some embodiments, the cleaning operation may be performed by a cleaning device. In some embodiments, the cleaning device may include an ultrasonic cleaner. The substrate may be placed in the cleaning device by the mechanical structure 111 (e.g., the robotic arm). The substrate may be cleaned at least twice under the action of at least one cleaning solution and ultrasonic wave. After the cleaning operation is completed, the substrate may be removed from the cleaning solution by the mechanical structure 111 and dried with gas. In some embodiments, the cleaning solution may include acetone, alcohol, deionized water, or the like, or any combination thereof. In some embodiments, the substrate may be cleaned sequentially with acetone, alcohol, and deionized water. In some embodiments, the gas used for drying the surface of the substrate may include an inert gas. In some embodiments, the gas used for drying the surface of the substrate may include nitrogen with a purity larger than 99%.

In some embodiments, the cleaning module 105 may be configured to control a chemical etching operation and a cleaning operation of the composite crystal. In some embodiments, the chemical etching operation and the cleaning operation may be performed in the cleaning device. In some embodiments, the composite crystal may be placed in the cleaning device by the mechanical structure 111 (e.g., the robotic arm). A target crystal (e.g., a silicon carbide crystal) may be obtained by dissolving and removing the substrate under the action of a certain temperature, an alkali solution, and the ultrasonic wave. In some embodiments, the alkali solution may include a sodium hydroxide (NaOH) solution, a potassium hydroxide (KOH) solution, or the like, or any combination thereof. The silicon carbide crystal with the substrate removed may be placed in the cleaning device by the mechanical structure 111 (e.g., the robotic arm) and cleaned under the action of a cleaning solution (e.g., isopropanol or deionized water) and the ultrasonic wave. A quality of the silicon carbide crystal can be characterized by a basal plane dislocation density (e.g., a count of defects per unit area). In some embodiments, the basal plane dislocation density of the silicon carbide crystal may be within a range of 100 $cm^{-2}$ to 2200 $cm^{-2}$. In some embodiments, the basal plane dislocation density of the silicon carbide crystal may be within a range of 120 $cm^{-2}$ to 2000 $cm^{-2}$. In some embodiments, the basal plane dislocation density of the silicon carbide crystal may be within a range of 200 $cm^{-2}$ to 1800 $cm^{-2}$. In some embodiments, the basal plane dislocation density of the silicon carbide crystal may be within a range of 500 $cm^{-2}$ to 1500 $cm^{-2}$. In some embodiments, the basal plane dislocation density of the silicon carbide crystal may be within a range of 700 $cm^{-2}$ to 1300 $cm^{-2}$. In some embodiments, the basal plane dislocation density of the silicon carbide crystal may be within a range of 900 $cm^{-2}$ to 1100 $cm^{-2}$.

In some embodiments, the vacuum module 106 may be configured to control a vacuum operation of the crystal production system 100. In the vacuum operation, the chamber(s) (e.g., the in-situ etching chamber, a carbonization chamber, the growth chamber) may be vacuumized to a certain gas pressure by controlling a vacuum device. In some embodiments, the vacuum device may include a vacuum pump. In some embodiments, the detection module 102 may detect a pressure of the chamber and send pressure data to the control module 101. The control module 101 may perform subsequent operations or instructions according to the pressure data. In some embodiments, the detection module 102 may transmit the pressure data in the in-situ etching chamber or the vacuum chamber to the control module 101. In response to determining that it is necessary to continue vacuumizing the in-situ etching chamber or the vacuum chamber according to the pressure data, the control module 101 may control the vacuum device to continue vacuumizing the in-situ etching chamber or the vacuum chamber. In some embodiments, the vacuum device may include at least one vacuum pump. The at least one vacuum pump may be connected to the chambers that need pressure control to vacuumize the chambers independently.

In some embodiments, the etching module 107 may control an in-situ etching operation of the substrate. In some embodiments, the in-situ etching operation may be performed in the in-situ etching chamber. The in-situ etching chamber may include one or more channels, one or more gas inlets and outlets, a heating assembly, and a conveyance assembly. In some embodiments, the substrate may be conveyed to the in-situ etching chamber by the mechanical structure 111. The in-situ etching operation may be performed on the surface of the substrate under the action of a certain temperature, a certain pressure, and a gas. In some embodiments, the in-situ etching chamber may be vacuumized to a certain gas pressure by the vacuum module 106. A temperature of the in-situ etching chamber may be slowly increased to a certain temperature and maintained for a certain time period. A gas (e.g., hydrogen) may be introduced into the in-situ etching chamber to cause the pressure of the in-situ etching chamber to an atmospheric pressure. The temperature of the in-situ etching chamber may be increased to a certain temperature. The in-situ etching operation may be performed by maintaining the temperature of the in-situ etching chamber in the certain temperature for a certain time period.

During the in-situ etching operation, the detection module 102 may monitor the temperature and the pressure of the in-situ etching chamber in real time and transmit temperature data and pressure data to the control module 101. In some embodiments, the control module 101 may control the heating module 103 to adjust operation parameters of the heating assembly according to the temperature data transmitted by the detection module 102, thereby adjusting the temperature of the in-situ etching chamber. The control module 101 may control the vacuum module 106 to adjust operation parameters of the vacuum device or control the mechanical structure 111 to adjust a gas flow rate according to the pressure data transmitted by the detection module 102, thereby adjusting the pressure of the in-situ etching chamber. After the in-situ etching operation is completed, the substrate may be conveyed to outside of the in-situ etching chamber. In some embodiments, the control module 101 may control the driver module 110 to open the one or more channels in the in-situ etching chamber and convey the substrate to the outside of the in-situ etching chamber by the mechanical structure 111 (e.g., the conveyance assembly).

In some embodiments, the carbonization module 108 may control a carbonization operation of the substrate. In some embodiments, the carbonization operation may be performed in the carbonization chamber. The carbonization chamber may include one or more gas channels, one or more gas inlets and outlets, a heating assembly, and a conveyance assembly. In some embodiments, the substrate may be conveyed to the carbonization chamber by the mechanical structure 111. The substrate may be carbonized under the action of a certain temperature, a certain pressure, and a gas. In some embodiments, the carbonization chamber may be heated to a certain temperature in advance. After the substrate is conveyed to the carbonization chamber by the conveyance assembly, the carbonization chamber may be cooled to another temperature. After the carbonization chamber is vacuumized to a certain gas pressure, the temperature of the carbonization chamber may be increased. At the same time, a gas (e.g., propane, hydrogen) may be introduced to cause the pressure of the carbonization chamber to a certain pressure. The substrate may be carbonized after the temperature of the carbonization chamber is increased to a certain temperature and maintained for a certain time period.

During the carbonization operation, the detection module 102 may monitor the temperature and the pressure of the carbonization chamber in real time and transmit temperature data and pressure data to the control module 101. In some embodiments, the control module 101 may control the heating module 103 to adjust operation parameters of the heating assembly according to the temperature data transmitted by the detection module 102, thereby adjusting the temperature of the carbonization chamber. The control module 101 may control the vacuum module 106 to adjust operation parameters of the vacuum device or control the mechanical structure 111 to adjust a gas flow rate based on the pressure data transmitted by the detection module 102, thereby adjusting the pressure of the carbonization chamber. After the carbonization operation is completed, the substrate may be conveyed to outside of the carbonization chamber. In some embodiments, the control module 101 may control the driver module 110 to open the one or more channels of the carbonization chamber and convey the substrate to the outside of the carbonization chamber by the mechanical structure 111 (e.g., the conveyance assembly).

In some embodiments, the growth module 109 may be configured to control a crystal growth operation. Exemplary crystal growth methods may include a vapor deposition method, a liquid deposition method, a Czochralski method, a hydrothermal method, a flame melting method, or the like, or any combination thereof. In some embodiments, the vapor deposition method may include introducing gaseous reactants of elements of a thin film, vapors of liquid reactants, or other gases required for the reaction into a reaction environment; occurring a chemical reaction on the surface of the substrate, and forming the thin film by depositing solid products on the surface of the substrate. The vapor deposition method may include a physical vapor deposition method or a chemical vapor deposition method. In some embodiments, the chemical vapor deposition method may include a metal-organic compound chemical vapor deposition (MOCVD) method, a plasma chemical vapor deposition (PCVD) method, a laser chemical vapor deposition (LCVD) method, a low pressure chemical vapor deposition (LPCVD) method, an ultrahigh vacuum chemical vapor deposition (UHVCVD) method, an ultrasonic wave chemical vapor deposition (UWCVD) method, or the like.

In some embodiments, the crystal growth may be performed in the growth chamber. The growth chamber may include a kettle growth chamber, a tubular growth chamber, a tower growth chamber, a fluidized bed, a fixed bed, or the like, or any combination thereof.

In some embodiments, the growth chamber may include one or more channels, one or more gas inlets and outlets, a heating assembly, and a rotation assembly.

In some embodiments, the substrate may be conveyed to the growth chamber by the mechanical structure 111. The crystal growth operation may be performed on the surface of the substrate at a certain temperature and a certain pressure. For example, the temperature of the growth chamber may be increased to a predetermined temperature which may vary with crystal type and may be maintained constant throughout the crystal growth operation or may be adjusted during the crystal growth operation in combination with the crystal growth method. The temperature may be monitored by the detection module 102 and accurately controlled by the control module 101 to control the heating module 103. A few types of gases may be introduced. During the crystal growth operation, a pressure of the growth chamber may be maintained at a certain pressure which may vary with crystal type and may be maintained constant throughout the crystal growth operation or may be adjusted during the crystal growth operation in combination with the crystal growth method. The pressure may be monitored by the detection module 102 and accurately controlled by the control module 101 to control the driver module 110. In the case of controlling the temperature and the pressure, vapor deposition may be performed on the surface of the substrate in the growth chamber to grow the crystal. The detection module 102 may monitor a thickness of the crystal growth. The control module 101 may control the temperature and the pressure of the growth chamber and flow rates of a plurality of gases according to parameters (e.g., a speed, a thickness, etc., of the crystal growth). When the thickness reaches a preset thickness, the control module 101 may control the driver module 110 to control the mechanical structure 111, thereby stopping the crystal growth. For example, the control module 101 may control the driver module 110 to open the one or more channels and convey the substrate with the crystal to outside of the growth chamber by the mechanical structure 111 (e.g., the conveyance assembly).

In some embodiments, the crystal growth device may include a buffer chamber. The buffer chamber may be configured to cool the composite crystal. The buffer chamber may include one or more channels, one or more gas inlets and outlets, a heating assembly, and a conveyance assembly. In some embodiments, the composite crystal may be conveyed to the buffer chamber by the mechanical structure 111 and be cooled at a certain temperature. The cooled composite crystal may be conveyed to outside of the buffer chamber. In some embodiments, the control module 101 may control the driver module 110 to open the one or more channels of the buffer chamber and convey the composite crystal to the buffer chamber by mechanical structure 111 (e.g., the conveyance assembly).

In some embodiments, the crystal production system 100 may include a terminal chamber. The terminal chamber may be configured to further cool the composite crystal. The terminal chamber may include one or more channels, one or more gas inlets and outlets, a heating assembly, and a conveyance assembly. The composite crystal cooled by the buffer chamber may be conveyed by the mechanical structure 111 to the terminal chamber for further cooling at a certain temperature. The cooled composite crystal may be conveyed to outside of the terminal chamber. In some embodiments, the control module 101 may control the driver module 110 to open the one or more channels of the terminal chamber and convey the composite crystal to the outside of the terminal chamber through the mechanical structure 111 (e.g., the conveyance assembly).

In some embodiments, the driver module 110 may include one or more driving force sources. In some embodiments, the driving force source may include an electric driving motor. In some embodiments, the driving motor may include a direct current (DC) motor, an alternating current (AC) induction motor, a permanent magnet motor, a switching magnetic resistance motor, or the like, or any combination thereof. In some embodiments, the driver module 110 may include one or more driving motors. In some embodiments, the control module 101 may control an operation of the driver module 110 to drive the mechanical structure 111 to perform corresponding operations when the detection module 102 detects that the thickness of the crystal growth has reached technological requirements. In some embodiments, the control module 101 may transmit an instruction including an electrical signal. The electrical signal may include a required operation state and a required time period. The driving force source of the driver module 110 may be configured (e.g. the driving motor in the driver module 110 may rotate at a specific speed per minute for a specific time period) according to the electrical signal. The rotation of the driving motor may drive a variation (e.g., a forward or a stop of the conveyance assembly, a switch of the one or more channels of the chambers, a switch of the gas inlet and outlet) of the state of the mechanical structure 111 connected to the driving motor to convey the composite crystal to the outside of the growth chamber. In some embodiments, when the polishing module 104 polishes the substrate, the control module 101 may transmit a control instruction to the driver module 110. The driver module 110 may drive the polishing device to operate according to the control instruction.

The mechanical structure 111 is not limited to the above conveyance assembly, channel, gas inlet and outlet, polishing device, etc., and may also include other structures. The specific structure may be subject to the structure type required in the crystal production system 100, which is not limited here. Any mechanical structure of a device that can use the crystal production method included in the present disclosure is within the scope of the present disclosure.

In some embodiments, the communication module 112 may be configured to exchange information or data. In some embodiments, the communication module 112 may be configured to achieve a communication among components (e.g., the control module 101, the detection module 102, the heating module 103, the vacuum module 106, the input/output module 114, and/or the driver module 110) of the crystal production system 100. In some embodiments, the detection module 102 may transmit information (e.g., the temperature, the pressure, the gas flow rate) of the crystal production system 100 to the communication module 112. The communication module 112 may transmit the information to the control module 101 to cause the control module 101 to determine whether to adjust the operation parameters of other modules (e.g., the heating module 103, the vacuum module 106). In response to determining that the operation parameters need to be adjusted, the control module 101 may transmit adjusted operation parameters to relevant modules through the communication module 112. In some embodiments, the communication module 112 may also be configured to achieve a communication between the crystal production system 100 and other external devices (e.g., servers, user terminals). In some embodiments, the communication module 112 may transmit state information (e.g., the operation parameters) of the crystal production system 100 to the user terminal. The user terminal may monitor the crystal production system 100 based on the state information. The communication module 112 may use a wired technique, a wireless technique, or a combination thereof. The wired technique may include metal cables, mixed cables, fiber optical cables, or the like, or any combination thereof. The wireless technique may include Bluetooth, wireless network (Wi-Fi), ZigBee, Near Field Communication (NFC), Radio Frequency Identification (RFID), cellular network (including GSM, CDMA, 3G, 4G, 5G), Narrow Band Internet of Things (NBIoT) based on the cellular network, or the like. In some embodiments, the communication module 112 may encode the transmitted information in one or more encoding modes. For example, the encoding mode may include a phase encoding, a non-return-to-zero encoding, a differential Manchester encoding, etc. In some embodiments, the communication module 112 may select different transmission manners and encoding manners according to types of data to be transmitted or network types. In some embodiments, the communication module 112 may include one or more communication interfaces for different communication modes. In some embodiments, other modules (e.g., the heating module 103) of the crystal production system 100 may be dispersed on the plurality of chambers. In this situation, each of the other modules may include one or more communication modules 112 for transmitting information among modules. In some embodiments, the communication module 112 may include a receiver and a transmitter. In some embodiments, the communication module 112 may include a transceiver. In some embodiments, the communication module 112 may have a prompt function and/or an alarm function. In some embodiments, when an operation fault of the crystal production system 100 occurs (e.g., the temperature or the pressure of the crystal growth exceeds a limited temperature or pressure), the communication module 112 may transmit a prompt message or an alarm message to a field operator and/or a user terminal. In some embodiments, exemplary alarm modes may include a sound alarm, a light alarm, a remote alarm, or the like, or any combination thereof. In some embodiments, when the alarm mode is the remote alarm, the communication module 112 may transmit the prompt message or the alarm message to an associated user terminal. The communication module 112 may also establish a communication (e.g., a voice call, a video call) between the field operator and the associated user terminal. In some embodiments, when the crystal production system 100 operates well, the communication module 112 may also transmit a prompt message to the field operator and/or the user terminal. In some embodiments, the communication module 112 may transmit a prompt message that the temperature or the pressure satisfies technological requirements to the associated user terminal.

In some embodiments, the power supply module 113 may provide power to other modules and assemblies (e.g., the detection module 102, the control module 101, the communication module 112, the input/output module 114, the driver module 110) of the crystal production system 100. The power supply module 113 may receive a control signal from the control module 101 to control a power output of the crystal production system 100. In some embodiments, when no signal regarding an operation of the control module 101 on some modules is received in a certain time period (e.g., 1 second, 2 seconds, 3 seconds, or 4 seconds), the power supply module 113 may supply power to operating modules to cause the crystal production system 100 to be under a power saving mode. In some embodiments, when all modules of the crystal production system 100 do not receive a signal regarding an operation within a certain time period (e.g., 1 second, 2 seconds, 3 seconds, or 4 seconds), the power supply module 113 may disconnect the power supply to the other modules and transmit the data in the crystal production system 100 to a storage device (e.g., a hard disk). In some embodiments, the power supply module 113 may include at least one power source. The power source may include a fuel generator, a gas generator, a coal-fired generator, a solar generator, a wind energy generator, a hydraulic generator, or the like, or any combination thereof. The fuel generator, the gas generator, or the coal-fired generator may covert chemical energy into electrical energy and store the electrical energy in the power supply module 113. The solar generator may covert light energy into electrical energy and store the electrical energy in the power supply module 113. The wind generator may covert wind energy into electrical energy and store the electrical energy in the power supply module 113. The hydroelectric generator may covert mechanical energy into electrical energy and store the electrical energy in the power supply module 113. In some embodiments, when a voltage of the power supply module 113 is unstable, the control module 101 may transmit a control signal to the communication module 112. The control signal may be used to control the communication module 112 to transmit a voice prompt to the user terminal and/or the field operator. The voice prompt may include information that the power supply module 113 is unstable. In some embodiments, the power supply module 113 may include a standby power supply. The power supply module 113 may provide temporary power using the standby power supply in case of emergency (e.g., circuit failure, power failure of an external power system).

The input/output module 114 may be configured to acquire, transmit, and send signals. The input/output module 114 may be connected to or communicate with other components of the crystal production system 100. Other components of the crystal production system 100 may be connected to or communicate with each other through the input/output module 114. The input/output module 114 may include a wired USB interface, a serial communication interface, a parallel communication port, a wireless Bluetooth, infrared, a radio-frequency identification (RFID), a Wlan authentication and privacy infrastructure (WAPI), a general packet radio service (GPRS), a code division multiple access (CDMA), or the like, or any combination thereof. In some embodiments, the input/output module 114 may be connected to a network and acquire information through the network. In some embodiments, the input/output module 114 may output information about the crystal growth obtained from the detection module 102 through the network or the communication module 112. In some embodiments, the input/output module 114 may acquire a prompt or a control instruction from the control module 101 through the network or the communication module 112. In some embodiments, the input/output module 114 may include VCC, GND, RS-232, RS-485 (e.g., RS485-A or RS485-B), a general network interface, or the like, or any combination thereof. In some embodiments, the input/output module 114 may encode the transmitted signal using one or more encoding manners. The encoding manner may include a phase encoding, a non-return-to-zero encoding, a differential Manchester encoding, or the like, or any combination thereof.

It should be noted that the crystal production system 100 and the modules shown in FIG. 1 may be implemented in various ways. For example, in some embodiments, the crystal production system 100 and the modules thereof may be implemented by hardware, software, or a combination thereof. The hardware may be implemented by a dedicated logic. The software may be stored in a storage device which may be executed by an appropriate instruction execution system, such as a microprocessor or dedicated design hardware. Those skilled in the art may understand that the above methods and systems may be implemented using computer-executable instructions and/or included in processor control codes. For example, carrier media (e.g., a disk, a CD, a DVD-ROM, etc.), programmable memories (e.g., a read-only memory (firmware)), or data carriers (e.g., an optical carrier or an electronic signal carrier) may provide the codes. The crystal production system 100 and the modules according to one or more embodiments of the present disclosure may not only be implemented by a very large-scale integrated (VLSI) circuit or a gate array, a semiconductor such as a logic chip, a transistor, etc., a hardware circuit of a programmable hardware device such as a field programmable gate array, a programmable logic device, etc., may also be implemented by software executed by various types of processors. Alternatively, the crystal production system 100 and the modules may also be implemented by a combination of the above hardware circuits and software (e.g., firmware).

It should be noted that the above descriptions about the crystal production system 100 and the modules are intended to be convenient, and one or more embodiments of the present disclosure may not be limited to the scope of the embodiments. It may be understood that after understanding the principle of the system, those skilled in the art may arbitrarily combine the modules, form a subsystem to connect with other modules, or omit one or more modules without departing from the principle. In some embodiments, the detection module 102 and the control module 101 may be combined as a single module that may have functions of detecting and controlling crystal growth information. Those variations and modifications may be within the scope of the protection of one or more embodiments of the disclosure.

In some embodiments, a multi-chamber growth device may be configured to produce a composite crystal including the substrate and the target crystal. In some embodiments, the target crystal may include a silicon carbide crystal, a silicon nitride crystal, a molybdenum disulfide crystal, a boron nitride crystal, a graphene crystal, etc. In some embodiments, the composite crystal may be a composite crystal including a substrate and a silicon carbide crystal. In some embodiments, the composite crystal may be produced by depositing at least one silicon carbide crystal on the surface of the substrate.

Figure 2A:
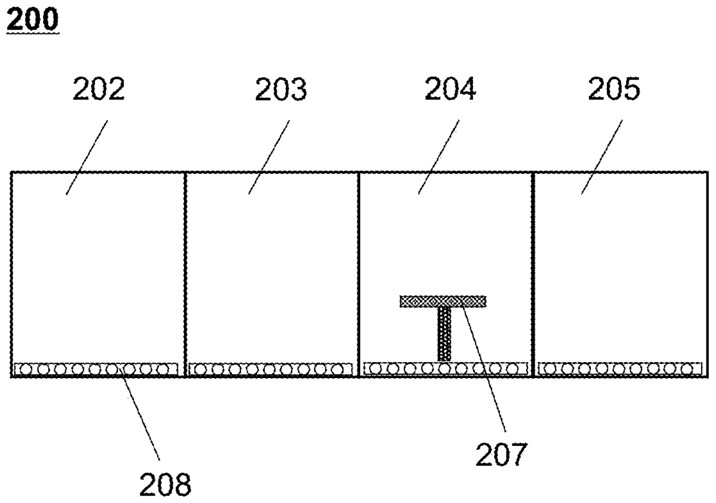
FIG. 2A is a schematic diagram illustrating an exemplary structure of a multi-chamber growth device according to some embodiments of the present disclosure.
Figure 2B:
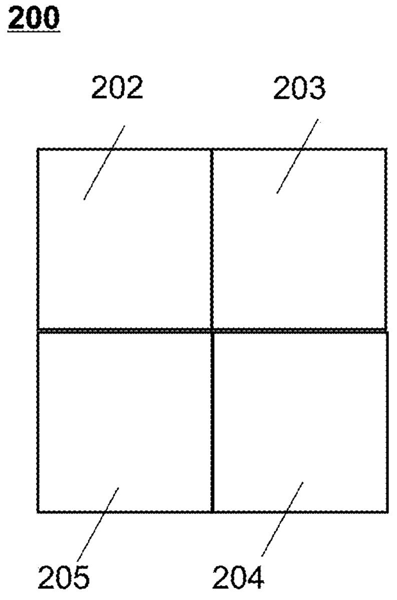
FIG. 2B is a top view illustrating an exemplary distribution of chambers in a multi-chamber growth device according to some embodiments of the present disclosure.

FIG. 2A is a schematic diagram illustrating an exemplary structure of a multi-chamber growth device according to some embodiments of the present disclosure. FIG. 2B is a top view illustrating an exemplary distribution of chambers in a multi-chamber growth device according to some embodiments of the present disclosure. In order to facilitate explanation, a cross section of each chamber in the multi-chamber growth device in FIGS. 2A-2B is a rectangle (a corresponding chamber is a cube). It should be noted that the cross section of each chamber may include a circle, a polygon, or other shapes, accordingly, corresponding chambers may include a cylinder, a polygonal prism, or other shapes.

In some embodiments, as shown in FIG. 2A, the multi-chamber growth device 200 may include an in-situ etching chamber 202, a carbonization chamber 203, a growth chamber 204, a buffer chamber 205, a tray 207, a conveyance assembly 208, and a control assembly (not shown).

The in-situ etching chamber 202 may be configured to provide a space for an in-situ etching operation. Under certain reaction conditions, the in-situ etching operation may be performed on a substrate by introducing gas into the in-situ etching chamber. A thin film may be formed on a surface of the substrate by vapor deposition. The substrate may support and improve characteristics of the thin film deposited on the surface of the substrate. In some embodiments, the substrate may be conveyed to the in-situ etching chamber 202 by the conveyance assembly 208. The in-situ etching operation may be performed on the surface of the substrate under the action of a certain temperature, a certain gas pressure, and hydrogen. In some embodiments, the in-situ etching chamber 202 may be vacuumized to a predetermined pressure; the substrate may be conveyed to the in-situ etching chamber 202 by the conveyance assembly 208; the in-situ etching chamber 202 may be further vacuumized to a lower predetermined pressure; a temperature of the in-situ etching chamber 202 may be slowly adjusted to a certain temperature and maintained for a time period; an etching gas (e.g., hydrogen, tetrafluoromethane, sulfur hexafluoride, nitrogen trifluoride) may be introduced into the in-situ etching chamber 202 to cause the pressure of the in-situ etching chamber 202 to an atmospheric pressure; the in-situ etching operation may be performed on the substrate by adjusting the temperature of the in-situ etching chamber 202 to a certain temperature and maintaining the certain temperature for a time period. More descriptions regarding the in-situ etching operation performed on the substrate may be found elsewhere in the present disclosure (e.g., FIG. 13 and the descriptions thereof).

The carbonization chamber 203 may be configured to provide a space for a carbonization operation. The substrate may be carbonized by introducing a carbonization gas under a certain reaction condition. In some embodiments, the substrate may be conveyed to the carbonization chamber 203 by the conveyance assembly 208. The carbonization operation may be performed on the surface of the substrate at a certain temperature under the action of a carbonization gas (e.g., methane, propane, butane) and hydrogen. In some embodiments, the temperature of the carbonization chamber 203 may be adjusted to a certain temperature; a third channel between the in-situ etching chamber 202 and the carbonization chamber 203 may be controlled to be open, the substrate may be conveyed to the carbonization chamber 203 by the conveyance assembly 208 through the third channel, and then the third channel may be closed; the carbonization chamber 203 may be cooled to a certain temperature and vacuumized to a set pressure, then the temperature of the carbonization chamber 203 may be increased and the carbonization gas (e.g., methane, propane, butane) and hydrogen may be introduced to cause the pressure of the carbonization chamber to a set pressure; the carbonization operation may be performed on the substrate by adjusting the temperature of the carbonization chamber 203 to a certain temperature and maintaining the certain temperature for a time period. More descriptions regarding the carbonization operation performed on the substrate may be found elsewhere in the present disclosure (e.g., FIG. 14 and the descriptions thereof).

The growth chamber 204 may be configured to provide a reaction space for vapor deposition. A composite crystal including the substrate and a silicon carbide may be obtained by vapor depositing one or more reaction raw materials on the surface of the substrate under a certain reaction condition. In some embodiments, the substrate may be conveyed to the growth chamber 204 by the conveyance assembly 208. The crystal growth may be performed on the surface of the substrate at a certain temperature under the action of the carbonization gas (e.g., methane, propane, butane) and hydrogen. In some embodiments, a temperature of the growth chamber 204 may be adjusted to a certain temperature and a pressure of the growth chamber 204 may be adjusted to a set pressure; a fourth channel between the carbonization chamber 203 and the growth chamber 204 may be controlled to be open, the substrate may be conveyed to the growth chamber 203 by the conveyance assembly 208 through the fourth channel, and then the fourth channel may be closed; the crystal growth may be performed on the surface of the substrate by adjusting the temperature of the growth chamber 204 to a certain temperature and introducing silane, propane, or hydrogen to a set pressure. When a thickness of the crystal growth reaches a target thickness, the crystal growth may be stopped and the composite crystal may be obtained. More descriptions regarding the crystal growth may be found elsewhere in the present disclosure (e.g., FIGS. 15-16 and the descriptions thereof).

The buffer chamber 205 may be configured to cool the composite crystal. In some embodiments, the composite crystal may be conveyed to the buffer chamber 205 by the conveyance assembly 208. The composite crystal may be cooled under a certain temperature and a gas pressure. In some embodiments, the buffer chamber 205 may be heated to a certain temperature; a fifth channel between the growth chamber 204 and the buffer chamber 205 may be controlled to be open, the composite crystal may be conveyed to the buffer chamber 205 by the conveyance assembly 208 through the fifth channel, and then the fifth channel may be closed; the buffer chamber 205 may be cooled to a certain temperature; the composite crystal may be cooled by maintaining the temperature of the buffer chamber at the certain temperature for a time period. In some embodiments, the composite crystal may be conveyed to the buffer chamber 205 by the conveyance assembly 208 and the composite crystal may be cooled at room temperature and atmospheric pressure. More descriptions regarding cooling the crystal growth may be found elsewhere in the present disclosure (e.g., FIG. 17 and the descriptions thereof).

The conveyance assembly 208 may be disposed at a lower end of an interior of each chamber (e.g., the in-situ etching chamber 202, the carbonization chamber 203, the growth chamber 204, the buffer chamber 205) and used for conveying the substrate or the composite crystal between the chambers successively. The conveyance assembly 208 may also be referred to as the mechanical structure 111. More descriptions regarding the conveyance assembly 208 may be found elsewhere in the present disclosure (e.g., FIG. 8 and the descriptions thereof).

The control assembly may be configured to control the conveyance assembly 208 to rotate to convey the substrate or the composite crystal between the chambers (e.g., the in-situ etching chamber 202, the carbonization chamber 203, the growth chamber 204, the buffer chamber 205) successively. In some embodiments, the control assembly may drive the conveyance assembly 208 to convey the substrate or the composite crystal between the chambers successively by controlling an operation of a driving motor. The control assembly may include the control module 101 and the driving motor may include the driver module 110.

In some embodiments, the terms "successive" or "successively" refer to the manner that the chambers are connected and the substrate and/or composite crystal are conveyed; in such manners, the chambers (e.g., the in-situ etching chamber 202, the carbonization chamber 203, the growth chamber 204, the buffer chamber 205) are connected in the same order as they are presented, one to the next, without any intervening chambers; in such manners, the substrate and/or composite crystal are conveyed from one chamber to the next in the same order as they are presented, one to the next, without encountering any intervening chambers.

In some embodiments, the in-situ etching chamber 202, the carbonization chamber 203, the growth chamber 204, and the buffer chamber 205 may be disposed successively in a line, and in some cases a straight line. Each of the chambers may have a head end into which the substrate and/or composite crystal can enter and a tail end from which the substrate and/or composite crystal can exit. The conveyance assemblies 208 in the chambers may be connected successively in a head-tail-head-tail (i.e., from head to tail) manner. Accordingly, a conveying route of the substrate or the composite crystal between the chambers may be arranged substantially a straight line. In some embodiments, as shown in FIG. 2A, the in-situ etching chamber 202, the carbonization chamber 203, the growth chamber 204, and the buffer chamber 205 may be disposed successively roughly in a line. The conveyance assemblies 208 in the chambers may be connected successively in a head-tail-head-tail (i.e., from head to tail) manner. A conveying route of the substrate or the composite crystal between the chambers may be substantially a straight line. In some embodiments, the chambers may be set by overall rotating a distribution diagram of the chambers illustrated in FIG. 2A at any angle. In certain embodiments, the straight line design may improve conveyance efficiency and temperature control.

In some embodiments, as shown in FIG. 2B, the in-situ etching chamber 202, the carbonization chamber 203, the growth chamber 204, and the buffer chamber 205 may be disposed as a grid pattern. The in-situ etching chamber 202 may be located on an adjacent side of the carbonization chamber 203. The growth chamber 204 may be located on another adjacent side of the carbonization chamber 203. The buffer chamber 205 may be adjacent to the in-situ etching chamber 202 and the growth chamber 204. The conveyance assemblies 208 in the chambers may be connected from head to tail successively. The conveyance assemblies 208 may be circulated between the chambers successively.

Figure 3A:
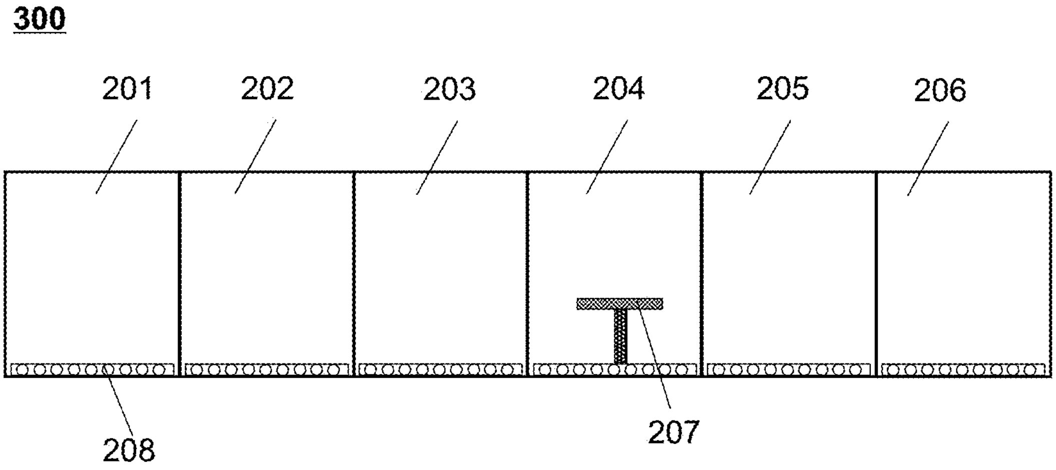
FIG. 3A is a schematic diagram illustrating an exemplary structure of a multi-chamber growth device according to some embodiments of the present disclosure.
Figure 3B:
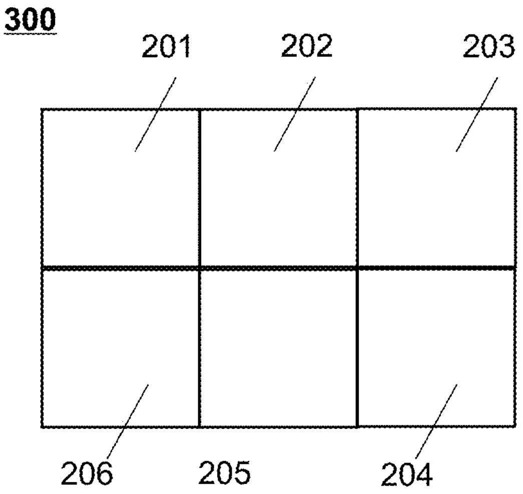
FIG. 3B is a top view illustrating an exemplary distribution of chambers in a multi-chamber growth device according to some embodiments of the present disclosure.

FIG. 3A is a schematic diagram illustrating an exemplary structure of a multi-chamber growth device according to some embodiments of the present disclosure. FIG. 3B is a top view illustrating an exemplary distribution of chambers in a multi-chamber growth device according to some embodiments of the present disclosure. In order to facilitate explanation, a cross section of each chamber in the multi-chamber growth device in FIGS. 3A-3B is a rectangle (a corresponding chamber is a cube). It should be noted that the cross section of each chamber may include a circle, a polygon, or other shapes, accordingly, corresponding chambers may include a cylinder, a polygonal prism, or other shapes.

In some embodiments, a multi-chamber growth device 300 may also include a vacuum chamber. In some embodiments, the multi-chamber growth device 300 may further include a terminal chamber. In some embodiments, as shown in FIG. 3A, the multi-chamber growth device 300 may include a vacuum chamber 201, the in-situ etching chamber 202, the carbonization chamber 203, the growth chamber 204, the buffer chamber 205, a terminal chamber 206, a tray 207, the conveyance assembly 208, and a control assembly (not shown). The vacuum chamber 201 may be adjacent to the in-situ etching chamber 202. The terminal chamber 206 may be adjacent to the buffer chamber 205.

The vacuum chamber 201 may be configured to cause a substrate in a vacuum environment. In some embodiments, the substrate may be placed in the vacuum chamber 201. The vacuum chamber 201 may be vacuumized to cause the substrate to be in the vacuum environment. In some embodiments, a first channel of the vacuum chamber may be closed. The vacuum chamber may be vacuumized to a set pressure. More descriptions regarding the vacuum operation may be found elsewhere in the present disclosure (e.g., FIG. 12 and the descriptions thereof).

The terminal chamber 206 may be configured to cool a composite crystal to room temperature. In some embodiments, the composite crystal may be conveyed from the buffer chamber 205 to the terminal chamber 206 by the conveyance assembly 208. The composite crystal may be cooled at the room temperature and an atmospheric pressure. In some embodiments, a sixth channel between the buffer chamber 205 and the terminal chamber 206 may be controlled to be open, the composite crystal may be conveyed to the terminal chamber 206 by the conveyance assembly 208 through the sixth channel, and then the sixth channel may be closed; the composite crystal may be cooled. More descriptions regarding cooling the composite crystal may be found elsewhere in the present disclosure (e.g., FIG. 17 and the descriptions thereof).

In some embodiments, the chambers of the multi-chamber growth device may be disposed in a straight line or a non-straight line. In some embodiments, as shown in FIG. 3A, the chambers (e.g., the vacuum chamber 201, the in-situ etching chamber 202, the carbonization chamber 203, the growth chamber 204, the buffer chamber 205, and the terminal chamber 206) may be disposed successively in a line shape. The conveyance assemblies 208 in the chambers may be connected from head to tail successively. Accordingly, a conveying route of the substrate or the composite crystal between the chambers may be substantially a straight line. In some embodiments, the vacuum chamber 201, the in-situ etching chamber 202, the carbonization chamber 203, the growth chamber 204, the buffer chamber 205, and the terminal chamber 206 may be disposed successively in a rough line shape. The conveyance assemblies 208 in the chambers may be connected from head to tail successively. A conveying route of the substrate or the composite crystal between the chambers may be substantially a straight line. In some embodiments, the chambers may be set by overall rotating a distribution diagram of the chambers illustrated in FIG. 3A at any angle.

In some embodiments, as shown in FIG. 3B, the vacuum chamber 201, the in-situ etching chamber 202, the carbonization chamber 203, the growth chamber 204, the buffer chamber 205, and the terminal chamber 206 may be stacked successively. The vacuum chamber 201 may be located on an adjacent side of the in-situ etching chamber 202. The carbonization chamber 203 may be located on another adjacent side of the in-situ etching chamber 202. The growth chamber 204 may be adjacent to the buffer chamber 205 and the carbonization chamber 203. The terminal chamber 206 may be located on another adjacent side of the buffer chamber 205. The conveyance assemblies 208 in the chambers may be connected from head to tail successively. The conveyance assemblies 208 may be circulated between the chambers successively. In some embodiments, the chambers may be set by overall rotating a distribution diagram of the chambers illustrated in the FIG. 3B and the above examples at any angle.

It should be noted that the vacuum chamber 201, the in-situ etching chamber 202, the carbonization chamber 203, the growth chamber 204, the buffer chamber 205, and the terminal chamber 206 may be disposed successively to form any shape that can be used to convey the substrate or the composite crystal between the chambers successively, which is also within the scope of the present disclosure. Dimensions of the vacuum chamber 201, the in-situ etching chamber 202, the carbonization chamber 203, the growth chamber 204, the buffer chamber 205, and the terminal chamber 206 may be the same or different, which is not limited.

Various chambers involved in some embodiments of the present disclosure may include but not be limited to a first type of chamber, a second type of chamber, a third type of chamber, etc. In some embodiments, the first type of chamber may provide a place where the substrate or the composite crystal can be at a set pressure or a certain temperature. In some embodiments, the second type of chamber may provide a place for processing the substrate or a place where the composite crystal can be at a certain temperature. In some embodiments, the third type of chamber may provide a place where a crystal growth can be performed on the surface of the substrate.

Figure 4:
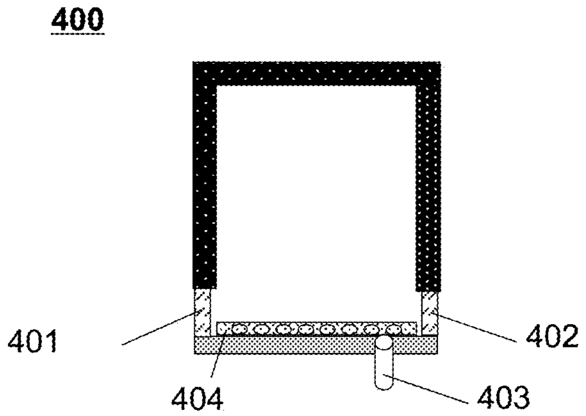
FIG. 4 is a schematic diagram illustrating an exemplary structure of a first type of chamber according to some embodiments of the present disclosure.

FIG. 4 is a schematic diagram illustrating an exemplary structure of a first type of chamber according to some embodiments of the present disclosure.

As shown in FIG. 4, one or more side walls of the first type of chamber 400 may be disposed with an inlet channel 401 and an outlet channel 402. A conveyance assembly 404 may be mounted inside the first type of chamber 400. The conveyance assembly 404 may connect the inlet channel 401 and the outlet channel 402 to convey a substrate or a composite crystal between the inlet channel 401 and the outlet channel 402. In some embodiments, the inlet channel 401 and the outlet channel 402 may be disposed on two opposite side walls of the first type of chamber 400 respectively so that the inlet channel 401, the conveyance assembly 404, and the outlet channel 402 may form a straight line. In some embodiments, the inlet channel 401 and the outlet channel 402 may be disposed on two adjacent side walls of the first type of chamber 400 respectively so that the inlet channel 401, the conveyance assembly 404, and the outlet channel 402 may form an L-shaped broken line. In some embodiments, the inlet channel 401 and the outlet channel 402 may be disposed on a same side wall of the first type of chamber 400 so that the inlet channel 401, the conveyance assembly 404, and the outlet channel 402 may form a U-shaped broken line. In some embodiments, the inlet channel 401 and the outlet channel 402 may be disposed at a top portion, a middle portion, or a bottom end of the side wall of the first type of chamber 400. Merely by way of example, as shown in FIG. 4, the inlet channel 401 and the outlet channel 402 may be respectively disposed on bottom ends of the two opposite side walls of the first type of chamber 400. The conveyance assembly 404 may be disposed at a bottom portion of the first type of chamber 400. More descriptions regarding conveyance assembly 404 may be found elsewhere in the present disclosure (e.g., FIG. 8 and the descriptions thereof).

In some embodiments, shapes of the inlet channel 401 and the outlet channel 402 may include rectangle, circle, ellipse, or any other regular or irregular shapes. In some embodiments, a count of the inlet channel(s) 401 and a count of the outlet channel(s) 402 may be one, two, or more, respectively. In some embodiments, the count of the inlet channel(s) 401 and the count of the outlet channel(s) 402 may be the same or different. In some embodiments, the count of the inlet channel(s) 401 and the count of the outlet channel(s) 402 may be the same and the inlet channel(s) 401 and the outlet channel(s) 402 may be disposed in pairs. In some embodiments, two or more groups of inlet channels 401 and outlet channels 402 may be disposed. Conveyance assemblies 404 may be respectively disposed between each of the groups of inlet channels 401 and outlet channels 402. The substrates or the composite crystals may be conveyed in different routes at the same time. In some embodiments, the count of the inlet channel(s) 401 and the count of the outlet channel(s) 402 may be different. For example, two or more inlet channels 401 and an outlet channel 402 may be disposed. The substrate or the composite crystal may be conveyed into the first type of chamber 400 from the plurality of inlet channels 401 and out of the first type of chamber 400 from the outlet channel 402.

In some embodiments, an automatic control valve may be mounted at each of the inlet channel 401 and the outlet channel 402 to control the opening and closing of the inlet channel 401 and the outlet channel 402 through the control module 101. In some embodiments, the inlet channel 401 and the outlet channel 402 may be used interchangeably.

As shown in FIG. 4, the first type of chamber 400 may be disposed with at least one air pipeline 403 for discharging gas from the first type of chamber 400 or introducing gas into the first type of chamber 400 to cause a pressure of the first type of chamber 400 to reach a required pressure.

In some embodiments, the air pipeline 403 may be connected with a vacuum device. A speed and/or a time of vacuum operation may be adjusted by controlling operation parameters (e.g., a power, a rotation speed, an operation time) of the vacuum device to control a pressure change in the first type of chamber 400. In some embodiments, the vacuum device may include a vacuum pump. In some embodiments, a count of the air pipeline(s) 403 may be one or more. In some embodiments, a count of the vacuum pump(s) may be one or at least two. In some embodiments, the air pipeline 403 may be disposed on a top portion, a side wall, or a bottom portion of the first type of chamber 400. For example, as shown in FIG. 4, the air pipeline 403 may be disposed at the bottom portion of the first type of chamber 400. In some embodiments, the air pipeline 403 may be disposed on a side wall or the top portion of the first type of chamber 400. In some embodiments, the air pipeline 403 may be connected with a gas storage tank through a pipeline. A flow adjustment valve may be disposed on the pipeline to control a flow rate and a flow velocity of the gas.

In some embodiments, the first type of chamber 400 may include the vacuum chamber 201 or the terminal chamber 206.

The vacuum chamber 201 may be the first chamber of a multi-chamber crystal growth device. The vacuum chamber 201 may be vacuumized via the air pipeline 403.

The terminal chamber 206 may be the last chamber of the multi-chamber crystal growth device. In some embodiments, the air pipeline 403 may be unnecessary for the terminal chamber 206. That is, the air pipeline 403 may be in a closed state. In some embodiments, the air pipeline 403 may include two or more air pipelines. A gas (e.g., a replacement gas) may be introduced into the terminal chamber 206 through one or more of the air pipelines 403 and the gas in the terminal chamber 206 may be discharged through other one or more of the air pipelines 403 to accelerate a cooling rate in the terminal chamber 206.

In some embodiments, a shape of the first type of chamber 400 may include regular or irregular shapes such as cylinder, prism, cube, rectangular prism, etc. A dimension of the first type of chamber 400 may be set according to actual production needs. In some embodiments, a height between a top wall of the first type of chamber 400 and a growth surface of the composite crystal may be within a range of 20 to 500 millimeters. In some embodiments, the height between the top wall of the first type of chamber 400 and the growth surface of the composite crystal may be within a range of 50 to 400 millimeters. In some embodiments, the height between the top wall of the first type of chamber 400 and the growth surface of the composite crystal may be within a range of 100 to 300 millimeters. In some embodiments, the height between the top wall of the first type of chamber 400 and the growth surface of the composite crystal may be within a range of 150 to 250 millimeters.

In some embodiments, a material of the first type of chamber 400 may include a high-strength stainless steel, a high-strength aluminum alloy, etc. A strength of the high-strength stainless steel or the high-strength aluminum alloy can ensure safe production and the first type of chamber 400 not be deformed or broke during the production.

Figure 5:
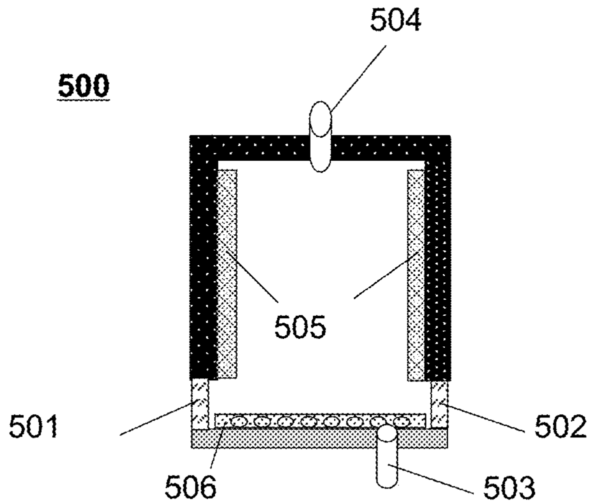
FIG. 5 is a schematic diagram illustrating an exemplary structure of a second type of chamber according to some embodiments of the present disclosure.

FIG. 5 is a schematic diagram illustrating an exemplary structure of a second type of chamber according to some embodiments of the present disclosure.

As shown in FIG. 5, one or more side walls of the second type of chamber 500 may be disposed with an inlet channel 501 and an outlet channel 502. A conveyance assembly 506 may be mounted inside the second type of chamber 500. The conveyance assembly 506 may connect the inlet channel 501 and the outlet channel 502 to convey a substrate or a composite crystal between the inlet channel 501 and the outlet channel 502. In some embodiments, the inlet channel 501 and the outlet channel 502 may be disposed on two opposite side walls of the second type of chamber 500 respectively so that the inlet channel 501, the conveyance assembly 506, and the outlet channel 502 may form a straight line. In some embodiments, the inlet channel 501 and the outlet channel 502 may be disposed on two adjacent side walls of the second type of chamber 500 respectively so that the inlet channel 501, the conveyance assembly 506, and the outlet channel 502 may form an L-shaped broken line. In some embodiments, the inlet channel 501 and the outlet channel 502 may be disposed on a same side wall of the second type of chamber 500 so that the inlet channel 501, the conveyance assembly 506, and the outlet channel 502 may form a U-shaped broken line. In some embodiments, the inlet channel 501 and the outlet channel 502 may be disposed at a top portion, a middle portion, or a bottom end of the side wall of the second type of chamber 500. Merely by way of example, as shown in FIG. 5, the inlet channel 501 and the outlet channel 502 may be respectively disposed on bottom ends of the two opposite side walls of the second type of chamber 500. The conveyance assembly 506 may be disposed at a bottom portion of the second type of chamber 500. More descriptions regarding the conveyance assembly 506 may be found elsewhere in the present disclosure (e.g., FIG. 8 and the descriptions thereof).

In some embodiments, shapes of the inlet channel 501 and the outlet channel 502 may include rectangle, circle, ellipse, or any other regular or irregular shapes. In some embodiments, a count of the inlet channel(s) 501 and a count of the outlet channel(s) 502 may be one, two, or more, respectively. In some embodiments, the count of the inlet channel(s) 501 and the count of the outlet channel(s) 502 may be the same or different. In some embodiments, the count of the inlet channel(s) 501 and the count of the outlet channel(s) 502 may be the same and the inlet channel(s) 501 and the outlet channel(s) 502 may be disposed in pairs. In some embodiments, two or more groups of inlet channels 501 and outlet channels 502 may be disposed. Conveyance assemblies 506 may be respectively disposed between each of the groups of inlet channels 501 and outlet channels 502. The substrates or the composite crystals may be conveyed in different routes at the same time. In some embodiments, the count of the inlet channel(s) 501 and the count of the outlet channels 502 may be different. For example, two or more inlet channels 501 and an outlet channel 502 may be disposed. The substrate or the composite crystal may be conveyed into the second type of chamber 500 from the plurality of inlet channels 501 and out of the second type of chamber 500 from the outlet channel 502.

In some embodiments, an automatic control valve may be mounted at each of the inlet channel 501 and the outlet channel 502 to control the opening and closing of the inlet channel 501 and the outlet channel 502 through the control module 101. In some embodiments, the inlet channel 501 and the outlet channel 502 may be used interchangeably.

As shown in FIG. 5, the second type of chamber 500 may include at least one air pump pipeline 503 for vacuumizing the second type of chamber 500 so that a pressure of the second type of chamber 500 can reach a required pressure. In some embodiments, the air pump pipeline 503 may be disposed at a bottom portion, a top portion, or a side wall of the second type of chamber 500. For example, as shown in FIG. 5, the air pump pipeline 503 may be disposed at the bottom portion of the second type of chamber 500. In some embodiments, the air pump pipeline 503 may be disposed on the side wall or the top portion of the second type of chamber 500. In some embodiments, the air pump pipeline 503 may be connected with a vacuum device. A speed and/or a time of vacuum operation may be adjusted by controlling operation parameters (e.g., a power, a rotation speed, an operation time) of the vacuum device to control a pressure change in the second type of chamber 500. In some embodiments, the vacuum device may include a vacuum pump. In some embodiments, a count of air pump pipeline(s) 503 may be one or more. In some embodiments, a count of the vacuum pumps may be one or at least two.

In some embodiments, the second type of chamber 500 may include at least one air inlet pipeline 504 for introducing a gas into the second type of chamber 500. In some embodiments, the air inlet pipeline 504 may be disposed at the bottom portion, the top portion, or the side wall of the second type of chamber 500. For example, as shown in FIG. 5, the air inlet pipeline 504 may be disposed at the top portion of the second type of chamber 500. In some embodiments, a count of the air inlet pipeline(s) 504 may be one or more. In some embodiments, one air inlet pipeline 504 may be disposed and all gases may be introduced into the second type of chamber 500 through the same air inlet pipeline 504. In some embodiments, two or more air inlet pipelines 504 may be disposed and different gases may be introduced into the second type of chamber 500 through different air inlet pipelines 504 respectively. In some embodiments, a flow adjustment valve may be disposed on each air inlet pipeline 504 to control a gas flow rate, so as to control a ratio (e.g., a mass ratio or a molar ratio) of gases.

As shown in FIG. 5, the second type of chamber 500 may also be disposed with a heating body 505 for adjusting a temperature of the second type of chamber 500 so that the temperature of the second type of chamber 500 can reach a required temperature. In some embodiments, the temperature of the second type of chamber 500 may be adjusted by controlling a heating power and/or a heating time of the heating body 505. In some embodiments, the heating body 505 may be disposed on an outer top wall, an outer side wall, an inner top wall, an inner side wall, or the like, or any combination thereof, of the second type of chamber 500. For example, as shown in FIG. 5, the heating body 505 may be disposed on the inner side wall of the second type of chamber 500.

In some embodiments, the heating body 505 may include a resistance heating assembly, an electromagnetic induction heating assembly, or the like, or any combination thereof. In some embodiments, the resistance heating assembly may include a graphite resistance, a carbolic bar resistance, etc. After the graphite resistance or the carbolic bar resistance is energized, the temperature of the second type of chamber 500 may be adjusted by using heat generated by the Joule effect of a current flowing through the resistance. In some embodiments, the electromagnetic induction heating assembly may include an induction coil. The induction coil may generate an eddy current on the second type of chamber 500 under the action of an alternating current of different frequencies. Electric energy generated on the second type of chamber 500 may be converted into heat under the action of the eddy current to adjust the temperature of the second type of chamber 500.

In some embodiments, the heating body 505 may include one or more heating assemblies.

In some embodiments, the heating body 505 may include one or more resistance heating assemblies. The one or more resistance heating assemblies may be uniformly or ununiformly disposed on the side wall of the second type of chamber 500. In some embodiments, the heating body 505 may include five graphite resistances, a shape of the second type of chamber 500 may be a cylinder, and the five graphite resistances may be disposed on the side wall of the second type of chamber 500 along an equidistant circumferential direction. That is, each graphite resistance may be located at one-fifth of the side wall of the second type of chamber 500. In some embodiments, the heating body 505 may include four graphite resistances, the shape of the second type of chamber 500 may be a rectangular prism, and the four graphite resistances may be disposed on four side walls of the second type of chamber 500. Alternatively, the four graphite resistances may be disposed at positions of four corners of the second type of chamber 500 respectively.

In some embodiments, the heating body 505 may include one or more induction heating assemblies. The one or more induction heating assemblies may be uniformly or un-uniformly disposed on the outer side wall of the second type of chamber 500. In some embodiments, the heating body 505 may include a multi-loop induction coil. The multi-loop induction coil may be spirally wrapped around the outer side wall of the second type of chamber 500. Further, the multi-loop induction coil may be wrapped around the entire outer side wall of the second type of chamber 500 or a portion of the outer side wall of the second type of chamber 500 where a tray is located.

In some embodiments, the second type of chamber 500 may include the in-situ etching chamber 202, the carbonization chamber 203, or the buffer chamber 205.

The in-situ etching chamber 202 may be disposed adjacent to the vacuum chamber 201. In some embodiments, the in-situ etching chamber 202 and the vacuum chamber 201 may share a same channel. That is, the outlet channel 402 of the vacuum chamber 201 and the inlet channel 501 of the in-situ etching chamber 202 may be a same channel. In some embodiments, the in-situ etching chamber 202 and the vacuum chamber 201 may not share the same channel. The outlet channel 402 of the vacuum chamber 201 and the inlet channel 501 of the in-situ etching chamber 202 may be two channels disposed adjacent to each other. In some embodiments, a temperature of the in-situ etching chamber 202 may be adjusted through the heating body 505. The in-situ etching chamber 202 may be vacuumized through the air pump pipeline 503. An in-situ etching operation may be performed on the substrate by introducing hydrogen into the in-situ etching chamber 202 through the air inlet pipeline 504.

The carbonization chamber 203 may be disposed adjacent to the in-situ etching chamber 202. In some embodiments, the carbonization chamber 203 and the in-situ etching chamber 202 may share a same channel. That is, the outlet channel of the in-situ etching chamber 202 and the inlet channel of the carbonization chamber 203 may be a same channel. In some embodiments, the carbonization chamber 203 and the in-situ etching chamber 202 may not share the same channel. The outlet channel of the in-situ etching chamber 202 and the inlet channel of the carbonization chamber 203 may be two channels disposed adjacent to each other. In some embodiments, a temperature of the carbonization chamber 203 may be adjusted through the heating body 505. The carbonization chamber 203 may be vacuumized through the air pump pipeline 503. A carbonization operation may be performed on the substrate by introducing a carbonization gas (e.g., methane, propane, butane) and hydrogen into the carbonization chamber 203 through the air inlet pipeline 504.

The buffer chamber 205 may be disposed adjacent to the terminal chamber 206. In some embodiments, the buffer chamber 205 and the terminal chamber 206 may share a same channel. That is, the outlet channel 502 of the buffer chamber 205 and the inlet channel 401 of the terminal chamber 206 may be a same channel. In some embodiments, the buffer chamber 205 and the terminal chamber 206 may not share the same channel. The outlet channel 502 of the buffer chamber 205 and the inlet channel 401 of the terminal chamber 206 may be two channels disposed adjacent to each other. In some embodiments, a temperature of the buffer chamber 205 may be adjusted by the heating body 505. In some embodiments, the air pump pipeline 503 and the air inlet pipeline 504 are not used for the buffer chamber 205. That is, the air pump pipeline 503 and the air inlet pipeline 504 may be in a closed state. In some embodiments, a gas may be introduced into the buffer chamber 205 through the air inlet pipeline 504 and the gas in the buffer chamber 205 may be discharged through the air pump pipeline 503 to accelerate a cooling rate in the buffer chamber 205.

In some embodiments, a shape of the second type of chamber 500 may include regular or irregular shapes such as cylinder, prism, cube, rectangular prism, etc. A dimension of the second type of chamber 500 may be set according to actual production needs. In some embodiments, a height between a top wall of the second type of chamber 500 and a growth surface of the composite crystal may be within a range of 20 millimeters to 300 millimeters. In some embodiments, the height between the top wall of the second type of chamber 500 and the growth surface of the composite crystal may be within a range of 50 millimeters to 200 millimeters. In some embodiments, the height between the top wall of the second type of chamber 500 and the growth surface of the composite crystal may be within a range of 70 millimeters to 180 millimeters. In some embodiments, the height between the top wall of the second type of chamber 500 and the growth surface of the composite crystal may be within a range of 100 millimeters to 150 millimeters.

In some embodiments, a chamber wall of the second type of chamber 500 may be made of a stainless steel or an aluminum alloy with a high strength and a double-layer hollow structure. The chamber wall may be cooled by introducing cooling water in a hollow chamber to achieve a thermal insulation function and a thermal dissipation function. In some embodiments, one or more layers of thermal insulation material may be disposed on the inner side of the chamber wall of the second type of chamber 500. In some embodiments, the thermal insulation material may include a graphite felt, a zirconia felt, etc.

Figure 6:
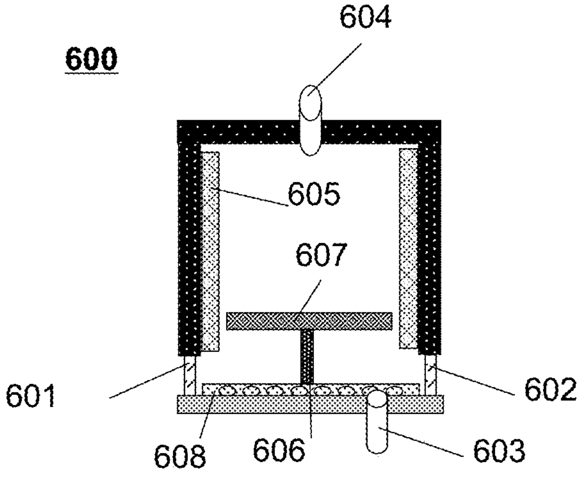
FIG. 6 is a schematic diagram illustrating an exemplary structure of a third type of chamber according to some embodiments of the present disclosure.

FIG. 6 is a schematic diagram illustrating an exemplary structure of a third type of chamber 600 according to some embodiments of the present disclosure.

In some embodiments, the third type of chamber 600 may include a growth chamber 204. As shown in FIG. 6, one or more side walls of the third type of chamber 600 (also referred to as the growth chamber 204) may be disposed with an inlet channel 601 and an outlet channel 602. A conveyance assembly 608 may be mounted inside the third type of chamber 600. The conveyance assembly 608 may connect the inlet channel 601 and the outlet channel 602 to convey a substrate or a composite crystal between the inlet channel 601 and the outlet channel 602. In some embodiments, the inlet channel 601 and the outlet channel 602 may be disposed on two opposite side walls of the third type of chamber 600 respectively so that the inlet channel 601, the conveyance assembly 608, and the outlet channel 602 may form a straight line. In some embodiments, the inlet channel 601 and the outlet channel 602 may be disposed on two adjacent side walls of the third type of chamber 600 respectively so that the inlet channel 601, the conveyance assembly 608, and the outlet channel 602 may form an L-shaped broken line. In some embodiments, the inlet channel 601 and the outlet channel 602 may be disposed on a same side wall of the third type of chamber 600 so that the inlet channel 601, the conveyance assembly 608, and the outlet channel 602 may form a U-shaped broken line. In some embodiments, the inlet channel 601 and the outlet channel 602 may be disposed at a top portion, a middle portion, or a bottom end of the side wall of the third type of chamber 600. Merely by way of example, as shown in FIG. 6, the inlet channel 601 and the outlet channel 602 may be respectively disposed on bottom ends of the two opposite side walls of the third type of chamber 600. The conveyance assembly 608 may be disposed at a bottom portion of the third type of chamber 600. More descriptions regarding the conveyance assembly 608 may be found elsewhere in the present disclosure (e.g., FIG. 8 and the descriptions thereof).

In some embodiments, shapes of the inlet channel 601 and the outlet channel 602 may include rectangle, circle, ellipse, or any other regular or irregular shapes. In some embodiments, a count of the inlet channel(s) 601 and a count of the outlet channel(s) 602 may be one, two, or more, respectively. In some embodiments, the count of the inlet channel(s) 601 and the count of the outlet channel(s) 602 may be the same or different. In some embodiments, the count of the inlet channel(s) 601 and the count of the outlet channel(s) 602 may be the same and the inlet channel(s) 601 and the outlet channel(s) 602 may be disposed in pairs. In some embodiments, two or more groups of inlet channels 601 and outlet channels 602 may be disposed. Conveyance assemblies 606 may be respectively disposed between each of the groups of inlet channels 601 and outlet channels 602. The substrates or the composite crystals may be conveyed in different routes at the same time. In some embodiments, the count of the inlet channel(s) 601 and the count of the outlet channels 602 may be different. For example, two or more inlet channels 601 and an outlet channel 602 may be disposed. The substrate or the composite crystal may be conveyed into the third type of chamber 600 from the plurality of inlet channels 601 and out of the third type of chamber 600 from the outlet channel 602.

In some embodiments, an automatic control valve may be mounted at each of the inlet channel 601 and the outlet channel 602 to control the opening and closing of the inlet channel 601 and the outlet channel 602 through the control module 101. In some embodiments, the inlet channel 601 and the outlet channel 602 may be used interchangeably.

In some embodiments, the third type of chamber 600 may include at least one air pump pipeline 603 for vacuumizing the third type of chamber 600 so that a pressure of the third type of chamber 600 can reach a required pressure. In some embodiments, the air pump pipeline 603 may be disposed at a bottom portion, a top portion, or a side wall of the third type of chamber 600. For example, as shown in FIG. 6, the air pump pipeline 603 may be disposed at the bottom portion of the third type of chamber 600. In some embodiments, the air pump pipeline 603 may be disposed on the side wall or the top portion of the second type of chamber 600. In some embodiments, the air pump pipeline 603 may be connected with a vacuum device. A speed and/or a time of vacuum operation may be adjusted by controlling operation parameters (e.g., a power, a rotation speed, an operation time) of the vacuum device to control a pressure change in the third type of chamber 600. In some embodiments, the vacuum device may include a vacuum pump. In some embodiments, a count of air pump pipeline(s) 603 may be one or more. In some embodiments, a count of the vacuum pump(s) may be one or at least two.

In some embodiments, the third type of chamber 600 may include at least one air inlet pipeline 604 for introducing a reaction gas (e.g., silane and propane) into the third type of chamber 600. In some embodiments, the air inlet pipeline 604 may be disposed at the bottom portion, the top portion, or the side wall of the third type of chamber 600. For example, as shown in FIG. 6, the air inlet pipeline 604 may be disposed at the top portion of the third type of chamber 600. In some embodiments, a count of the air inlet pipeline(s) 604 may be one or more. In some embodiments, one air inlet pipeline 604 may be disposed and all gases may be introduced into the third type of chamber 600 through the same air inlet pipeline 604. In some embodiments, two or more air inlet pipelines 604 may be disposed and different gases may be introduced into the third type of chamber 600 through different air inlet pipelines 604 respectively. In some embodiments, a flow adjustment valve may be disposed on each air inlet pipeline 604 to control a gas flow rate, so as to control a ratio (e.g., a mass ratio or a molar ratio) of gases.

In some embodiments, the third type of chamber 600 (also referred to as the growth chamber 204) may also be disposed with a heating body 605 for adjusting a temperature of the third type of chamber 600 so that the temperature of the third type of chamber 600 can reach a required temperature. In some embodiments, the temperature of the third type of chamber 600 may be adjusted by controlling a heating power and/or a heating time of the heating body 605. In some embodiments, the heating body 605 may be disposed on an outer top wall, an outer side wall, an inner top wall, an inner side wall, or the like, or any combination thereof, of the third type of chamber 600. For example, as shown in FIG. 6, the heating body 605 may be disposed on the inner side wall of the third type of chamber 600 (also referred to as the growth chamber 204).

In some embodiments, the heating body 605 may include a resistance heating assembly, an electromagnetic induction heating assembly, or the like, or any combination thereof. In some embodiments, the resistance heating assembly may include a graphite resistance, a carbolic bar resistance, etc. More descriptions regarding the heating body 605 may be referred to the heating body 505 in the present disclosure.

In some embodiments, the growth chamber 204 may further include a rotation shaft 606 (also referred to as a rotation shaft 207). The rotation shaft 606 may be disposed at the bottom portion of the growth chamber 204 for jacking a tray 607 to the middle portion of the growth chamber 204. More descriptions regarding the tray may be found elsewhere in the present disclosure (e.g., FIG. 7 and the descriptions thereof). In some embodiments, a height of the rotation shaft 606 may be within a range of 10 to 200 millimeters. In some embodiments, the height of the rotation shaft 606 may be within a range of 20 millimeters to 180 millimeters. In some embodiments, the height of the rotation shaft 606 may be within a range of 30 millimeters to 150 millimeters. In some embodiments, the height of the rotation shaft 606 may be within a range of 40 millimeters to 130 millimeters. In some embodiments, the height of the rotation shaft 606 may be within a range of 50 millimeters to 100 millimeters. In some embodiments, the height of the rotation shaft 606 may be within a range of 60 millimeters to 80 millimeters. In some embodiments, the height of the rotation shaft 606 may be within a range of 1/10 to 1 of a height of the growth chamber 204. In some embodiments, the height of the rotation shaft 606 may be within a range of 2/10 to 9/10 of the height of the growth chamber 204. In some embodiments, the height of the rotation shaft 606 may be within a range of 3/10 to 8/10 of the height of the growth chamber 204. In some embodiments, the height of the rotation shaft 606 may be within a range of 4/10 to 7/10 of the height of the growth chamber 204. In some embodiments, the height of the rotation shaft 606 may be within a range of 5/10 to 6/10 of the height of the growth chamber 204.

In some embodiments, a positioner (not shown) may be mounted on the rotation shaft 606 to detect a position of the tray 607. In some embodiments, the positioner may include a displacement sensor. In some embodiments, the positioner may be disposed at a top end of the rotation shaft 606. The position of the tray 607 may be detected in real time. The tray 607 may be jacked up to the middle portion of the growth chamber 204 by the rotation shaft 606. In some embodiments, the positioner may detect the position of the tray 607 in real time and transmit position information of the tray 607 to the control module 101. When the positioner detects that the tray 607 is conveyed right above the rotation shaft 606 by the conveyance assembly 608, the control module 101 may control the conveyance assembly 608 to stop rotating through the driver module 110, and the rotation shaft 606 may be controlled by the driver module 110 to cause the tray 607 to be smoothly jacked up to the middle portion of the growth chamber 204. In some embodiments, the rotation shaft 606 may be rotated continuously so that reactions at various positions of the substrate can be uniform during a growth process. In some embodiments, the positioner may also include a GPS positioner. In some embodiments, the GPS positioner may be mounted on the tray 607 for transmitting the position information of the tray 607 to the control module 101 in real time.

Figure 7:
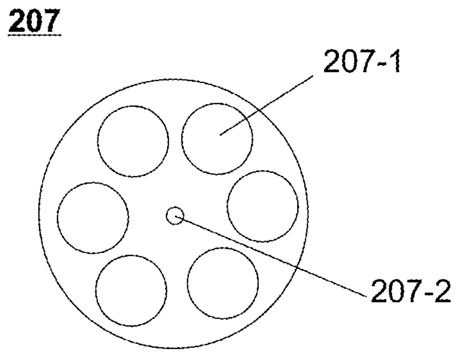
FIG. 7 is a schematic diagram illustrating an exemplary structure of a tray according to some embodiments of the present disclosure.

FIG. 7 is a schematic diagram illustrating an exemplary structure of a tray according to some embodiments of the present disclosure.

In some embodiments, a multi-chamber growth device may include the tray 207. In some embodiments, as shown in FIG. 7, the tray 207 may be disposed with at least one groove 207-1. Each groove 207-1 may be placed with a substrate. In some embodiments, a shape of the tray 207 may include a circle, an ellipse, a triangle, a rectangle, a polygon, or other regular or irregular shapes. In some embodiments, the tray 207 may be disposed with one or at least two grooves 207-1 on an upper surface. In some embodiments, a count of the groove(s) 207-1 may be 1, 2, 4, 7, 11, etc. In some embodiments, the grooves 207-1 may be distributed uniformly or un-uniformly. In some embodiments, as shown in FIG. 7, the tray 207 may be circular and six grooves 207-1 may be uniformly distributed on the upper surface of the tray 207 along a circumferential direction.

In some embodiments, a jacking structure matching with the rotation shaft 606 may be disposed on a center of the tray 207. When the tray 207 is conveyed right above the rotation shaft 606, the rotation shaft 606 may be matched with the jacking structure, so as to smoothly jack the tray 207 up to a required height. In some embodiments, the jacking structure may be connected with the rotation shaft 606 by clamping. In some embodiments, the jacking structure may include a positioning hole 207-2 in the center of the tray 207. A top end of the rotation shaft 606 may be a shaft with a cross-section area less than a cross-section area of a middle portion or a bottom end. The top end of the rotation shaft 606 may be inserted into the positioning hole 207-2 so that the rotation shaft 606 may jack the tray 207 smoothly.

Figure 8:
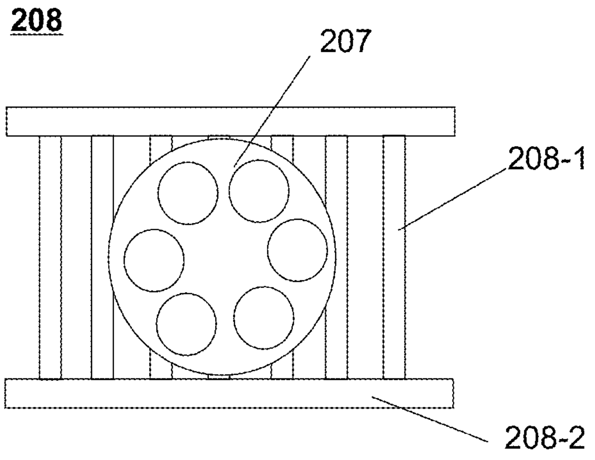
FIG. 8 is a schematic diagram illustrating an exemplary structure of a conveyance assembly according to some embodiments of the present disclosure.

FIG. 8 is a schematic diagram illustrating an exemplary structure of a conveyance assembly according to some embodiments of the present disclosure.

As shown in FIG. 8, the conveyance assembly 208 may include at least two cylindrical rollers 208-1 disposed parallel to each other and two conveyance frames 208-2 disposed parallel to upper and lower ends of the cylindrical rollers 208-1. The two conveyance frames 208-2 may be fixedly disposed under each chamber (not shown in FIG. 8), so that the cylindrical rollers 208-1 can be limited between the two conveyance frames 208-2 along an axial direction of the cylindrical rollers 208-1 and can be rotated around an axis of the cylindrical rollers 208-1. In some embodiments, the upper and lower ends of the cylindrical rollers 208-1 may be cylinders and cross-section areas of the upper and lower ends may be less than a cross-section area of a middle portion. A plurality of holes with a cross-section area greater than the cross-section areas of the upper and lower ends of the cylindrical roller 208-1 may be disposed on the conveyance frames 208-2, so that the upper and lower ends of the cylindrical rollers 208-1 can be inserted between the two conveyance frames 208-2 and the cylindrical rollers 208-1 can be rotated around their own axes. As shown in FIG. 8, the tray 207 may be placed on the cylindrical rollers 208-1. With a rotation of the cylindrical rollers 208-1, a static friction between a bottom portion of the tray 207 and the cylindrical rollers 208-1 can cause the tray 207 to be conveyed forward.

In some embodiments, a count of cylindrical rollers 208-1 may be determined based on a length of each of the conveyance frames 208-2 and diameters of the upper and lower ends of the cylindrical rollers 208-1. In some embodiments, a product of the diameter of the upper and lower ends of the cylindrical rollers 208-1 and the count of cylindrical rollers 208-1 may be less than or equal to the length of the conveyance frame 208-2. In some embodiments, the count of cylindrical rollers 208-1 may be 7, 8, 9, 10, etc. In some embodiments, a spacing between the cylindrical rollers 208-1 may be set according to actual production requirements, which can ensure that the tray 207 can be conveyed forward with the rotation of the cylindrical rollers 208-1.

In some embodiments, the conveyance frames 208-2 may be set as a straight line or curved with an angle. In some embodiments, the two conveyance frames 208-2 may be disposed to be L-shaped frames with 90 degrees and disposed between the cylindrical rollers 208-1 respectively. It should be noted that a setting form of the conveyance frame 208-2 is not limited, which just ensure that the conveyance assembly 208 can connect an inlet channel and an outlet channel of each chamber, so as to convey the tray 207 between the chambers.

Each of the vacuum chamber 201, the in-situ etching chamber 202, the carbonization chamber 203, the growth chamber 204, the buffer chamber 205, and the terminal chamber 206 may be disposed with the inlet channel, the outlet channel, and the conveyance assembly 208. The conveyance assembly 208 may connect the inlet channel and the outlet channel of each chamber. The tray 207 may be placed on the conveyance assembly 208 to cause the tray 207 to be conveyed between the chambers by the conveyance assembly 208. In some embodiments, automatic control valves may be mounted on the inlet channel and the outlet channel. The inlet channel and the outlet channel may be opened or closed through the automatic control valve to control the tray 207 to enter and exit a corresponding chamber. In some embodiments, a count of the tray(s) 207 may be one or more. If a plurality of trays 207 with substrates are placed on the conveyance assemblies 208, the plurality of trays 207 may be conveyed in batches in an assembly line between the chambers and corresponding composite crystals including the substrate and a silicon carbide crystal can be grown efficiently.

Figure 9:
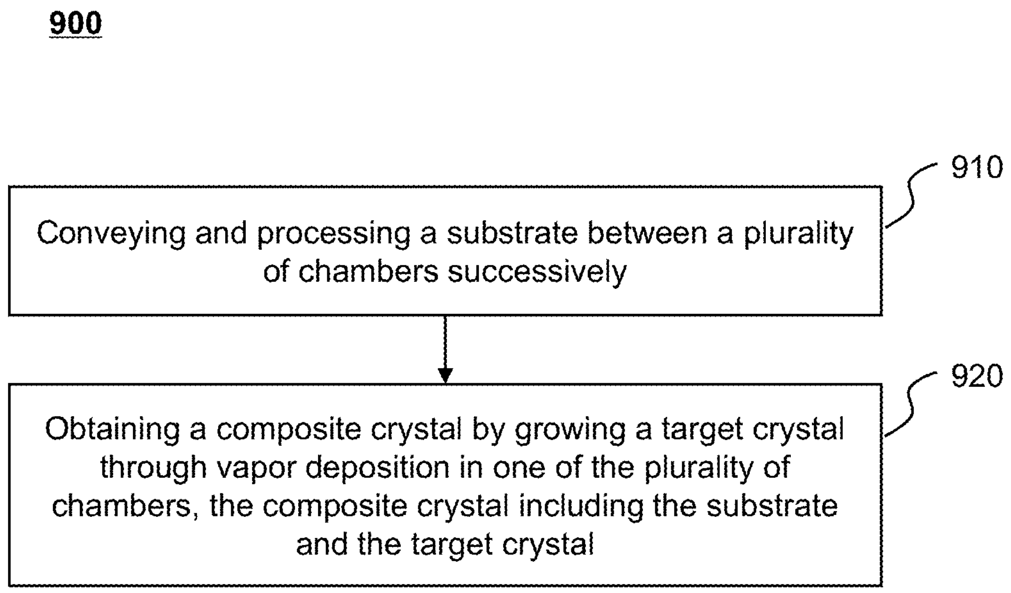
FIG. 9 is a flowchart illustrating an exemplary process for producing a silicon carbide crystal according to some embodiments of the present disclosure.

FIG. 9 is a flowchart illustrating an exemplary process for producing a silicon carbide crystal according to some embodiments of the present disclosure.

In some embodiments, a process 900 for producing a silicon carbide crystal may be executed by a control device (e.g., the control module 101). For example, the process 900 may be stored in a storage device in the form of programs or instructions. When the control module 101 executes the programs or instructions, the process 900 may be implemented. In some embodiments, the process 900 may be accomplished with one or more additional operations not described, and/or without one or more of the operations discussed. Additionally, the order in which the operations of the process 900 as illustrated in FIG. 9 and described below is not intended to be limiting.

In some embodiments, the process 900 for producing the silicon carbide crystal may be performed in a multi-chamber growth device (e.g., the multi-chamber growth device 200, the multi-chamber growth device 300). The multi-chamber growth device may include a plurality of chambers successively. More descriptions regarding the multi-chamber growth device may be found elsewhere in the present disclosure (e.g., FIGS. 2A-2B, 3A-3B, and the descriptions thereof). In some embodiments, the process 900 for producing the silicon carbide crystal may be performed in a single chamber or a reaction chamber. The single chamber or the reaction chamber may have functions (e.g., vacuumizing, heating, introducing a replacement gas) corresponding to the multi-chamber growth device. That is, the operations (e.g., a vacuum operation, an in-situ etching operation, a carbonization operation, a crystal growth operation, a cooling operation) of the process 900 for producing the silicon carbide crystal may be performed in a same reaction chamber. The process 900 for producing the silicon carbide crystal may include the following operations.

In 910, a substrate may be conveyed and processed between the plurality of chambers successively. In some embodiments, the operation 910 may be executed by the control module 101.

The substrate refers to a single crystal wafer with a particular crystal plane and suitable electrical, optical, and mechanical characteristics, which may be used to grow an epitaxial layer (e.g., a target crystal), support the target crystal, and improve characteristics of the target crystal. The selection of the substrate can consider one or more of the following conditions including structural characteristics (e.g., a lattice structure of the target crystal being the same as or similar to a lattice structure of the substrate, a small lattice constant mismatch, a good crystallization performance), interface characteristics (conducive to a growth of the target crystal, a strong adhesion), a chemical stability (not easy to decompose and corrode in a temperature and atmosphere of the growth of the target crystal), a thermal property (a good thermal conductivity, a small thermal mismatch), a good electrical conductivity, a good optical performance (less absorption of light), a good mechanical performance (easy to be processed such as polished, cut), a size (a diameter not less than 2 inches), etc. In some embodiments, a material of the substrate may include sapphire ($Al_2O_3$), silicon (Si), silicon carbide (SiC), gallium arsenide (GaAs), aluminum nitride (AlN), zinc oxide (ZnO), or the like, or any combination thereof.

In some embodiments, the substrate may include single crystal silicon. The single crystal silicon may include photovoltaic single crystal silicon. In some embodiments, a purity of the single crystal silicon may be greater than 99.9999%. In some embodiments, the purity of the single crystal silicon may be greater than 99.99999%. In some embodiments, the purity of the single crystal silicon may be greater than 99.999999%. In some embodiments, the purity of the single crystal silicon may be greater than 99.9999999%. In some embodiments, a size of a cross section of the substrate in one direction (referred to as an X direction) may be smaller than a size of a cross section in another direction perpendicular to the X direction. In some embodiments, a shape of the cross section of the substrate in the direction perpendicular to the X direction may be a circle, an ellipse, a polygon, or other regular or irregular shapes. In some embodiments, the shape of the cross section of the substrate in the direction perpendicular to the X direction may be a circle, and the size of the cross section of the substrate in the direction perpendicular to the X direction may be set according to actual production requirements. The size of the cross section of the substrate in the direction perpendicular to the X direction may be a linear distance of two farthest points on an edge of the substrate. In some embodiments, the shape of the cross section of the substrate in the direction perpendicular to the X direction may be a circle, and a diameter of the circle may be within a range of 1 to 10 inches. In some embodiments, the diameter of the circle may be within a range of 1.5 to 8 inches. In some embodiments, the diameter of the circle may be within a range of 2 to 6 inches. In some embodiments, the diameter of the circle may be within a range of 3 to 5 inches. In some embodiments, the diameter of the circle may be within a range of 3 to 4 inches. The size of the cross section of the substrate in the direction perpendicular to the X direction may be selected according to a size of the target crystal to be produced. For example, if a target crystal with a relatively large size of the cross section in the direction perpendicular to the X direction needs to be produced, a crystal with a relatively large size of the cross section in the direction perpendicular to the X direction may be selected as the substrate. The size of the substrate in the X direction may be referred to as a thickness of the substrate. In some embodiments, the thickness of the substrate may be the same in different regions. The same thickness may be that a thickness difference between a region with a maximum thickness and a region with a minimum thickness on the substrate is less than a thickness threshold (e.g., 10 microns or 15 microns). A flat substrate with the same thickness can cause a uniform stress during the crystal growth process to form a uniform crystal. In some embodiments, the thickness of the substrate may be within a range of 100 microns to 400 microns. In some embodiments, the thickness of the substrate may be within a range of 160 microns to 300 microns. In some embodiments, the thickness of the substrate may be within a range of 180 microns to 280 microns. In some embodiments, the thickness of the substrate may be within a range of 200 microns to 260 microns. In some embodiments, the thickness of the substrate may be within a range of 220 microns to 240 microns. The thickness of the above substrate is similar to a thickness of a mass-produced photovoltaic single crystal wafer, which is easy to obtain and of which the cost is relatively low.

In some embodiments, the multi-chamber growth device may at least include an in-situ etching chamber, a carbonization chamber, a growth chamber, a buffer chamber, and a conveyance assembly. The in-situ etching chamber, the carbonization chamber, the growth chamber, and the buffer chamber may be arranged successively. In some embodiments, the multi-chamber growth device may include a vacuum chamber, an in-situ etching chamber, a carbonization chamber, a growth chamber, a buffer chamber, a terminal chamber, and a conveyance assembly. The in-situ etching chamber, the carbonization chamber, the growth chamber, the buffer chamber, and the terminal chamber may be arranged successively. In some embodiments, each chamber may be disposed with an inlet channel and an outlet channel. The substrate may be conveyed between the chambers by the conveyance assembly (e.g., the conveyance assembly 208). More descriptions regarding the multi-chamber growth device may be found elsewhere in the present disclosure (e.g., FIGS. 2A-2B, 3A-3B, and the descriptions thereof).

In some embodiments, the substrate may be conveyed and processed between the plurality of chambers successively to perform different operations on the substrate or a composite crystal respectively. For example, an in-situ etching operation, a carbonization operation, a crystal growth, a buffer operation, a cooling operation, or other operations may be performed on the substrate or the composite crystal. More descriptions regarding the conveying and processing the substrate between the plurality of chambers successively may be found elsewhere in the present disclosure (e.g., FIG. 11 and the descriptions thereof).

In some embodiments, a plurality of substrates (or referred to as a group or a batch of substrates) may be conveyed simultaneously in the multi-chamber growth device for the crystal growth to achieve mass production of composite crystals. In some embodiments, a plurality of groups or batches of substrates may be conveyed successively in the multi-chamber growth device for the crystal growth to achieve continuous assembly line production of the composite crystals. In some embodiments, before completing the conveying and processing of the at least one substrate between the plurality of chambers successively, conveying and processing of another batch of at least one substrate between the plurality of chambers may be initiated. The substrates of the two batches may be conveyed and processed in different chambers of the multi-chamber growth device simultaneously.

In 920, a composite crystal may be obtained by growing the target crystal through vapor deposition in one of the plurality of chambers. The composite crystal may include the substrate and the target crystal. In some embodiments, the operation 920 may be executed by the control module 101.

In some embodiments, the chamber in the multi-chamber growth device may be the growth chamber. In some embodiments, the composite crystal including the substrate and the target crystal may be produced by performing a growth operation of the target crystal on the substrate surface by vapor deposition. The vapor deposition method may include introducing gaseous reactants of elements of a thin film, vapors of liquid reactants, or other gases required for the reaction into a reaction environment; occurring a chemical reaction on the surface of the substrate, and forming the thin film by depositing solid products on the surface of the substrate.

In some embodiments, the target crystal may include a silicon carbide crystal, a silicon nitride crystal, a molybdenum disulfide crystal, a boron nitride crystal, a graphene crystal, etc. A silicon carbide crystal may be taken as an example below to illustrate a process for producing a composite crystal. It should be noted that the target crystal in the present disclosure is not limited to the silicon carbide crystal. The target crystal in the present disclosure may include any composite crystal that can be produced by vapor deposition.

In some embodiments, reactants for producing the composite crystal may include a silicon source and a carbon source. In some embodiments, the silicon source may include silane ($SiH_4$), chlorosilane, trimethylchlorosilane, etc. In some embodiments, the carbon source may include propane ($C_3H_8$), butane, ethane, acetylene, etc. In some embodiments, the crystal growth process may be performed on the substrate surface by introducing silane and propane into the growth chamber. In some embodiments, a carrier gas may be used to carry the reactant gas into the growth chamber. The carrier gas does not participate in the reaction and is only used to carry the reactant gas. Accordingly, inert gas or gas with a relatively high chemical stability may be selected. In some embodiments, the carrier gas may include hydrogen ($H_2$), (nitrogen) $N_2$, argon (Ar), helium (He), etc. In some embodiments, $H_2$ or $N_2$ may be selected as the carrier gas in consideration of price and chemical stability.

In some embodiments, the composite crystal may be chemically etched to remove the substrate of the composite crystal to obtain the silicon carbide crystal. Since a hardness of the silicon carbide crystal is different from a hardness of the substrate and the silicon carbide crystal has a higher acid resistance or alkali resistance than the substrate, the substrate can be removed by an acidic solution or an alkali solution and the silicon carbide crystal can be retained.

In some embodiments, the silicon carbide crystal may be obtained by ultrasonically cleaning, using an etching solution, the composite crystal in a first temperature range for a first time period to dissolve and remove the substrate. In some embodiments, the first temperature range may be within a range of 50° C. to 100° C. In some embodiments, the first temperature range may be within a range of 65° C. to 80° C. In some embodiments, the first temperature range may be within a range of 67° C. to 78° C. In some embodiments, the first temperature range may be within a range of 70° C. to 76° C. In some embodiments, the first temperature range may be within a range of 72° C. to 74° C. A speed of etching may be accelerated by setting the first temperature range of 50° C. to 100° C.

In some embodiments, the etching solution may include an alkali solution or an acidic solution. In some embodiments, the alkali solution may include a sodium hydroxide (NaOH) solution, a potassium hydroxide (KOH) solution, an ammonium hydroxide ($NH_4OH$) solution, or the like, or any combination thereof. In some embodiments, the alkali solution may be the NaOH solution with a mass fraction in a range of 5% to 30%. In some embodiments, the alkali solution may be the NaOH solution with a mass fraction in a range of 10% to 25%. In some embodiments, the alkali solution may be the NaOH solution with a mass fraction in a range of 12% to 23%. In some embodiments, the alkali solution may be the NaOH solution with a mass fraction in a range of 14% to 21%. In some embodiments, the alkali solution may be the NaOH solution with a mass fraction in a range of 16% to 18%. In some embodiments, the acidic solution may include a hydrochloric acid solution, a dilute sulfuric acid solution, a nitric acid solution, a hydrofluoric acid, a hypochlorous acid solution, or the like, or any combination thereof. In some embodiments, a purity of the alkali solution or the acidic solution is not limited. For example, the alkali solution or the acidic solution may be an acid solution or an alkali solution recovered from other processes (e.g., processes for producing photovoltaic or semiconductor devices), which can achieve resource recycle, save costs, and is environment friendly.

In some embodiments, the first time period may be positively correlated with the thickness of the substrate. That thicker the substrate is, the longer the first time period required for etching the substrate may be. In some embodiments, the first time period may be larger than or equal to 40 minutes. In some embodiments, the first time period may be within a range of 40 minutes to 90 minutes. In some embodiments, the first time period may be within a range of 50 minutes to 80 minutes. In some embodiments, the first time period may be within a range of 55 minutes to 75 minutes. In some embodiments, the first time period may be within a range of 60 minutes to 70 minutes. In some embodiments, the first time period may be within a range of 63 minutes to 68 minutes. By setting the first time period of the ultrasonic cleaning as 40 minutes to 90 minutes, the substrate of the composite crystal can be sufficiently etched and the silicon carbide crystal without the substrate can be obtained. In some embodiments, it may be determined whether the etching of the substrate is completed by an observation of a human eye or an assembly detection. A quality of the silicon carbide crystal may be characterized by a basal plane dislocation density (a count of defects per unit area). More descriptions regarding the basal plane dislocation density may be found elsewhere in the present disclosure (e.g., FIG. 1 and the descriptions thereof).

In some embodiments, the silicon carbide crystal without the substrate may be cleaned. In some embodiments, the silicon carbide crystal without the substrate may be cleaned for a certain time period (e.g., 3 minutes to 10 minutes) using a cleaning solution (e.g., isopropanol or deionized water) under the action of 50° C. to 80° C. and ultrasonic waves. The silicon carbide crystal with a clean surface may be obtained by cleaning the silicon carbide crystal.

Figure 10:
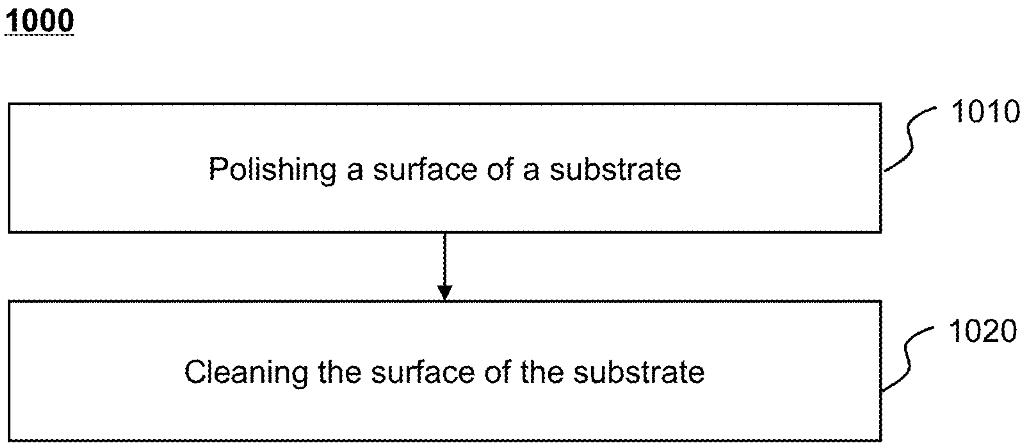
FIG. 10 is a flowchart illustrating an exemplary process for processing a surface of a substrate according to some embodiments of the present disclosure.

FIG. 10 is a flowchart illustrating an exemplary process for processing a surface of a substrate according to some embodiments of the present disclosure. In some embodiments, before a substrate is conveyed and processed between a plurality of chambers successively, a surface of the substrate may be cleaned to cause the surface of the substrate (especially a crystal growth surface) to maintain clean and flat.

In some embodiments, the process 1000 for processing the surface of the substrate may be performed by a control device (e.g., the control module 101). For example, the process 1000 may be stored in a storage device in the form of programs or instructions. When the control module 101 executes the programs or instructions, the process 1000 may be implemented. In some embodiments, the process 1000 may be accomplished with one or more additional operations not described, and/or without one or more of the operations discussed. Additionally, the order in which the operations of the process 1000 as illustrated in FIG. 10 and described below is not intended to be limiting.

In 1010, the surface of the substrate may be polished. In some embodiments, the operation 1010 may be performed by the polishing module 104.

In some embodiments, the substrate may be placed on a polishing device (e.g., a polisher). In some embodiments, a rear surface (an opposite surface of a crystal growth surface) of the substrate may be polished first, and then a front surface (the crystal growth surface) of the substrate may be finely polished. In some embodiments, the front surface (crystal growth surface) of the substrate may be finely polished. In some embodiments, the rear surface (the opposite surface of the crystal growth surface) of the substrate may be polished. Cutting scratches and defects on the rear surface of the substrate may be removed by polishing the rear surface of the substrate, which can make the substrate flat and ensure a levelness of the crystal growth surface in conveying the substrate. The front surface of the substrate can be made flat by finely polishing the front surface (the crystal growth surface) of the substrate, so that reaction products can be crystallized evenly on the crystal growth surface during a crystal growth.

In some embodiments, the polished substrate may be dried. For example, each surface of the substrate may be dried with nitrogen or helium.

In 1020, the surface of the substrate may be cleaned. In some embodiments, the operation 1010 may be performed by the cleaning module 105.

In some embodiments, the surface of the substrate may be cleaned using a cleaning device (e.g., an ultrasonic cleaning device) to remove residues generated in the polishing operation. In some embodiments, the surface of the substrate may be cleaned at least once using at least one cleaning solution. In some embodiments, the surface of the substrate may be ultrasonically cleaned using acetone, alcohol, and deionized water successively. In some embodiments, a single cleaning time period may be at least 5 minutes. In some embodiments, the single cleaning time period may be within a range of 5 minutes to 30 minutes. In some embodiments, the single cleaning time period may be within a range of 10 minutes to 20 minutes. In some embodiments, the single cleaning time period may be within a range of 15 minutes to 18 minutes. In some embodiments, the cleaned substrate may be dried. For example, after the substrate is cleaned, each surface of the substrate may be dried with nitrogen or helium.

In some embodiments, the substrate may be further cleaned after the surface of the substrate is polished and cleaned. In some embodiments, the polished and cleaned substrate may be immersed in a strong acidic solution for a certain time period and then further cleaned. In some embodiments, the strong acidic solution may include a hydrochloric acid solution, a sulfuric acid solution, a nitric acid solution, a hydrofluoric acid, a hypochlorite solution, or the like, or any combination thereof. In some embodiments, the strong acidic solution may include the hydrofluoric acid (HF) solution with a mass fraction in a range of 30% to 40%. In some embodiments, the substrate may be immersed in a diluted acidic solution to avoid damaging the substrate due to a high concentration of the acidic solution. In some embodiments, the HF solution with the mass fraction in the range of 30% to 40% may be diluted into the HF solution with the mass fraction of 1%, and then the substrate may be immersed in the HF solution with the mass fraction in a range of 1% to 3% for a certain time period. Further, the substrate may be cleaned with the ultrasonic cleaning device. In some embodiments, a single crystal silicon substrate may be immersed in the HF solution with the mass fraction in the range of 1% to 3% for 5 minutes to 8 minutes, and then further ultrasonically cleaned with deionized water for 5 minutes to 10 minutes. In some embodiments, the further cleaned substrate may be dried. For example, each surface of the further cleaned substrate may be dried with nitrogen or helium.

Figure 11:
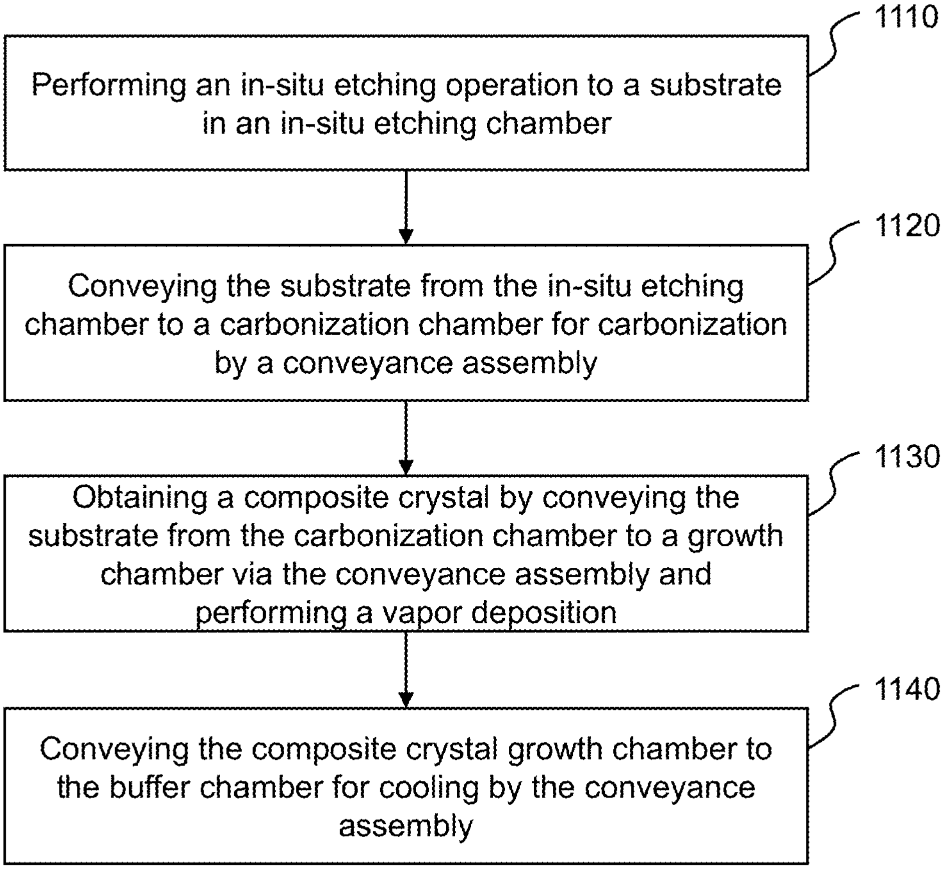
FIG. 11 is a flowchart illustrating an exemplary process for conveying and processing a substrate between chambers according to some embodiments of the present disclosure.

FIG. 11 is a flowchart illustrating an exemplary process for conveying and processing a substrate between chambers according to some embodiments of the present disclosure.

In some embodiments, a process 1100 for conveying and processing a substrate between chambers may be performed by a control device (e.g., the control module 101). For example, the process 1100 may be stored in a storage device in the form of programs or instructions. When the control module 101 executes the programs or instructions, the process 1100 may be implemented. In some embodiments, the process 1100 may be accomplished with one or more additional operations not described, and/or without one or more of the operations discussed. Additionally, the order in which the operations of the process 1100 as illustrated in FIG. 11 and described below is not intended to be limiting.

More descriptions regarding the multi-chamber growth device may be found elsewhere in the present disclosure (e.g., FIGS. 2A-2B, 3A-3B, 9, and the descriptions thereof). The process 1100 for conveying and processing the substrate between the chambers may include the following operations.

In 1110, an in-situ etching operation may be performed on the substrate in an in-situ etching chamber.

In some embodiments, the in-situ etching operation may be performed on at least one substrate. For example, one or more substrates may be placed on a tray and conveyed to the in-situ etching chamber for performing the in-situ etching operation. In some embodiments, the in-situ etching operation may be performed on the substrate under reaction conditions of a certain pressure, a certain temperature, and a reaction gas. In some embodiments, a pressure of the in-situ etching chamber may be maintained in a second pressure range and a temperature of the in-situ etching chamber may be maintained in a second temperature range for a second time period. Then hydrogen may be introduced into the in-situ etching chamber to cause the pressure of the in-situ etching chamber to an atmospheric pressure. The in-situ etching operation may be performed on the substrate by maintaining the temperature of the in-situ etching chamber in a third temperature range for a third time period. More descriptions regarding the performing the in-situ etching operation on the substrate may be found elsewhere in the present disclosure (e.g., FIG. 13 and the descriptions thereof).

Defects on a crystal growth surface of the substrate may be removed by the in-situ etching operation, accordingly, a silicon carbide crystal with a uniform crystal form and a high quality can be grown on the surface of the substrate.

In 1120, the substrate may be conveyed from the in-situ etching chamber to the carbonization chamber for carbonization by the conveyance assembly.

A carbonization operation may be performed on the substrate after the in-situ etching operation is completed. In some embodiments, the substrate may be conveyed from the in-situ etching chamber to the carbonization chamber by the conveyance assembly (e.g., the conveyance assembly 208). In some embodiments, the carbonization operation may be performed on the substrate under reaction conditions of a certain gas pressure, a certain temperature, and a carbonization gas. In some embodiments, a pressure of the carbonization chamber may be maintained in a third pressure range for a fourth time period. A temperature of the carbonization chamber may be equal or similar to the temperature of the in-situ etching chamber (a temperature difference between the temperature of the carbonization chamber and the temperature of the in-situ etching chamber may be less than or equal to 5° C.). Then a third channel between the in-situ etching chamber and the carbonization chamber may be controlled to be open, the substrate may be conveyed to the carbonization chamber by the conveyance assembly 208 through the third channel, and the third channel may be closed. The temperature of the carbonization chamber may be cooled to a fifth temperature range and the pressure of the carbonization chamber may be vacuumized to a fourth pressure range. Then the carbonization operation may be performed by adjusting the temperature of the carbonization chamber to a fourth temperature range by gradually heating and adjusting the pressure of the carbonization chamber to the third pressure range by simultaneously introducing a carbonization gas (e.g., methane, propane, butane) and hydrogen. More descriptions regarding the carbonizing the substrate may be found elsewhere in the present disclosure (e.g., FIG. 14 and the descriptions thereof).

A carbonization buffer layer may be produced on the crystal growth surface of the substrate by carbonizing the substrate, which may be conducive to the crystallization of the silicon carbide crystal on the surface of the substrate.

In 1130, a composite crystal may be obtained by conveying the substrate from the carbonization chamber to the growth chamber via the conveyance assembly and performing a vapor deposition.

After the substrate is carbonized, the silicon carbide crystal may be grown on the crystal growth surface of the substrate. In some embodiments, the substrate may be conveyed from the carbonization chamber to the growth chamber by the conveyance assembly (e.g., the conveyance assembly 208). In some embodiments, a temperature of the growth chamber may be heated to the fourth temperature range and a pressure of the growth chamber may be adjusted to the third pressure range. Then a fourth channel between the carbonization chamber and the growth chamber may be controlled to be open, the substrate may be conveyed to the growth chamber by the conveyance assembly 208 through the fourth channel, and the fourth channel may be closed. More descriptions regarding conveying the substrate from the carbonization chamber to the growth chamber may be found elsewhere in the present disclosure (e.g., FIG. 15 and the descriptions thereof).

In some embodiments, in the growth chamber, the composite crystal including the substrate and the silicon carbide crystal may be obtained by performing a crystal growth through vapor deposition on the crystal growth surface of the substrate. In some embodiments, the temperature of the growth chamber may be heated to a sixth temperature range and the crystal growth may be performed by introducing silane, propane, and hydrogen to cause the pressure of the growth chamber to a fifth pressure range. The crystal growth may be stopped when a thickness of the target crystal reaches a target thickness. More descriptions regarding the crystal growth in the growth chamber may be found elsewhere in the present disclosure (e.g., FIG. 16 and the descriptions thereof).

In 1140, the composite crystal may be conveyed from the growth chamber to the buffer chamber for cooling by the conveyance assembly.

The grown composite crystal may be further cooled. In some embodiments, the composite crystal may be conveyed from the growth chamber to the buffer chamber for cooling in the buffer chamber by conveyance assembly 208. In some embodiments, a temperature of the buffer chamber may be heated to be the sixth temperature range. Then a fifth channel between the growth chamber and the buffer chamber may be controlled to be open, the composite crystal may be conveyed to the buffer chamber by the conveyance assembly 208 through the fifth channel, and the fifth channel may be closed. Then the temperature of the buffer chamber may be gradually cooled to a seventh temperature range for a fifth time period. More descriptions regarding cooling in the buffer chamber may be found elsewhere in the present disclosure (e.g., FIG. 17 and the descriptions thereof).

Figure 12:
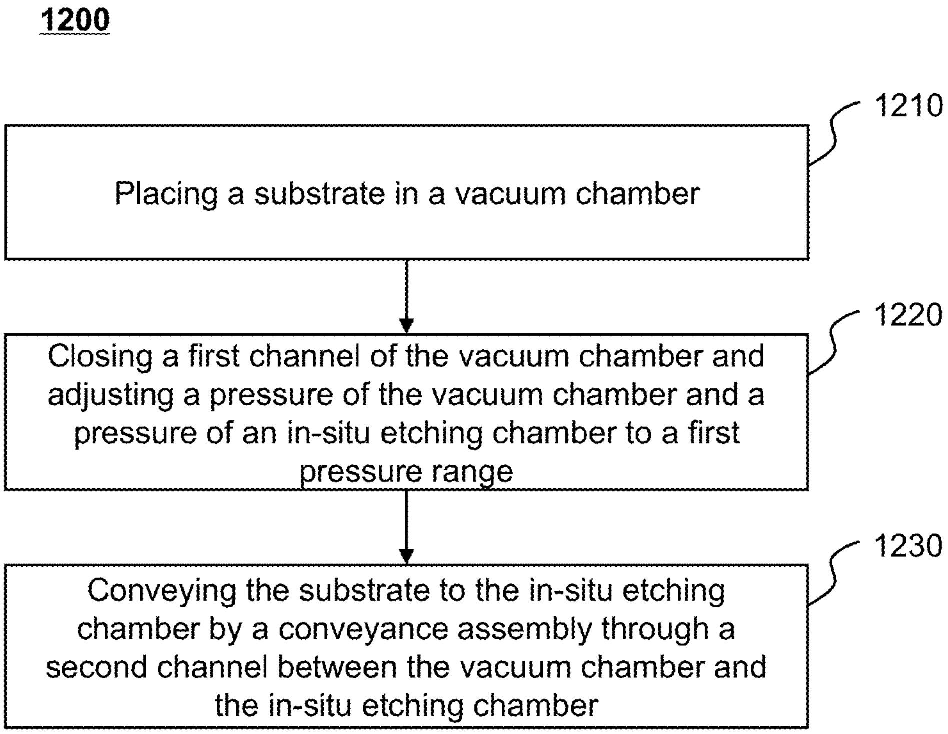
FIG. 12 is a flowchart illustrating an exemplary process for performing a vacuum operation according to some embodiments of the present disclosure.

FIG. 12 is a flowchart illustrating an exemplary process for performing a vacuum operation according to some embodiments of the present disclosure. In some embodiments, before the in-situ etching operation is performed on the substrate, a vacuum operation may be performed on the substrate.

In some embodiments, a process 1200 for performing a vacuum operation may be executed by a control device (e.g., the control module 101). For example, the process 1200 may be stored in a storage device in the form of programs or instructions. When the control module 101 executes the programs or instructions, the process 1200 may be implemented. In some embodiments, the process 1200 may be accomplished with one or more additional operations not described, and/or without one or more of the operations discussed. Additionally, the order in which the operations of the process 1200 as illustrated in FIG. 12 and described below is not intended to be limiting.

In some embodiments, the vacuum operation may be performed in a vacuum chamber. More descriptions regarding the vacuum chamber may be found elsewhere in the present disclosure (e.g., FIGS. 3A-3B and the descriptions thereof). The process 1200 for performing the vacuum operation may include the following operations. In 1210, the substrate may be placed in the vacuum chamber.

In some embodiments, the vacuum operation may be performed on the substrate after the substrate is polished and cleaned. In some embodiments, the substrate may be manually placed in the vacuum chamber. Alternatively, the substrate may be manually placed on the conveyance assembly 208 and conveyed to the vacuum chamber by the conveyance assembly 208. In some embodiments, the substrate may be placed in the vacuum chamber by the mechanical structure 111 (e.g., a robotic arm). Alternatively, the substrate may be placed on the conveyance assembly 208 by the mechanical structure 111 and conveyed to the vacuum chamber by the conveyance assembly 208. In some embodiments, one or more substrates may be placed in the vacuum chamber. In some embodiments, a plurality of groups of substrates may be placed in the vacuum chamber successively.

In 1220, a first channel of the vacuum chamber may be closed and a pressure of the vacuum chamber and a pressure of the in-situ etching chamber may be adjusted to a first pressure range.

In some embodiments, the first channel may be an inlet channel (e.g., the inlet channel 401) of the vacuum chamber. In some embodiments, the pressure of the in-situ etching chamber may be adjusted to be equal or similar to the pressure of the vacuum chamber (a difference between the pressures does not exceed 5 Pa), and then the substrate may be conveyed to the in-situ etching chamber. In some embodiments, after the substrate is conveyed to the vacuum chamber, the first channel of the vacuum chamber may be closed, and the vacuum chamber and the in-situ etching chamber may be vacuumized to the first pressure range. In some embodiments, the first pressure range may be within a range of 3 Pa to 15 Pa. In some embodiments, the first pressure range may be within a range of 5 Pa to 10 Pa. In some embodiments, the first pressure range may be within a range of 6 Pa to 9 Pa. In some embodiments, the first pressure range may be within a range of 7 Pa to 8 Pa. A pressure difference between the vacuum chamber and the in-situ etching chamber can be reduced by adjusting the pressure of the vacuum chamber and the pressure of the in-situ etching chamber to the first pressure range, so that the substrate can be in a relatively stable environment.

In some embodiments, the vacuum chamber and the in-situ etching chamber may be vacuumized simultaneously. In some embodiments, an air pump pipeline of the vacuum chamber may be connected to an air pump pipeline of the in-situ etching chamber (e.g., the air pump pipeline 403 and the air pump pipeline 503), then the air pump pipelines may be connected to a vacuum device, and an operation speed and time of the vacuum device may be controlled for vacuumizing. In some embodiments, the vacuum chamber and the in-situ etching chamber may be vacuumized respectively and the pressures may be monitored in real time. In some embodiments, the air pump pipeline of the vacuum chamber and the air pump pipeline of the in-situ etching chamber may be connected to a plurality of vacuum devices respectively, operation speeds and times of the vacuum devices may be controlled to vacuumize the vacuum chamber and the in-situ etching chamber respectively, and the pressures may be monitored in real time. In some embodiments, a combination of a mechanical pump and a molecular pump may be used for vacuumizing. In some embodiments, the vacuum chamber and/or the in-situ etching chamber may be vacuumized to a certain vacuum degree by the mechanical pump, and then the vacuum chamber and/or the in-situ etching chamber may continue to be vacuumized to the first pressure range by the molecular pump.

In 1230, the substrate may be conveyed to the in-situ etching chamber by the conveyance assembly through a second channel between the vacuum chamber and the in-situ etching chamber.

In some embodiments, when the pressure of the vacuum chamber and the pressure of the in-situ etching chamber are equal or close and reach the first pressure range, the substrate may be conveyed to the in-situ etching chamber. In some embodiments, the control module 101 may control the second channel between the vacuum chamber and the in-situ etching chamber to be open and control the conveyance assembly 208 to convey the substrate to a specific position in the in-situ etching chamber. Then the second channel may be closed and the conveyance assembly 208 may be stopped. The second channel refers to a channel adjacent to the vacuum chamber and the in-situ etching chamber. For example, the second channel may include the inlet channel 501 of the in-situ etching chamber or the outlet channel 402 of the vacuum chamber. In some embodiments, the inlet channel 501 of the in-situ etching chamber and the outlet channel 402 of the vacuum chamber may be a same channel. In some embodiments, the specific position in the in-situ etching chamber may be a central region of a bottom portion of the in-situ etching chamber. In some embodiments, a position of the substrate may be detected by the detection module 102 (e.g., a sensor). In some embodiments, when the detection module 102 detects that the substrate is in the central region of the bottom portion of the in-situ etching chamber, position information of the substrate may be transmitted to the control module 101. The control module 101 may control the mechanical structure 111 (e.g., the conveyance assembly 208) to stop operation.

Figure 13:
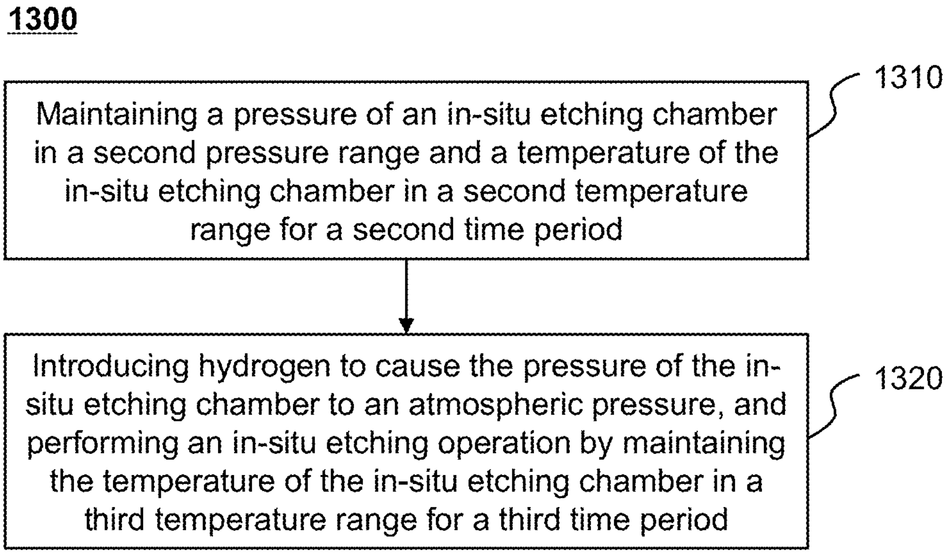
FIG. 13 is a flowchart illustrating an exemplary process for performing an in-situ etching operation according to some embodiments of the present disclosure.

FIG. 13 is a flowchart illustrating an exemplary process for performing an in-situ etching operation according to some embodiments of the present disclosure.

In some embodiments, a process 1300 for performing an in-situ etching operation may be executed by a control device (e.g., the control module 101). For example, the process 1300 may be stored in a storage device in the form of programs or instructions. When the control module 101 executes the programs or instructions, the process 1300 may be implemented. In some embodiments, the process 1300 may be accomplished with one or more additional operations not described, and/or without one or more of the operations discussed. Additionally, the order in which the operations of the process 1300 as illustrated in FIG. 13 and described below is not intended to be limiting.

In some embodiments, the in-situ etching operation may be performed on the substrate in an in-situ etching chamber. More descriptions regarding the in-situ etching chamber may be found elsewhere in the present disclosure (e.g., FIGS. 2A-2B, 3A-3B, and the descriptions thereof). The process 1300 for performing the in-situ etching operation on the substrate may include the following operations.

In 1310, a pressure of the in-situ etching chamber may be maintained in a second pressure range and a temperature of the in-situ etching chamber may be maintained in a second temperature range for a second time period.

In some embodiments, the in-situ etching operation may be performed on the substrate by introducing hydrogen under a first condition. In some embodiments, the first condition may include maintaining the pressure in the second pressure range and the temperature in the second temperature range for the second time period. In some embodiments, the second pressure range may be less than $5\times10^{-3}$ Pa. In some embodiments, the second pressure range may be less than $1\times10^{-3}$ Pa. In some embodiments, the second pressure range may be less than $0.8\times10^{-3}$ Pa. In some embodiments, the second pressure range may be less than $0.5\times10^{-3}$ Pa. In some embodiments, the second pressure range may be less than $1\times10^{-4}$ Pa. In some embodiments, the second pressure range may be less than $1\times10^{-5}$ Pa. By setting the pressure of the in-situ etching chamber less than $5\times10^{-3}$ Pa, it is conducive that the gas generated during the in-situ etching operation can desorb from the surface of the substrate and achieve a better desorption effect.

In order to remove the gas in the in-situ etching chamber as much as possible without damaging the substrate, an appropriate temperature range should be selected as the second temperature. For example, when nitrogen or oxygen is adsorbed on the surface of the substrate, if the temperature is too low, it is difficult for the above gas to desorb from the surface of the substrate; whereas if the temperature is too high, the substrate may be azotized or oxidized. In some embodiments, the second temperature range may be within a range of 400° C. to 900° C. In some embodiments, the second temperature range may be within a range of 500° C. to 800° C. In some embodiments, the second temperature range may be within a range of 550° C. to 750° C. In some embodiments, the second temperature range may be within a range of 600° C. to 700° C. In some embodiments, the second temperature range may be within a range of 630° C. to 680° C. In some embodiments, the temperature of the in-situ etching chamber may be adjusted by the heating body 505. More descriptions regarding the heating body 505 may be found elsewhere in the present disclosure (e.g., FIG. 5 and the descriptions thereof).

In some embodiments, the second time period may be at least 10 minutes. In some embodiments, the second time period may be within a range of 10 minutes to 90 minutes. In some embodiments, the second time period may be within a range of 20 minutes to 80 minutes. In some embodiments, the second time period may be within a range of 25 minutes to 75 minutes. In some embodiments, the second time period may be within a range of 30 minutes to 70 minutes. In some embodiments, the second time period may be within a range of 40 minutes to 60 minutes. The temperature of the in-situ etching chamber may be maintained stable by maintaining the second temperature range for 10 minutes to 90 minutes, which is convenient to perform a uniform and effective etching operation on the substrate subsequently.

In some embodiments, after the substrate is conveyed to the in-situ etching chamber, the control module 101 may control the vacuum device to vacuumize the in-situ etching chamber so that the pressure of the in-situ etching chamber reaches the second pressure range, and the temperature of the in-situ etching chamber may be slowly increased to the second temperature range and maintained for the second time period, so as to fully discharge the gas in the in-situ etching chamber.

In 1320, hydrogen may be introduced to cause the pressure of the in-situ etching chamber to an atmospheric pressure. The in-situ etching operation may be performed by maintaining the temperature of the in-situ etching chamber in a third temperature range for a third time period.

In some embodiments, the third temperature range may be within a range of 900° C. to 1300° C. In some embodiments, the third temperature range may be within a range of 1000° C. to 1200° C. In some embodiments, the third temperature range may be within a range of 1050° C. to 1150° C. In some embodiments, the third temperature range may be within a range of 1080° C. to 1130° C. The hydrogen can react with an oxide attached to the surface of the substrate by setting the temperature of the in-situ etching chamber in the third temperature range, so that the oxide can be reduced to complete the in-situ etching operation.

In some embodiments, the third time period may be at least 0.5 minutes. In some embodiments, the third time period may be within a range of 0.5 minutes to 5 minutes. In some embodiments, the third time period may be within a range of 1 minute to 3 minutes. In some embodiments, the third time period may be within a range of 1.5 minutes to 2.8 minutes. In some embodiments, the third time period may be within a range of 1.8 minutes to 2.5 minutes. In some embodiments, the third time period may be 2 minutes. The substrate can be fully etched by performing the etching operation at the atmospheric pressure and in the third temperature range for the third time period.

In some embodiments, after the gas in the in-situ etching chamber is discharged, the control module 101 may control the introduction of hydrogen into the in-situ etching chamber for performing the in-situ etching operation. In some embodiments, the control module 101 may control a valve on the air inlet pipeline 504 to be open to introduce hydrogen into the in-situ etching chamber to cause the pressure of the in-situ etching chamber to the atmospheric pressure, control the heating body 505 to heat the in-situ etching chamber to increase the temperature of the in-situ etching chamber to the third temperature range, and perform the in-situ etching operation to remove defects of the crystal growth surface by maintaining the temperature for the third time period.

Figure 14:
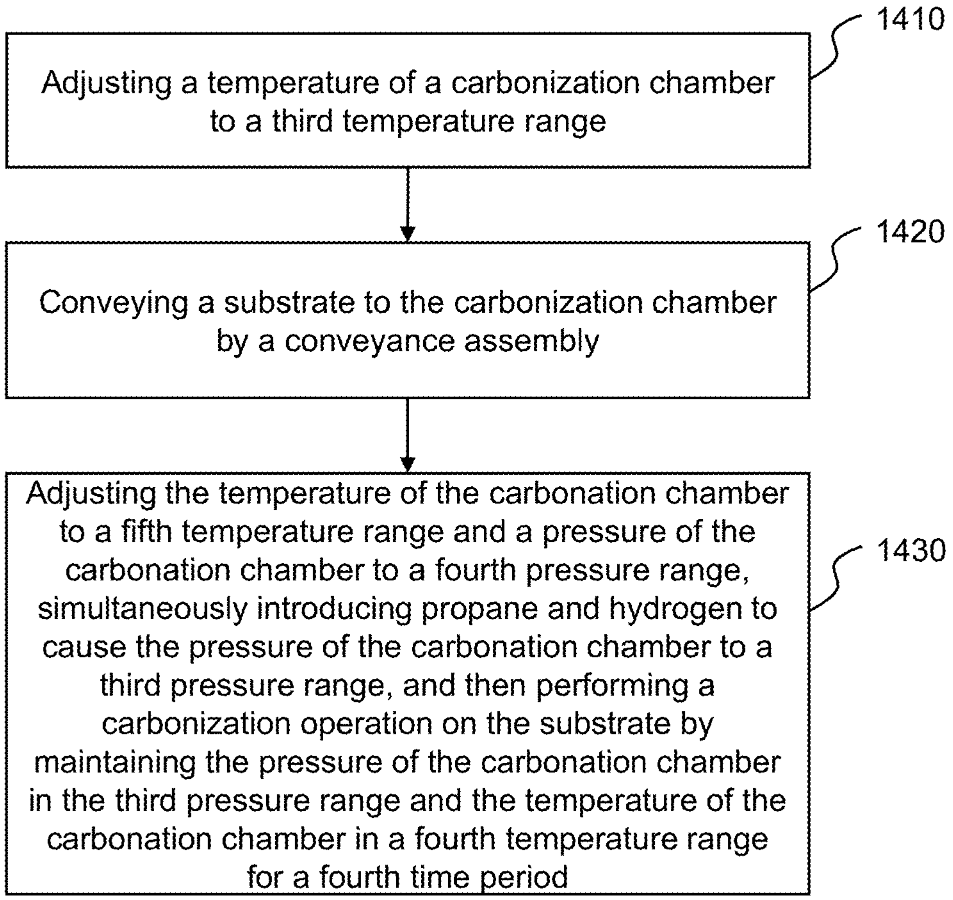
FIG. 14 is a flowchart illustrating an exemplary process for performing a carbonization operation according to some embodiments of the present disclosure.

FIG. 14 is a flowchart illustrating an exemplary process for performing a carbonization operation according to some embodiments of the present disclosure. In some embodiments, after the in-situ etching operation is completed, the substrate may be conveyed to a carbonization chamber. A carbonization operation may be performed on a crystal growth surface of the substrate to form a carbonization buffer layer on the crystal growth surface.

In some embodiments, a process 1400 for performing a carbonization operation may be executed by a control device (e.g., the control module 101). For example, the process 1400 may be stored in a storage device in the form of programs or instructions. When the control module 101 executes the programs or instructions, the process 1400 may be implemented. In some embodiments, the process 1400 may be accomplished with one or more additional operations not described, and/or without one or more of the operations discussed. Additionally, the order in which the operations of the process 1400 as illustrated in FIG. 14 and described below is not intended to be limiting. The process 1400 for performing a carbonization operation may include the following operations.

In 1410, a temperature of a carbonization chamber may be adjusted to a third temperature range.

In some embodiments, the carbonization chamber may be heated to the third temperature range by a heating body in the carbonization chamber. More descriptions regarding the heating body and the third temperature range may be found elsewhere in the present disclosure. In some embodiments, the control module 101 may control the heating module 103 (e.g., the heating body) to increase the temperature of the carbonization chamber to the third temperature range.

When the carbonization chamber is heated to a temperature equal or close to a temperature of the in-situ etching chamber (a temperature difference may be less than or equal to 5° C.), the substrate may be conveyed to the carbonization chamber to avoid a deformation or denaturation of the substrate due to a sudden temperature change.

In 1420, the substrate may be conveyed to the carbonization chamber by a conveyance assembly.

In some embodiments, the substrate may be conveyed to the carbonization chamber when the temperatures of both the in-situ etching chamber and the carbonization chamber are maintained in the third temperature range. In some embodiments, the control module 101 may control a third channel between the in-situ etching chamber and the carbonization chamber to be open and control the conveyance assembly (e.g., the conveyance assembly 208) to convey the substrate to a specific position in the carbonization chamber. Then the third channel may be closed and the conveyance assembly may be stopped. The third channel refers to a channel adjacent to the in-situ etching chamber and the carbonization chamber. For example, the third channel may be the outlet channel 502 of the in-situ etching chamber or the inlet channel 501 of the carbonization chamber. In some embodiments, the outlet channel 502 of the in-situ etching chamber and the inlet channel 501 of the carbonization chamber may be a same channel. In some embodiments, the specific position in the carbonization chamber may be a central region of a bottom portion of the carbonization chamber. In some embodiments, a position of the substrate may be detected by the detection module 102 (e.g., a sensor). In some embodiments, when the sensor detects that the substrate is in the central region of the bottom portion of the in-situ etching chamber, position information of the substrate may be transmitted to the control module 101. The control module 101 may control the mechanical structure 111 (e.g., the conveyance assembly 208) to stop operation.

In 1430, the temperature of the carbonization chamber may be adjusted to a fifth temperature range and the pressure of the carbonization chamber may be adjusted to a fourth pressure range. Propane and hydrogen may be introduced to cause the pressure of the carbonization chamber to a third pressure range simultaneously. Then the carbonization operation may be performed on the substrate by maintaining the pressure of the carbonization chamber in the third pressure range and the temperature of the carbonization chamber in the fourth temperature range for a fourth time period.

Since the temperature of the substrate is relatively high (900° C. to 1300° C.) after the in-situ etching operation is completed in the in-situ etching chamber, if the substrate is directly conveyed to the carbonization chamber, the substrate may directly react with the carbonization gas and may cause the pressure and gas components unstable, the temperature of the carbonization chamber may be reduced first, after the pressure and the gas components are stable, the temperature may be increased to a required carbonization temperature. In some embodiments, the carbonization operation may be performed on the substrate by introducing propane and hydrogen under a second condition. In some embodiments, the second condition may include the pressure being in the fourth pressure range and the temperature being in the fifth temperature range.

In some embodiments, the fifth temperature range may be within a range of 700° C. to 1100° C. In some embodiments, the fifth temperature range may be within a range of 800° C. to 1000° C. In some embodiments, the fifth temperature range may be within a range of 850° C. to 980° C. In some embodiments, the fifth temperature range may be within a range of 900° C. to 950° C. In some embodiments, the fourth pressure range may be less than $5\times10^{-5}$ Pa. In some embodiments, the fourth pressure range may be less than $1\times10^{-5}$ Pa. In some embodiments, the fourth pressure range may be less than $0.5\times10^{-5}$ Pa. In some embodiments, the fourth pressure range may be less than $10^{-6}$ Pa. After the substrate is conveyed to the carbonization chamber, the gas in the carbonization chamber can be discharged by cooling the carbonization chamber to the fifth temperature range and vacuumizing the carbonization chamber to the fourth pressure range.

In some embodiments, the third pressure range may be within a range of $1\times10^3$ Pa to $1\times10^5$ Pa. In some embodiments, the third pressure range may be within a range of $1\times10^3$ Pa to $6\times10^4$ Pa. In some embodiments, the third pressure range may be within a range of $2\times10^3$ Pa to $6\times10^3$ Pa. In some embodiments, the fourth temperature range may be within a range of 1000° C. to 1500° C. In some embodiments, the fourth temperature range may be within a range of 1100° C. to 1400° C. In some embodiments, the fourth temperature range may be within a range of 1200° C. to 1350° C. In some embodiments, the fourth temperature range may be within a range of 1250° C. to 1300° C. In some embodiments, the fourth time period may be at least 0.5 minutes. In some embodiments, the fourth time period may be within a range of 0.5 minutes to 5 minutes. In some embodiments, the fourth time period may be within a range of 1 minute to 3 minutes. In some embodiments, the fourth time period may be within a range of 1.5 minutes to 2.5 minutes. In some embodiments, the fourth time period may be 2 minutes. In some embodiments, a flow rate of propane ($C_3H_8$) may be within a range of 3 standard cubic centimeter per minute (sccm) to 25 sccm. In some embodiments, the flow rate of propane ($C_3H_8$) may be within a range of 5 sccm to 20 sccm. In some embodiments, the flow rate of propane ($C_3H_8$) may be within a range of 7 sccm to 18 sccm. In some embodiments, the flow rate of propane ($C_3H_8$) may be within a range of 10 sccm to 15 sccm. In some embodiments, a flow rate of hydrogen may be within a range of 0.5 L/min to 25 L/min. In some embodiments, the flow rate of hydrogen may be within a range of 1 L/min to 20 L/min. In some embodiments, the flow rate of hydrogen may be within a range of 5 L/min to 15 L/min. In some embodiments, the flow rate of hydrogen may be within a range of 7 L/min to 12 L/min.

In some embodiments, the control module 101 may control the carbonization chamber to be cooled to the fifth temperature range and to be vacuumized to the fourth pressure range; propane and hydrogen may be introduced to cause the pressure of the carbonization chamber to the third pressure range simultaneously; the temperature of the carbonization chamber may be increased to the fourth temperature range. The carbonization operation may be performed on substrate by maintaining constant temperature and constant pressure for the fourth time period.

Figure 15:
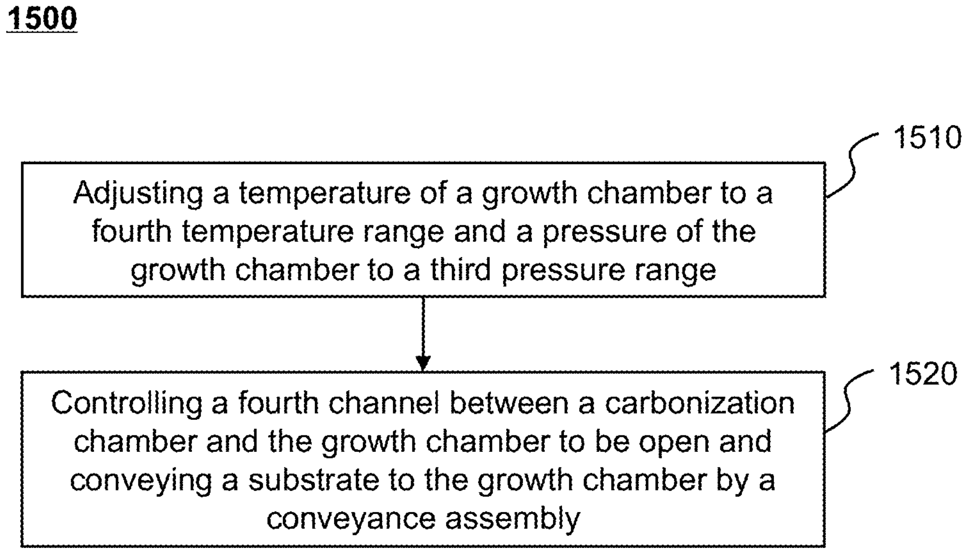
FIG. 15 is a flowchart illustrating an exemplary process for conveying a substrate from a carbonization chamber to a growth chamber according to some embodiments of the present disclosure.

FIG. 15 is a flowchart illustrating an exemplary process for conveying a substrate from a carbonization chamber to a growth chamber according to some embodiments of the present disclosure. In some embodiments, after an in-situ etching operation is completed, a substrate may be conveyed to a growth chamber and a silicon carbide crystal may be grown on a crystal growth surface of the substrate.

In some embodiments, a process 1500 for conveying the substrate from the carbonization chamber to the growth chamber may be executed by a control device (e.g., the control module 101). For example, the process 1500 may be stored in a storage device in the form of programs or instructions. When the control module 101 executes the programs or instructions, the process 1500 may be implemented. In some embodiments, the process 1500 may be accomplished with one or more additional operations not described, and/or without one or more of the operations discussed. Additionally, the order in which the operations of the process 1500 as illustrated in FIG. 15 and described below is not intended to be limiting. The process 1500 for conveying the substrate from the carbonization chamber to the growth chamber may include the following operations.

In 1510, a temperature of the growth chamber may be adjusted to a fourth temperature range and a pressure of the growth chamber may be adjusted to a third pressure range.

In some embodiments, the growth chamber may be heated to the fourth temperature range by a heating body in the growth chamber. More descriptions regarding the heating body and the fourth temperature range may be found elsewhere in the disclosure. In some embodiments, the control module 101 may control the heating module 103 (e.g., the heating body) to increase the temperature of the growth chamber to the fourth temperature range. In some embodiments, the control module 101 may control a vacuum device to vacuumize the growth chamber to adjust the pressure of the growth chamber to the third pressure range. More descriptions regarding the third pressure range may be found elsewhere in the disclosure (e.g., FIG. 14 and the descriptions thereof).

When the growth chamber is heated to a temperature equal to or close to the temperature of the carbonization chamber (a temperature difference may be less than or equal to 5° C.) and vacuumized to a pressure equal to or close to the pressure of the carbonization chamber (a pressure difference does not exceed 10 Pa), the substrate may be conveyed to the growth chamber to avoid a deformation or denaturation of the substrate due to a sudden temperature change or a sudden pressure change.

In 1520, a fourth channel between the carbonization chamber and the growth chamber may be controlled to be open and the substrate may be conveyed to the growth chamber by the conveyance assembly.

In some embodiments, when the temperatures of both the growth chamber and the carbonization chamber are in the fourth temperature range and the pressures of the growth chamber and the carbonization chamber are in the third pressure range, the substrate may be conveyed to the growth chamber. In some embodiments, when the temperature of the growth chamber reaches the fourth temperature range and the pressure of the growth chamber reaches the third pressure range, the control module 101 may control the fourth channel between the growth chamber and the carbonization chamber to be open and control the conveyance assembly (e.g., the conveyance assembly 208) to convey the substrate to a specific position in the growth chamber. Then the fourth channel may be closed and the conveyance assembly may be stopped. The fourth channel refers to a channel adjacent to the growth chamber and the carbonization chamber. For example, the fourth channel may include the outlet channel 502 of the carbonization chamber or the inlet channel 601 of the growth chamber. In some embodiments, the outlet channel 502 of the carbonization chamber and the inlet channel 601 of the growth chamber may be a same channel. In some embodiments, the specific position in the growth chamber may be right above the rotation shaft 606 at a bottom portion of the growth chamber.

In some embodiments, a position of the substrate may be detected by the detection module 102 (e.g., a positioner) and position information of the substrate may be transmitted to the control module 101. The control module 101 may control the mechanical structure 111 (e.g., the conveyance assembly 208) to stop operation.

In some embodiments, when the positioner determines that the substrate is at a preset position of the growth chamber, the position information of the substrate may be transmitted to the control module 101. The control module 101 may control the mechanical structure 111 (e.g., the conveyance assembly 208) to stop operation. In some embodiments, the preset position of the growth chamber may be right above the rotation shaft 606. In some embodiments, the positioner may be disposed on the rotation shaft 606. In some embodiments, the control module 101 may control the rotation shaft 606 to rise to jack the substrate up to a middle portion of the growth chamber. In some embodiments, the rotation shaft 606 may drive the substrate to rotate clockwise or counterclockwise. In some embodiments, a rotation speed of the rotation shaft 606 may be adjustable.

Figure 16:
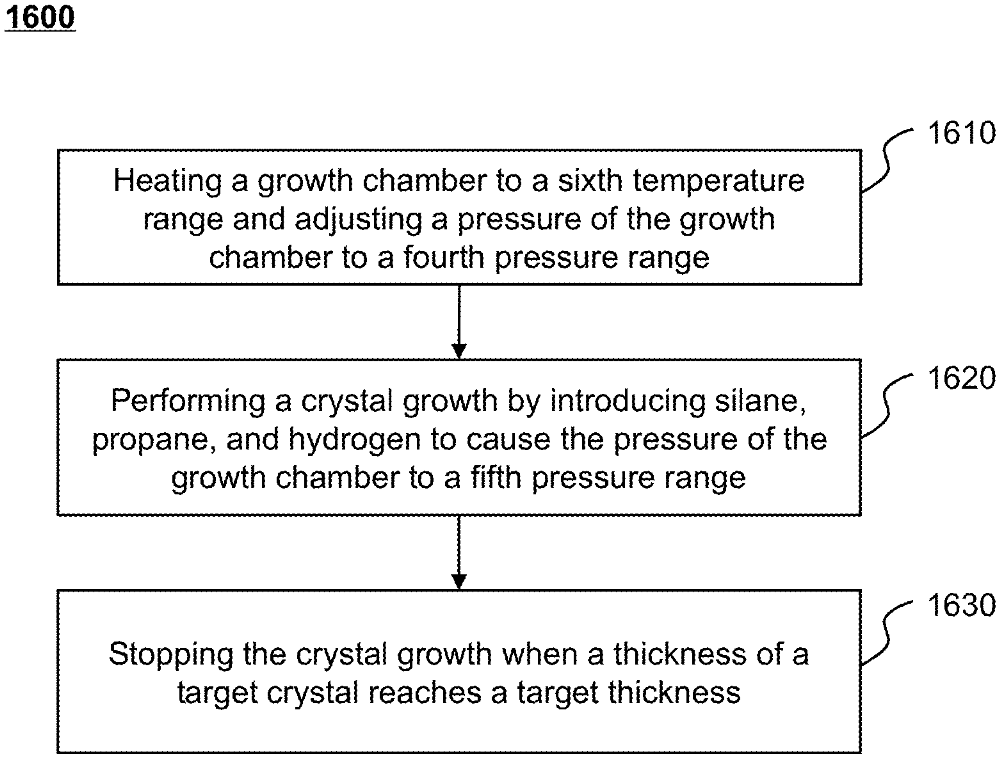
FIG. 16 is a flowchart illustrating an exemplary process for crystal growth according to some embodiments of the present disclosure.

FIG. 16 is a flowchart illustrating an exemplary process for crystal growth according to some embodiments of the present disclosure.

In some embodiments, a composite crystal including the substrate and a silicon carbide crystal may be obtained by performing a crystal growth through vapor deposition on a crystal growth surface of a substrate in a growth chamber. More descriptions regarding the crystal growth in the growth chamber may be found elsewhere in the present disclosure (e.g., FIGS. 2A-2B, 3A-3B, 6, and the descriptions thereof).

In some embodiments, a process 1600 for crystal growth may be executed by a control device (e.g., the control module 101). For example, the process 1600 may be stored in a storage device in the form of programs or instructions. When the control module 101 executes the programs or instructions, the process 1600 may be implemented. In some embodiments, the process 1600 may be accomplished with one or more additional operations not described, and/or without one or more of the operations discussed. Additionally, the order in which the operations of the process 1600 as illustrated in FIG. 16 and described below is not intended to be limiting. The process 1600 for the crystal growth may include the following operations.

In 1610, the growth chamber may be heated to a sixth temperature range and a pressure of the growth chamber may be adjusted to a fourth pressure range.

In some embodiments, a target crystal (e.g., the silicon carbide crystal) may be grown by introducing silane, propane, and hydrogen under a third condition and performing a crystal growth on the substrate by vapor deposition. In some embodiments, the third condition may include a pressure being in the fourth pressure range and a temperature being in the sixth temperature range. The sixth temperature range may be varied according to a type of crystal to be grown. In some embodiments, the sixth temperature range may be within a range of 1300° C. to 1750° C. In some embodiments, the sixth temperature range may be within a range of 1400° C. to 1700° C. In some embodiments, the sixth temperature range may be within a range of 1450° C. to 1650° C. In some embodiments, the sixth temperature range may be within a range of 1500° C. to 1600° C. In some embodiments, the sixth temperature range may be within a range of 1520° C. to 1570° C. In some embodiments, the sixth temperature range may be maintained constant throughout the whole growth process. Alternatively, the sixth temperature range may be adjusted according to different stages of the crystal growth.

In some embodiments, the control module 101 may control the heating module 103 (e.g., a heating body in the growth chamber) to heat the growth chamber to the sixth temperature range. More descriptions regarding the heating body may be found elsewhere in the present disclosure.

In some embodiments, the growth chamber may be vacuumized to the fourth pressure range by a vacuum device (e.g., a vacuum pump). More descriptions regarding the fourth pressure range may be found elsewhere in the present disclosure (e.g., FIG. 14 and the descriptions thereof).

In 1620, the crystal growth may be performed by introducing silane, propane, and hydrogen to cause the pressure of the growth chamber to the fifth pressure range.

The fifth pressure range may be varied according to a type of crystal to be grown. For a specific crystal (e.g., the silicon carbide crystal), if the fifth pressure range is too small, a crystal growth rate may be low; whereas, if the fifth pressure range is too large, defect(s) may occur during the crystal growth. In some embodiments, the fifth pressure range may be within a range of 20 Pa to 100 Pa. In some embodiments, the fifth pressure range may be within a range of 30 Pa to 90 Pa. In some embodiments, the fifth pressure range may be within a range of 40 Pa to 80 Pa. In some embodiments, the fifth pressure range may be within a range of 50 Pa to 70 Pa. In some embodiments, the fifth pressure range may be within a range of 55 Pa to 65 Pa. In some embodiments, the fifth pressure range may be maintained constant throughout the whole growth process. Alternatively, the fifth pressure range may be adjusted according to different stages of the crystal growth process.

In some embodiments, a flow rate of silane ($SiH_4$) may be within a range of 300 sccm to 800 sccm. In some embodiments, the flow rate of silane ($SiH_4$) may be within a range of 400 sccm to 600 sccm. In some embodiments, the flow rate of the silane ($SiH_4$) may be within a range of 450 sccm to 550 sccm. In some embodiments, the flow rate of the silane ($SiH_4$) may be within a range of 480 sccm to 520 sccm. In some embodiments, a flow rate of propane ($C_3H_8$) may be within a range of 100 sccm to 250 sccm. In some embodiments, the flow rate of propane ($C_3H_8$) may be within a range of 133 sccm to 200 sccm. In some embodiments, the flow rate of propane ($C_3H_8$) may be within a range of 150 sccm to 180 sccm. In some embodiments, the flow rate of propane ($C_3H_8$) may be within a range of 160 sccm to 170 sccm. In some embodiments, a flow rate of hydrogen ($H_2$) may be within a range of 10 L/min to 90 L/min. In some embodiments, the flow rate of hydrogen ($H_2$) may be within a range of 20 L/min to 80 L/min. In some embodiments, the flow rate of hydrogen ($H_2$) may be within a range of 30 L/min to 70 L/min. In some embodiments, the flow rate of hydrogen ($H_2$) may be within a range of 40 L/min to 60 L/min.

In some embodiments, the control module 101 may control the flow rates of silane, propane, and hydrogen into the growth chamber respectively to cause the pressure of the growth chamber to the fifth pressure range. In the growth chamber, the crystal growth may be performed on the substrate under a condition of the sixth temperature range, the fifth pressure range, and reactants (silane, propane, and hydrogen).

In 1630, the crystal growth may be stopped when a thickness of the target crystal reaches a target thickness.

In some embodiments, the target thickness may be within a range of 200 microns to 600 microns. In some embodiments, the target thickness may be within a range of 300 microns to 500 microns. In some embodiments, the target thickness may be within a range of 320 microns to 480 microns. In some embodiments, the target thickness may be within a range of 350 microns to 450 microns. In some embodiments, the target thickness may be within a range of 380 microns to 420 microns. In some embodiments, the target thickness may be within a range of 390 microns to 410 microns. By setting the target thickness to a range of 200 microns to 600 microns, a wafer with a specified thickness can be directly obtained by polishing without processing operations such as cutting, which can improve production efficiency, save processing costs, and is convenient for industrial applications.

In some embodiments, the thickness of the crystal growth may be monitored in the crystal growth. The temperature of the growth chamber, the pressure of the growth chamber, and a ratio of the flow rates of silane, propane, and hydrogen may be controlled according to parameters such as a crystal growth speed, a crystal growth thickness, etc. In some embodiments, the thickness of the crystal growth may be monitored using a reflective high energy electron diffraction (RHEED) device. In some embodiments, the temperature of the growth chamber may be adjusted by adjusting a heating power of the heating body. In some embodiments, a ratio of a silicon source and a carbon source may be adjusted by adjusting the flow rates of silane and propane respectively. In some embodiments, the pressure of the growth chamber may be adjusted by adjusting the flow rates of the silane, propane, and hydrogen.

In some embodiments, when the thickness of the crystal growth reaches the target thickness, the control module 101 may control to stop the crystal growth. In some embodiments, the control module 101 may control to stop the introduction of silane, propane, and hydrogen, and control the heating body to stop heating the growth chamber.

Figure 17:
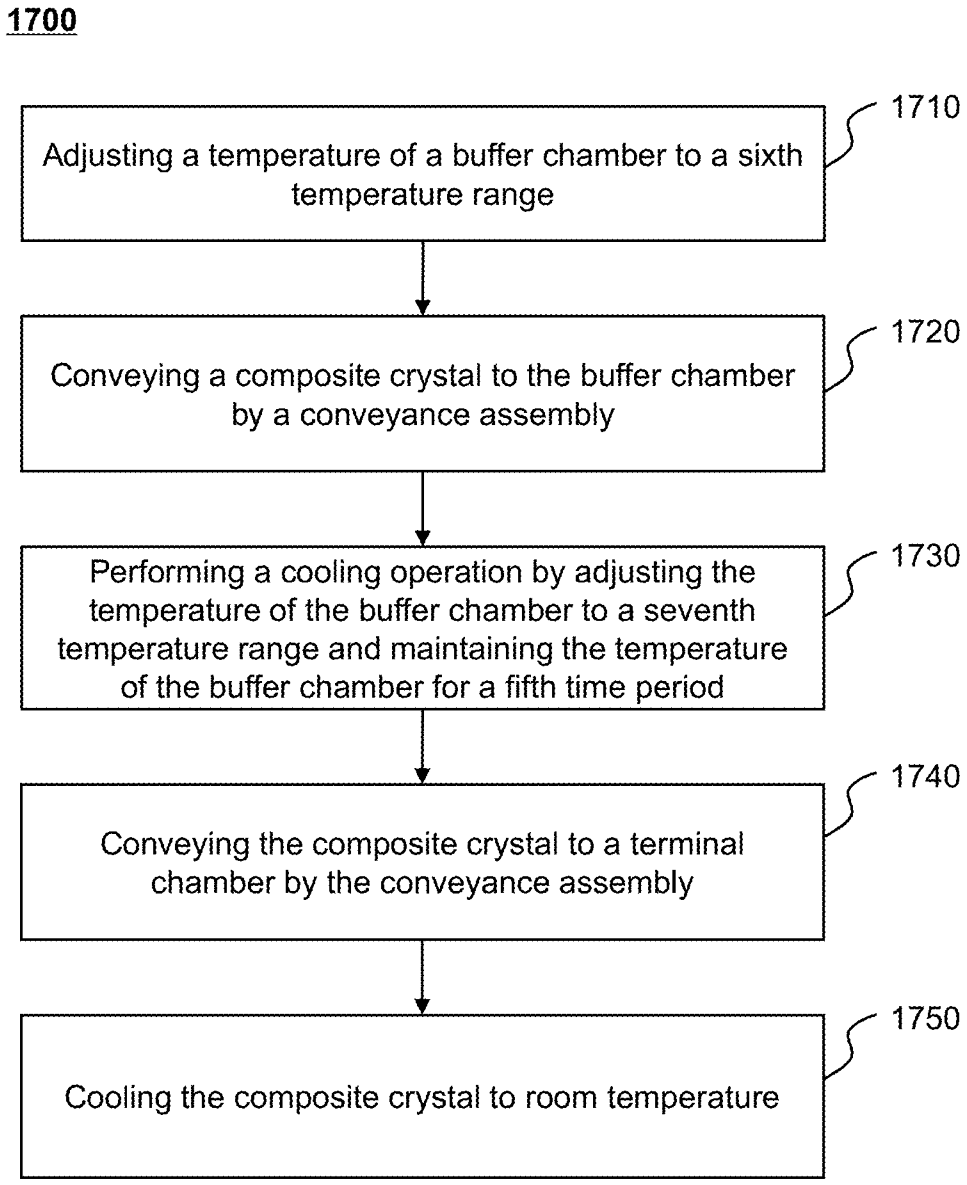
FIG. 17 is a flowchart illustrating an exemplary process for performing a buffering operation and a cooling operation according to some embodiments of the present disclosure.

FIG. 17 is a flowchart illustrating an exemplary process for performing a buffering operation and a cooling operation according to some embodiments of the present disclosure.

In some embodiments, a buffer chamber and a terminal chamber may be disposed adjacent to a growth chamber to perform subsequent operations (e.g., cooling a produced composite crystal) after crystal growth. The composite crystal may be conveyed from the growth chamber to the buffer chamber by the conveyance assembly to cool to a certain temperature. Then the composite crystal may be conveyed to the terminal chamber to cool to room temperature. The composite crystal may be cooled to a seventh temperature range (500° C. to 1200° C.) in the buffer chamber and then conveyed to the terminal chamber to cool to room temperature, which can avoid cracking of the composite crystal caused by a sudden drop of ambient temperature (if directly conveying the composite crystal from the growth chamber to the terminal chamber).

In some embodiments, a process 1700 for performing a buffering operation and a cooling operation may be executed by a control device (e.g., the control module 101). For example, the process 1700 may be stored in a storage device in the form of programs or instructions. When the control module 101 executes the programs or instructions, the process 1700 may be implemented. In some embodiments, the process 1700 may be accomplished with one or more additional operations not described, and/or without one or more of the operations discussed. Additionally, the order in which the operations of the process 1700 as illustrated in FIG. 17 and described below is not intended to be limiting.

In 1710, a temperature of the buffer chamber may be adjusted to a sixth temperature range.

In some embodiments, the buffer chamber may be heated to the sixth temperature range by a heating body in the buffer chamber. In some embodiments, the control module 101 may control the heating module 103 (e.g., the heating body) to increase the temperature of the buffer chamber to the sixth temperature range. More descriptions regarding the heating body and the sixth temperature range may be found elsewhere in the present disclosure.

The temperature of the buffer chamber may be adjusted to be equal to or close to the temperature of the growth chamber (a temperature difference between the buffer chamber and the growth chamber may be less than or equal to 5° C.) to avoid a sudden temperature change due to an excessive temperature difference between the buffer chamber and the growth chamber, which may result in a deformation or denaturation of the composite crystal.

In 1720, the composite crystal may be conveyed to the buffer chamber by the conveyance assembly.

In some embodiments, when the temperature of the buffer chamber reaches the sixth temperature range, a fifth channel between the growth chamber and the buffer chamber may be opened and the conveyance assembly (e.g., conveyance assembly 208) may be initiated to convey the composite crystal to a specific position in the buffer chamber. Then the fifth channel may be closed and the conveyance assembly may be stopped. The fifth channel refers to a channel adjacent to the growth chamber and the buffer chamber. For example, the fifth channel may include the outlet channel 602 of the growth chamber or the inlet channel 501 of the buffer chamber. In some embodiments, the inlet channel 602 of the growth chamber and the inlet channel 501 of the buffer chamber may be a same channel. In some embodiments, the specific position in the buffer chamber may be a central region of a bottom portion of the buffer chamber. In some embodiments, a position of the substrate may be detected by the detection module 102 (e.g., a sensor). In some embodiments, when the sensor detects that the substrate is in the central region of the bottom portion of the buffer chamber, position information of the substrate may be transmitted to the control module 101. The control module 101 may control the mechanical structure 111 (e.g., the conveyance assembly 208) to stop operation.

In 1730, the cooling operation may be performed by adjusting the temperature of the buffer chamber to a seventh temperature range and maintaining the temperature of the buffer chamber for a fifth time period.

In some embodiments, the seventh temperature range may be within a range of 500° C. to 1200° C. In some embodiments, the seventh temperature range may be within a range of 550° C. to 1000° C. In some embodiments, the seventh temperature range may be within a range of 600° C. to 800° C. In some embodiments, the seventh temperature range may be within a range of 650° C. to 750° C. In some embodiments, the seventh temperature range may be within a range of 680° C. to 720° C. In some embodiments, the fifth time period may be at least 1 hour. In some embodiments, the fifth time period may be within a range of 1 hour to 7 hours. In some embodiments, the fifth time period may be within a range of 2 hours to 6 hours. In some embodiments, the fifth time period may be within a range of 2.5 hours to 5.5 hours. In some embodiments, the fifth time period may be within a range of 3 hours to 5 hours. In some embodiments, the fifth time period may be within a range of 3.5 hours to 4.5 hours.

In some embodiments, the control module 101 may control the buffer chamber to be gradually cooled to the seventh temperature range. In some embodiments, the control module 101 may control a valve on the air inlet pipeline 504 to open and introduce a replacement gas (e.g., hydrogen, nitrogen, argon, or helium) into the buffer chamber through the air inlet pipeline 504. At the same time, a vacuum device may also be controlled to vacuumize the gas from the buffer chamber to maintain the pressure of the buffer chamber close to an atmospheric pressure. In some embodiments, when the temperature of the buffer chamber reaches the seventh temperature range, the control module 101 may control the temperature of the buffer chamber to be maintained in the seventh temperature range for the fifth time period, so that a temperature of an assembly or the composite crystal in the buffer chamber may be maintained in the seventh temperature range.

In 1740, the composite crystal may be conveyed to the terminal chamber by the conveyance assembly.

In some embodiments, the composite crystal may be conveyed to the terminal chamber for further cooling. In some embodiments, a temperature of the terminal chamber may be the room temperature. In some embodiments, the control module 101 may control a sixth channel between the buffer chamber and the terminal chamber to be open and control the conveyance assembly (e.g., conveyance assembly 208) to convey the composite crystal to a specific position in the terminal chamber. Then the sixth channel may be closed and the conveyance assembly may be stopped. The sixth channel refers to a channel adjacent to the buffer chamber and the terminal chamber. For example, the sixth channel may include the outlet channel 502 of the buffer chamber or the inlet channel 401 of the terminal chamber. In some embodiments, the outlet channel 502 of the buffer chamber and the inlet channel 401 of the terminal chamber may be a same channel. In some embodiments, the specific position in the buffer chamber may be a central region of a bottom portion or other designated regions of the buffer chamber. In some embodiments, a position of the composite crystal may be detected by the detection module 102 (e.g., a sensor). In some embodiments, when the sensor detects that the composite crystal is at the central region of the bottom portion or the other designated regions of the terminal chamber, position information of the composite crystal may be transmitted to the control module 101. The control module 101 may control the mechanical structure 111 (e.g., the conveyance assembly 208) to stop operation.

In 1750, the composite crystal may be cooled to the room temperature.

The composite crystal may continue to be cooled to the room temperature in the terminal chamber. In some embodiments, the composite crystal may be cooled to the room temperature by naturally cooling in the terminal chamber for 8 hours to 12 hours. In some embodiments, the composite crystal may be cooled by introducing a replacement gas into the terminal chamber. In some embodiments, an air inlet pipeline and an air outlet pipeline may be disposed on the terminal chamber. The control module 101 may control a valve on the air inlet pipeline to be open and introduce the replacement gas (e.g., hydrogen, nitrogen, argon, or helium) into the terminal chamber through the air inlet pipeline. At the same time, a vacuum device may also be controlled to vacuumize the gas from the terminal chamber to maintain a pressure of the terminal chamber close to the atmospheric pressure.

In some embodiments, after the composite crystal is cooled to the room temperature, the control module 101 may control the outlet channel 402 of the terminal chamber to be open and control the conveyance assembly 208 to convey the composite crystal to a vicinity of the outlet channel 402 of the terminal chamber. Then the composite crystal can be taken out manually or by a robotic arm. After the composite crystal is taken out, a chemical etching operation may be performed on the composite crystal to remove the substrate on the composite crystal to obtain a silicon carbide crystal. More descriptions regarding the chemical etching operation may be found elsewhere in the present disclosure (e.g., FIG. 9 and the descriptions thereof).

In some embodiments, the process 1700 may not include operations 1740 and 1750. That is, there is no terminal chamber in the multi-chamber growth device, and the composite crystal may be directly taken out from the buffer chamber and cooled in a natural environment.

The following is an embodiment of the present disclosure. A process for producing a silicon carbide crystal using a multi-chamber growth device includes the following operations.

(1) A polishing operation and a cleaning operation were performed. A circular single crystal silicon wafer with a crystal growth surface (111), a thickness within a range of 100 microns to 400 microns, and a diameter within a range of 1 inch to 10 inches was polished using a polisher. A surface ($\mathbf{11\bar{1}}$) opposite to the crystal growth surface (111) was polished to make the surface ($\mathbf{11\bar{1}}$) flat, and then the surface (111) was polished to remove cutting scratches and defects of the surface (111). The polished single crystal silicon wafer was ultrasonically cleaned with a cleaning solution (e.g., acetone, alcohol, deionized water) for 10 minutes to 20 minutes and then dried with high-purity nitrogen or helium. The single crystal silicon wafer was immersed in an HF solution with a mass fraction in a range of 1% to 3% for 5 minutes to 10 minutes and then cleaned with deionized water for 5 minutes to 10 minutes. Then the cleaned single crystal silicon wafer was dried with nitrogen or helium after cleaning.

(2) A vacuum operation was performed. At least one single crystal silicon wafer was placed and fixed at a position of a groove on a tray. The surface (111) of the single crystal silicon wafer was faced up. The tray was placed into a vacuum chamber. The vacuum chamber was vacuumized to 3 Pa to 15 Pa. In the meanwhile, an in-situ etching chamber was vacuumized to cause a pressure of the in-situ etching chamber be equal to or close to a pressure of the vacuum chamber (a difference did not exceed 5 Pa).

(3) An in situ etching operation was performed. The tray with the at least one single crystal silicon wafer was conveyed to the in-situ etching chamber. The in-situ etching chamber was further vacuumized to a range less than $5\times10^{-3}$ Pa, slowly heated to a range of 400° C. to 900° C., and then the temperature was maintained for 10 minutes to 90 minutes for removing gas at a high temperature. Then hydrogen was introduced into the in-situ etching chamber to adjust a pressure of the in-situ etching chamber to an atmospheric pressure. The in-situ etching chamber was heated to a range of 1000° C. to 1200° C. The in situ etching operation was performed by maintaining the atmospheric pressure and the temperature for 1 minute to 3 minutes to remove defects on the crystal growth surface (i.e., the surface (111)).

(4) A carbonization operation was performed. The tray with the at least one single crystal silicon wafer was conveyed to a carbonization chamber. A carbonization operation was performed on the crystal growth surface to produce a carbonization buffer layer. A temperature of the carbonization chamber was cooled to a range of 800° C. to 1000° C. and the carbonization chamber was vacuumized. After a pressure of the carbonization chamber reached to a range less than $1\times10^{-5}$ Pa, the carbonization chamber was heated, and propane ($C_3H_8$) with a flow rate of a range of 5 sccm to 20 sccm and hydrogen with a flow rate of a range of 1 L/min to 20 L/min were introduced into the carbonization chamber to maintain the pressure of the carbonization chamber in a range of $1\times10^{3}$ Pa to $6\times10^{4}$ Pa. The carbonization chamber was heated to a range of 1100° C. to 1400° C. and the temperature was maintained for 1 minutes to 3 minutes. In the meanwhile, a temperature of a growth chamber was adjusted to a range of 1100° C. to 1400° C.

(5) A crystal growth operation was performed. The tray with the at least one single crystal silicon wafer was conveyed to the growth chamber. The temperature of the growth chamber was adjusted to a range of 1400° C. to 1700° C. $SiH_4$ with a flow rate of a range of 400 sccm to 600 sccm, $C_3H_8$ with a flow rate of a range of 133 sccm to 200 sccm, and $H_2$ with a flow rate of a range of 20 L/min to 80 L/min were introduced into the growth chamber. A pressure of the growth chamber was maintained in a range of 30 Pa to 90 Pa for the crystal growth in the growth chamber. In the meanwhile, a temperature of a buffer chamber was adjusted to a range of 1400° C. to 1700° C. After the crystal growth operation was executed for 10 hours to 12 hours, the tray was conveyed to the buffer chamber.

(6) A cooling operation was performed. After the tray was conveyed to the buffer chamber, the temperature of the buffer chamber was cooled to a range of 500° C. to 1200° C. for 2 hours to 6 hours. Then the tray was conveyed to a terminal chamber and cooled to room temperature for 8 hours to 12 hours. A composite crystal was taken out.

(7) A chemical etching operation was performed. After the composite crystal was taken out, a chemically etched silicon carbide crystal was obtained by rapidly etching the composite crystal for 50 minutes to 80 minutes by ultrasonically cleaning using a NaOH solution with a mass fraction in a range of 10% to 25% under a temperature of 65° C. to 80° C.

(8) A cleaning operation was performed. A silicon carbide crystal was obtained by placing the silicon carbide crystal into a cleaning solution (e.g., isopropyl alcohol), ultrasonically cleaning for 3 minutes to 10 minutes under a temperature of 50° C. to 80° C., and then ultrasonically cleaning for 3 minutes to 10 minutes using deionized water.

(9) A test was performed. According to the test, a thickness of the produced silicon carbide crystal was in a range of 300 microns to 500 microns, no obvious warp occurred on the silicon carbide crystal, and the surface of the silicon carbide crystal was smooth.

It should be noted that the above description of the method for producing the silicon carbide crystals is intended to be convenient, and the present disclosure may not be limited to the scope of the description. It may be understood that after understanding the principle of the disclosure, those skilled in the art may make various modifications and changes in the form and details of the implementation of the above processes and systems, devices, and devices without departing from the principle. However, these changes and modifications may not depart from the scope of the present disclosure.

The possible beneficial effects of the embodiments of the present disclosure may include, but not be limited to, the following. (1) By using a multi-chamber growth device for crystal production, at least one substrate or a composite crystal may be conveyed between chambers, and different operations may be performed independently in the chambers, thereby realizing a mass production of crystals in an assembly line manner. (2) During a growth process, a thickness of a target crystal may be monitored to produce the target crystal with a target thickness, so that a product of a single target wafer can be obtained after a chemical etching operation is performed. Accordingly, no cutting is needed, a crystal production cycle is short, a processing cost is low, and the production efficiency is high. (3) The composite crystal can be obtained by growing a target crystal on a substrate by vapor deposition using single crystal silicon as the substrate, then the composite crystal may be chemically etched using an acidic solution or an alkali solution used in other processes (e.g., photovoltaic or semiconductor device production processes) to remove the substrate, which can save production costs, realize resource recycle, and is environment friendly.

It should be noted that different embodiments may have different beneficial effects. In different embodiments, the possible beneficial effects may be any one of the above effects, or any combination thereof, or any other beneficial effects that may be obtained.

Figure 18:
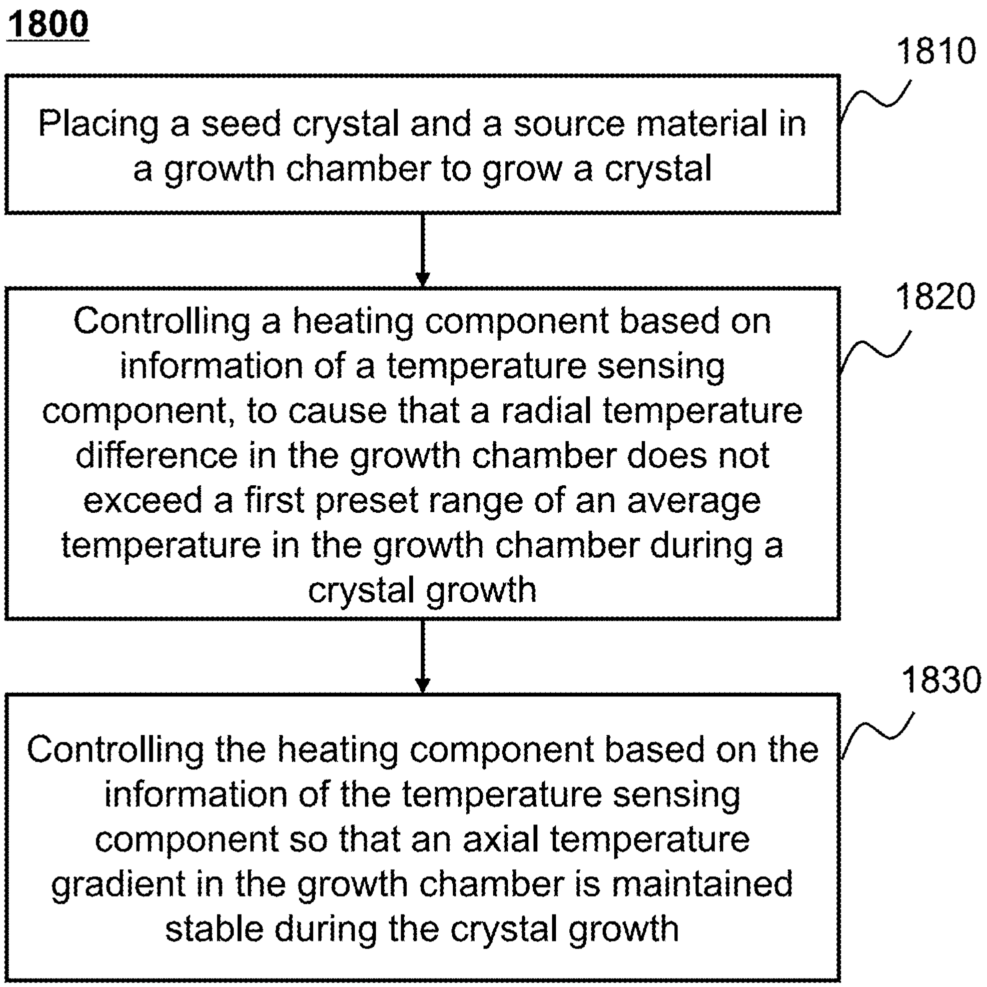
FIG. 18 is a flowchart illustrating an exemplary process for crystal growth according to some embodiments of the present disclosure.
Figure 19:
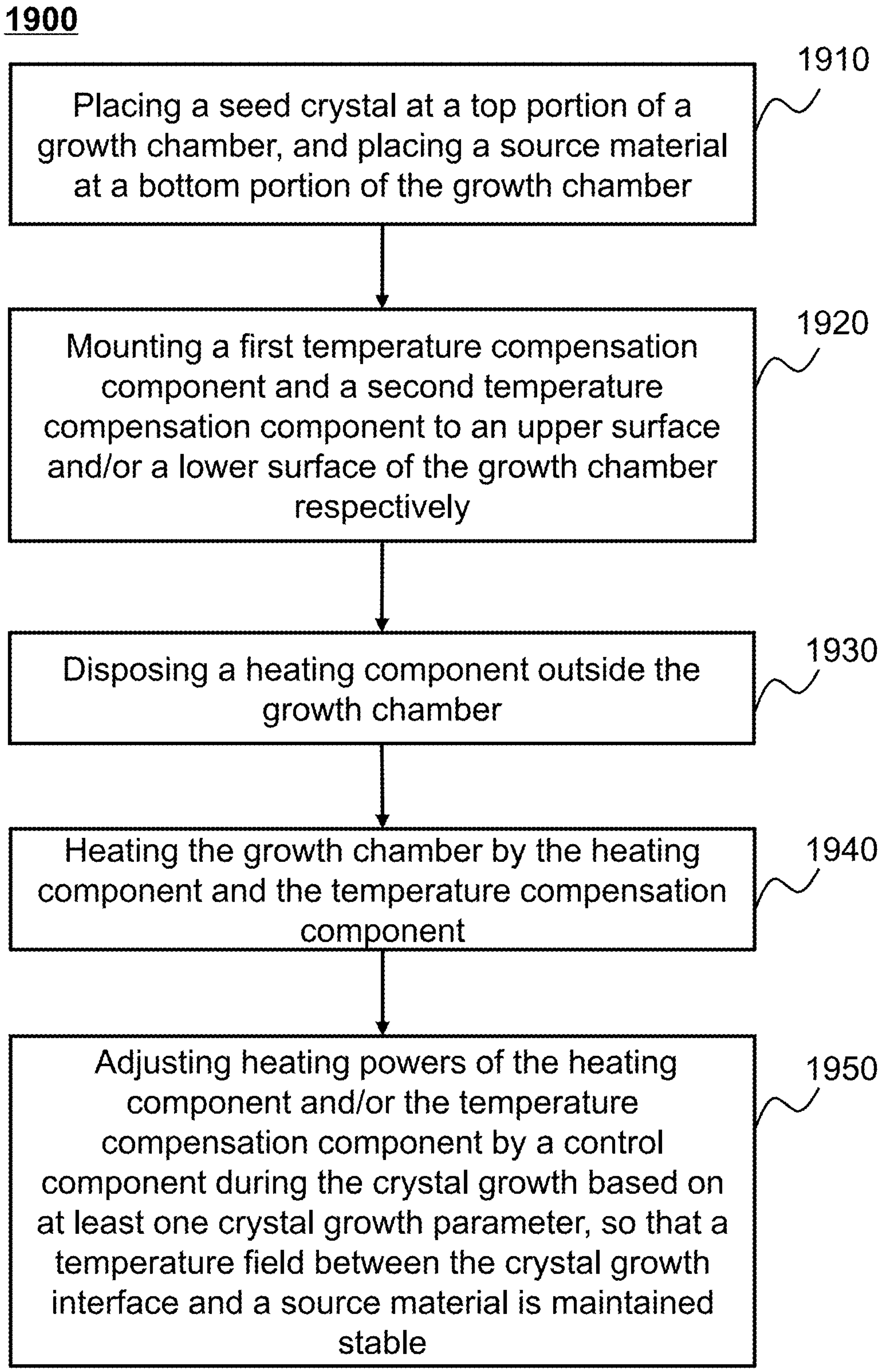
FIG. 19 is a flowchart illustrating an exemplary process for crystal growth according to some embodiments of the present disclosure.

In a series of separate embodiments, certain crystal growth processes are herein presented as descriptions for FIGS. 18-19.

FIG. 18 is a flowchart illustrating an exemplary process for crystal growth according to some embodiments of the present disclosure.

In 1810, a seed crystal and a source material may be placed in a growth chamber to grow a crystal.

The seed crystal may refer to a small crystal including a crystal orientation the same as that of a crystal to be grown. The seed crystal may be used as a seed of the crystal growth. In some embodiments, the seed crystal may be prepared based on physical vapor transport (PVT), chemical vapor deposition (CVD), a Czochralski technique, etc. In some embodiments, the seed crystal may be prepared at least by splicing processing and a gap growth. In some embodiments, the seed crystal may be fixed in an inner side surface of a growth chamber cover.

The source material may include a material supplied for the seed crystal to grow into a crystal. In some embodiments, a component of a source material of a silicon carbide crystal may include SiC. In some embodiments, a component of a source material of an aluminum nitride crystal may include AlN. In some embodiments, the source material may include a powder material, a particulate material, and/or a block material. In some embodiments, a shape of the block material may include a square, a rectangle, an irregular block, etc. In some embodiments, the source material may be placed within a growth chamber body. The source material may be placed at a lower portion of the growth chamber body. The source material may be placed on an upper surface of the at least one heating unit inside a growth chamber.

In some embodiments, a mounting position of the temperature sensing component may be determined based on a position of a temperature distribution of the growth chamber to be measured. In some embodiments, the temperature sensing component may be located on the upper surface of the growth chamber for measuring a temperature distribution of a lower surface or a crystal growth surface of the seed crystal. In some embodiments, the temperature sensing component may be located at a lower surface of the growth chamber for measuring a temperature distribution of an upper surface of the source material. In some embodiments, the temperature sensing component may also be located on an outer wall of the growth chamber for measuring a temperature distribution of a peripheral area of the growth chamber.

In 1820, the heating component may be controlled based on information of the temperature sensing component, to cause that a radial temperature difference in the growth chamber does not exceed a first preset range of an average temperature in the growth chamber during the crystal growth.

In some embodiments, the average temperature in the growth chamber may include an average temperature of the lower surface of the seed crystal or the crystal being grown in the growth chamber, an average temperature of the upper surface of the source material in the growth chamber, etc. In some embodiments, the average temperature in the growth chamber may also include a crystal growth temperature. In some embodiments, the control component may be configured to control at least one parameter of the at least one heating unit in the heating component based on the temperature distribution in the growth chamber during the crystal growth, to cause that the radial temperature difference in the growth chamber does not exceed the first preset range of the average temperature in the growth chamber or the radial temperature difference threshold during the crystal growth. In some embodiments, a temperature sensing component may measure the temperature information in the chamber and transmit the measured temperature information to a control component. The control component may generate a radial temperature difference distribution and/or a radial temperature gradient distribution based on the temperature information measured by the temperature sensing component. The control component may also be configured to determine the first preset range, the preset radial temperature difference threshold, and/or the preset radial temperature gradient threshold based on a size of the growth chamber, a shape of the growth chamber, a material of the growth chamber, a size of the seed crystal, a type of the crystal to be grown, a size of the crystal to be grown, etc. The control component may further compare the radial temperature difference in the radial temperature difference distribution with the preset radial temperature difference threshold, or compare the radial temperature gradient in the radial temperature gradient distribution with the preset radial temperature gradient. If the radial temperature difference is larger than the preset radial temperature difference threshold, or the radial temperature gradient is larger than the preset radial temperature gradient threshold, in some embodiments, the control component may increase a heating power of the at least one heating unit arranged in the central area of the growth chamber. In some embodiments, when a temperature in a central region of the growth chamber is higher than a temperature in a peripheral region of the growth chamber, a current passing through at least one conduction electrode in a central region of the heating unit may be decreased or a current passing through at least one conduction electrode in an edge region of the heating unit may be increased. In some embodiments, when the temperature in the central region of the growth chamber is lower than the temperature in the peripheral region of the growth chamber, the current passing through the at least one conduction electrode in the central region of the heating unit may be increased or the current passing through the at least one conduction electrode in the edge region of the heating unit may be decreased to reduce the radial temperature difference and/or the radial temperature gradient until the radial temperature difference does not exceed the first preset range of the average temperature in the growth chamber or the preset radial temperature difference threshold and the radial temperature gradient does not exceed the preset radial temperature gradient threshold. More descriptions regarding a control process of a temperature control system may be found elsewhere in the present disclosure, which may not be described herein.

In 1830, during the crystal growth, the heating component may be controlled based on the information of the temperature sensing component so that an axial temperature gradient in the growth chamber is maintained stable.

In some embodiments, the control component may also control the at least one parameter of the at least one heating unit in the heating component based on the temperature distribution in the growth chamber during the crystal growth, so that the axial temperature gradient in the growth chamber is maintained stable during the crystal growth. In some embodiments, the control component may also control the at least one parameter of the at least one heating unit in the heating component based on the temperature distribution in the growth chamber during the crystal growth, so that the axial temperature gradient in the growth chamber is maintained in a preset axial temperature gradient range during the crystal growth. In some embodiments, the temperature sensing component may measure an axial temperature of the growth chamber and transmit the measured axial temperature to the control component. The control component may generate an axial temperature gradient distribution based on the axial temperature measured by the temperature sensing component. The control component may also be configured to determine the preset axial temperature gradient range based on the size of the growth chamber, the shape of the growth chamber, the material of the growth chamber, the size of the seed crystal, the type of the crystal to be grown, the size of the crystal to be grown, etc. The control component may further compare the axial temperature gradient in the axial temperature gradient distribution with the preset axial temperature gradient range. If the axial temperature gradient is less than the preset axial temperature gradient range, the control component may decrease a heating power of the at least one heating unit arranged in a periphery of the growth chamber close to the growth chamber cover to increase the axial temperature gradient until the axial temperature gradient is in the preset axial temperature gradient range. If the axial temperature gradient is larger than the preset axial temperature gradient range, the control component may increase the heating power of the at least one heating unit arranged in the periphery of the growth chamber close to the growth chamber cover to reduce the axial temperature gradient until the axial temperature gradient is in the preset axial temperature gradient range.

It should be noted that the above description of the process 1800 is merely provided for illustration, and not intended to limit the scope of the present disclosure. For persons having ordinary skills in the art, multiple variations and modifications may be made to the process 1800 under the teachings of the present disclosure. However, those variations and modifications do not depart from the scope of the present disclosure. For example, operation 1820 and operation 1830 may be performed synchronously.

Some embodiments also disclose a process for crystal growth. A semiconductor crystal may be prepared based on the process using a crystal preparation device. For convenience, the following may be described by taking preparing a silicon carbide single crystal as an example. The process may include the following operations.

In operation 1, a seed crystal may be bonded to an inner side surface of the growth chamber cover, and a source material may be placed into the growth chamber body. The growth chamber cover with the seed crystal bonded may be covered to the growth chamber body.

First, an adhesion agent may be uniformly covered on the inner side surface of the growth chamber cover, and then the growth chamber cover coated with the adhesion agent may be placed in a heating furnace. The growth chamber cover may be maintained for 5 hours in a temperature range of 150° C. to 180° C. The temperature may be increased to 200° C. and the temperature may be maintained for 7 hours to 10 hours. When the temperature is cooled to room temperature, the growth chamber cover may be taken out. The seed crystal may be then placed at a center of the inner side surface of the growth chamber cover, a silicon carbide single wafer may be placed on the seed crystal, and a stainless steel block may be placed on the silicon carbide single wafer. The growth chamber cover may be then placed in the heating furnace and maintained for 5 hours in a temperature range of 380° C. to 430° C. When the temperature is cooled to room temperature, the growth chamber cover may be taken out.

A direction of a growth surface of the seed crystal may be <0001> deflecting 4 degrees to 6 degrees pointing to a direction of $[11\bar{2}0]$. The adhesion agent may include epoxy resin, an AB glue, phenolic resin, a sugar glue, etc. In some embodiments, the adhesion agent may include a sucrose with a purity of 99.9%. The stainless steel block may be used to apply a certain pressure to the silicon carbide single wafer, the seed crystal, and the growth chamber cover to promote that the seed crystal is bonded to the inner side surface of the growth chamber cover. During the process for bonding and fixing the seed crystal, due to reasons such as the non-uniformity of the adhesion agent, a poor machining accuracy of the inner side surface of the growth chamber cover, etc., bubbles or voids may be caused between a rear surface of the seed crystal and the inner side surface of the growth chamber cover, further causing crystal defects. Therefore, when the seed crystal is placed at the center of the inner side surface of the growth chamber cover, it is necessary to avoid the occurrence of the bubbles or voids. In some embodiments, before the seed crystal is bonded to the inner side surface of the growth chamber cover, the seed crystal may be cleaned to remove contaminants on the surface of the seed crystal. In some embodiments, the seed crystal may be cleaned with deionized water, an organic solvent, etc.

Next, the source material (e.g., silicon carbide powder) may be placed in the growth chamber body and a distance between the upper surface of the source material and the crystal growth surface may be within a range of 30 millimeters to 50 millimeters. In some embodiments, the source material may be in a powder form. A particle diameter of the source material may be within a range of 30 microns to 50 microns. A surface of the source material placed in the growth chamber body may be maintained flat.

After the source material is placed into the growth chamber body, the growth chamber cover with the seed crystal bonded may be bonded to a top portion of the growth chamber body to form a closed space to facilitate the crystal growth.

In operation 2, the first heating component may be disposed outside the growth chamber.

The heating component may include the first heating component and the temperature compensation component.

The first heating component may include an induction coil. The first heating component may be located at the periphery of the growth chamber for providing at least a portion of heat required for the crystal growth. When the induction coil is energized, the growth chamber may be heated. The source material (e.g., the silicon carbide powder) may be heated and may be decomposed and sublimated to vapor components (e.g., $Si_2C$, $SiC_2$, Si) under a high temperature condition. The vapor components may be transported to the surface of the seed crystal with a relatively low temperature driven by the axial temperature gradient and may crystallize to form the crystal (e.g., the silicon carbide crystal). In some embodiments, the axial temperature gradient may be controlled by controlling heating powers of the induction coil at different positions in an axial direction.

If the growth chamber is only heated by the induction coil disposed in the periphery of the growth chamber, a region close to an inner wall of the growth chamber may be a high temperature region, and a region close to a center of the source material may be a low temperature region. Accordingly, the radial temperature gradient in the source material coverage region may be relatively large, which is not conducive to the sublimation of the source material and the stable growth of the crystal. In some embodiments, since the radial temperature gradient of the source material coverage region is large, a Si/C molar ratio of the vapor components of the sublimated source material may be relatively large in the high temperature region close to the inner wall of the growth chamber, and a Si/C molar ratio of the vapor components of the sublimated source material may be relatively small in the low temperature region close to the center of the source material coverage region, resulting in that a radial distribution of the Si/C molar ratio of the vapor component may be non-uniform, which is not conducive to the stable growth of the crystal. In addition, for the growth chamber cover, a region close to a periphery of the growth chamber cover may be a high temperature region, and a region close to a center of the growth chamber cover may be a low temperature region. Accordingly, the radial temperature gradient on the growth chamber cover may be relatively large, which causes a large thermal stress on the crystal growth surface, a severe convex of the crystal growth surface toward a direction of the source material, and defects on a fixing surface of the seed crystal. Therefore, a temperature compensation device may be disposed on the upper surface and/or the lower surface of the growth chamber to reduce the radial temperature gradient of the growth chamber cover and the radial temperature gradient in the source material coverage region. More descriptions regarding the radial temperature gradient may be found elsewhere in the present disclosure, which may not be described herein.

In operation 3, the temperature compensation component may be mounted to the upper surface and/or the lower surface of the growth chamber.

In some embodiments, the fixing frame including at least one fixing unit may be fixed to the upper surface or the lower surface of the growth chamber, and at least one heating unit of the temperature compensation component may be filled and fixed into the at least one fixing unit. An electrode fixing plate may be then covered, and at least one first electrode may be fixed to the at least one heating unit by causing the at least one first electrode to pass through at least one first holes on the electrode fixing plate. At least one second electrode may be fixed to the upper surface or the lower surface of the growth chamber by causing the at least one second electrode to pass through at least one second holes on the electrode fixing plate simultaneously. Further, upper ends of the at least one first electrode and the at least one second electrode may be connected to the copper wire respectively. The copper wire may be connected to a power source.

In some embodiments, a count, a size, a shape, an arrangement, etc. of the at least one heating unit may be determined based on a size of the upper surface or the lower surface of the growth chamber, a type of crystal to be grown, a size or the shape of the seed crystal, a temperature (the axial temperature gradient and/or the radial temperature gradient) distribution in the growth chamber, etc. In some embodiments, when a silicon carbide crystal with a size of 4 inches to 10 inches is to be grown, 10 to 20 heating units may be arranged on the upper surface of the growth chamber cover. In some embodiments, a thickness of the at least one heating unit may be within a range of 5 millimeters to 10 millimeters. In some embodiments, the thickness of the at least one heating unit may be within a range of 6 millimeters to 9 millimeters. In some embodiments, the thickness of the at least one heating unit may be within a range of 7 millimeters to 8 millimeters. Taking the shape of the heating unit being a hexagon as an example, a side length of the at least one heating unit may be within a range of 10 millimeters to 30 millimeters. In some embodiments, the side length of the at least one heating unit may be within a range of 12 millimeters to 28 millimeters. In some embodiments, the side length of the at least one heating unit may be within a range of 14 millimeters to 26 millimeters. In some embodiments, the side length of the at least one heating unit may be within a range of 16 millimeters to 24 millimeters. In some embodiments, the side length of the at least one heating unit may be within a range of 18 millimeters to 22 millimeters. In some embodiments, the side length of the at least one heating unit may be within a range of 20 millimeters to 21 millimeters.

In operation 4, at least one temperature sensing unit may be connected to the heating unit and a periphery of the upper surface or the lower surface of the growth chamber through at least two thermometer holes. The at least two thermometer holes may be located between adjacent first holes along the radial direction or within a setting range of at least one second hole.

In some embodiments, the at least one temperature sensing unit may measure a first temperature at the at least one heating unit and a second temperature at the periphery of the upper surface or the lower surface of the growth chamber through the at least two thermometer holes to obtain a temperature distribution on the periphery of the upper surface or the lower surface of the growth chamber.

In operation 5, an inert gas (e.g., argon) may be introduced into the growth chamber, a pressure may be controlled in a range of 5 Torr to 30 Torr, and the growth chamber may be heated by the first heating component and the temperature compensation component.

In operation 6, the first temperature at the at least one heating unit and the second temperature at the periphery of the upper surface or the lower surface of the growth chamber may be measured by the at least one temperature sensing unit, and a parameter (e.g., a count, a shape, a size, an arrangement, a current, a heating power) of the at least one heating unit may be adjusted based on the first temperature and the second temperature, thereby causing that the radial temperature gradient on the upper surface or the lower surface of the growth chamber does not exceed a preset radial temperature gradient threshold and a uniform crystal growth is promoted.

In some embodiments, during the crystal growth, a temperature of the growth chamber may be maintained within a range of 2200° C. to 2400° C. when the source material is sublimated, and a duration of the sublimation of the source material may be within a range of 40 hours to 60 hours. In some embodiments, during the crystal growth, a temperature of the growth chamber cover may be within a range of 2100° C. to 2350° C., and the first temperature at the at least one heating unit at the upper surface of the growth chamber may be less than the second temperature at the periphery of the growth chamber cover. A temperature difference between the first temperature and the second temperature may be maintained less than 10 K.

The above preparation process is merely provided for illustration purposes, process parameters involved in different embodiments may be the same or different. A sequence of the above operations may not be unique, and the sequence between the operations may be adjusted in different embodiments. One or more operations may be omitted. The above examples should not be intended to limit the scope of the present disclosure.

FIG. 19 is a flowchart illustrating an exemplary process for growing a crystal according to some embodiments of the present disclosure.

Some embodiments also disclose a process for crystal growth. A semiconductor crystal may be prepared based on the process using the crystal preparation device. For convenience, the following may be described by taking preparing a silicon carbide single crystal as an example. The process may include the following operations.

In 1910, a seed crystal may be placed at a top portion of a growth chamber, and the source material may be placed at a bottom portion of the growth chamber.

The seed crystal may be bonded to an inner side surface of the growth chamber cover, and the source material may be placed into the growth chamber body. The growth chamber cover with the seed crystal bonded may be covered to a top portion of the growth chamber body.

First, an adhesion agent may be uniformly covered on the inner side surface of the growth chamber cover, and then the growth chamber cover coated with the adhesion agent may be placed in a heating furnace. The growth chamber cover may be maintained for 5 hours in a temperature range of 150° C. to 180° C. The temperature may be increased to 200° C., and the temperature may be maintained for 7 hours to 10 hours. When the temperature is cooled to room temperature, the growth chamber cover may be taken out. The seed crystal may be then placed at a center of the inner side surface of the growth chamber cover, a silicon carbide single wafer may be placed on the seed crystal, and a stainless steel block may be placed on the silicon carbide single wafer. The growth chamber cover may be then placed in the heating furnace, and maintained for 5 hours in a temperature range of 380° C. to 430° C. When the temperature is cooled to room temperature, the growth chamber cover may be taken out.

A size of the seed crystal may include 4 inches, 8 inches, etc. A type of the seed crystal may include 4H—SiC, 6H—SiC, etc. A direction of a growth surface of the seed crystal may be <0001> deflecting 4 degrees to 6 degrees pointing to a direction of $[11\bar{2}0]$. The adhesion agent may include epoxy resin, an AB glue, phenolic resin, a sugar glue, etc. In some embodiments, the adhesion agent may include a sucrose with a purity of 99.9%. The stainless steel block may be used to apply a certain pressure to the silicon carbide single wafer, the seed crystal, and the growth chamber cover to promote that the seed crystal is bonded to the inner side surface of the growth chamber cover. During the process for bonding and fixing the seed crystal, due to reasons such as the non-uniformity of the adhesion agent, a poor machining accuracy of the inner side surface of the growth chamber cover, etc., bubbles or voids may be caused between a rear surface of the seed crystal and the inner side surface of the growth chamber cover, further causing crystal defects. Therefore, when the seed crystal is placed at the center of the inner side surface of the growth chamber cover, it is necessary to avoid an occurrence of the bubbles or voids. In some embodiments, before the seed crystal is bonded to the inner side surface of the growth chamber cover, the seed crystal may be cleaned to remove contaminants on the surface of the seed crystal. In some embodiments, the seed crystal may be cleaned with deionized water, an organic solvent, etc.

Next, the source material (e.g., silicon carbide powder) may be placed in the growth chamber body and a distance between the upper surface of the source material and the crystal growth surface may be within a range of 30 millimeters to 100 millimeters. A particle diameter of the source material may be within a range of 30 microns to 50 microns. A surface of the source material placed in the growth chamber body may be maintained flat.

After the source material is placed into the growth chamber body, the growth chamber cover with the seed crystal bonded may be bonded to the top portion of the growth chamber body to form a closed space to facilitate the crystal growth.

In 1920, the temperature compensation component may be mounted to an upper surface and/or a lower surface of the growth chamber. In some embodiments, the first temperature compensation component-1 and the second temperature compensation component-2 may be mounted to the upper surface and the lower surface of the growth chamber, respectively.

First, the first temperature compensation component-1 may be fixed to the upper surface of the growth chamber, so that a peripheral region of a lower surface of the first temperature compensation component-1 is in contact with a peripheral region of the upper surface of the growth chamber. Accordingly, heat at the peripheral region of the upper surface of the growth chamber may be conducted to a central region of the upper surface of the growth chamber. Then, the second temperature compensation component-2 may be fixed to the lower surface of the growth chamber, so that a peripheral region of an upper surface of the second temperature compensation component-2 is in contact with a peripheral region of the lower surface of the growth chamber. Accordingly, heat at the peripheral region of the lower surface of the growth chamber may be conducted to a central region of the lower surface of the growth chamber. The first temperature compensation component-1 or the second temperature compensation component-2 may include a high thermal conductivity graphite body. A shape of the first temperature compensation component-1 or the second temperature compensation component-2 may be a circular disk.

In 1930, the heating component may be disposed outside the growth chamber.

First, a resistance heating element may be placed outside the growth chamber so that the growth chamber is located at a central position of the resistance heating element. The resistance heating element may at least include the first heating module, the second heating module, and the third heating module. The first heating module may be configured to heat a crystallization region of the growth chamber. The second heating module may be configured to heat a vapor transmission region between the crystallization region of the growth chamber and a source material region of the growth chamber. The third heating module may be configured to heat the source material region of the growth chamber. Heating powers of the heating modules may be controlled separately. The resistance heating element may include a circular high resistance graphite heating element.

Then, the electrode fixing plate may be disposed in an outside of the resistance heating element, so that at least one first electrode is fixed to the outside of the resistant heating element by passing through one of at least two holes on the electrode fixing plates, and at least one second electrode is fixed to the outside of the resistant heating element by passing through one of at least two holes on the electrode fixing plates simultaneously. Further, upper ends of the at least one first electrode and the at least one second electrode may be connected to a water-cooled copper wire, and the water-cooled copper wire may be connected to a power source. Each of the first electrode and the second electrode may include a low resistance graphite electrode. The electrode fixing plate may include a zirconia ceramic plate.

In some embodiments, the process may also include disposing an insulation layer around the outside of the heating component.

The insulation layer may be disposed around the outside of the heating component for insulating the growth chamber and/or the heating component. The insulation layer may include graphite or zirconia ceramic. A thickness of the insulation layer and a spacing distance between the insulation layer and the heating component may be adjusted according to the size of the growth chamber, the type of the crystal to be grown, the heating power of the resistance heating element, temperature information related to the growth chamber during the crystal growth, etc.

In 1940, the growth chamber may be heated by the heating component and the temperature compensation component. A pressure may be controlled in a range of 5 Torr to 30 Torr by introducing an inert gas into the growth chamber and the growth chamber may be heated by the first heating component and the temperature compensation component.

Before the growth chamber is heated, the inert gas (e.g., argon) may be introduced into the growth chamber to exclude the air in the growth chamber. The growth chamber may be then heated by the heating component and the temperature compensation component.

In 1950, heating powers of the heating component and/or the temperature compensation component may be adjusted by a control component during the crystal growth based on at least one crystal growth parameter (e.g., an amount of the source material, a crystal growth size, a height difference between a crystal growth interface and the source material), so that a temperature field between the crystal growth interface and the source material 160 is maintained stable.

In some embodiments, during the crystal growth, a heating power (e.g., an average heating power) of the first temperature compensation component-1 may be controlled to be less than a heating power (e.g., an average heating power) of the first heating module. The heating power of the first heating module 1230-1 may be controlled to be less than a heating power (e.g., an average heating power) of the second heating module. The heating power of the second heating module may be controlled to be less than a heating power (e.g., an average heating power) of the third heating module. The heating power (e.g., an average heating power) of the third heating module may be controlled to be equal to a heating power (e.g., an average heating power) of the second temperature compensation component-2. As the crystal grows, the source material 160 may be constantly consumed, the temperature field between the crystal growth interface and the source material may be lowered. In order to maintain the temperature field between the crystal growth interface and the source material substantially stable, the heating powers of the first heating module, the second heating module, and the third heating module may be adjusted, thereby maintaining a downward speed of the temperature field close to a crystal growth rate (e.g., 0.8 mm/h to 2 mm/h). In addition, as the crystal grows, in order to maintain the temperature gradient stable, the heating power of the first temperature compensation component-1 may be reduced. In some embodiments, the reduced heating power may be within a range of 0.1% to 0.5%.

In some embodiments, during the crystal growth, a temperature of the growth chamber may be maintained within a range of 2200° C. to 2400° C. when the source material is sublimated, and a duration of the sublimation of the source material may be within a range of 40 hours to 60 hours. In some embodiments, during the crystal growth, the pressure of the growth chamber may be controlled in the range of 5 Torr to 30 Torr.

It should be noted that the above description of the process 1900 is merely provided for illustration, and not intended to limit the scope of the present disclosure. For persons having ordinary skills in the art, multiple variations and modifications may be made to the process 1900 under the teachings of the present disclosure. However, those variations and modifications do not depart from the scope of the present disclosure. The above preparation process is merely provided for illustration purposes, process parameters involved in different embodiments may be the same or different. A sequence of the above operations may not be unique, and the sequence between the operations may be adjusted in different embodiments. One or more operations may be omitted. The above examples should not be intended to limit the scope of the present disclosure.

Having thus described the basic concepts, it may be rather apparent to those skilled in the art after reading this detailed disclosure that the foregoing detailed disclosure is intended to be presented by way of example only and is not limiting. Various alterations, improvements, and modifications may occur and are intended to those skilled in the art, though not expressly stated herein. These alterations, improvements, and modifications are intended to be suggested by this disclosure and are within the spirit and scope of the exemplary embodiments of this disclosure.

Moreover, certain terminology has been used to describe embodiments of the present disclosure. For example, the terms "one embodiment," "an embodiment," and "some embodiments" mean that a particular feature, structure, or characteristic described in connection with the embodiment is included in at least one embodiment of the present disclosure. Therefore, it is emphasized and should be appreciated that two or more references to "an embodiment" or "one embodiment" or "an alternative embodiment" in various portions of this specification are not necessarily all referring to the same embodiment. Furthermore, the particular features, structures, or characteristics may be combined as suitable in one or more embodiments of the present disclosure.

Those skilled in the art appreciate that various variations and improvements may occur in the contents disclosed in the present disclosure. For example, the components of different system described above are implemented by hardware devices, but may also be implemented only by software solutions. For example, installing the system on an existing server. Further, the supply information disclosed herein may be implemented by a combination of firmware, firmware/software, a combination of firmware/hardware, or a combination of hardware/firmware/software.

All software or some of them may sometimes communicate over the network, such as the internet or other communication networks. Such communication may load software from one computer device or processor to another. For example, a management server or host computer of the radiotherapy system is loaded into a hardware platform in a computer environment, or other computer environment implementing the system, or a system with similar functions related to providing information required to determine the target structural parameters of the wheelchair. Therefore, another medium capable of transmitting a software element may also be used as a physical connection between the local devices, such as optical waves, radio waves, electromagnetic waves, or the like, and propagation via cable, cable, or air. Physical medium used to carriers such as cables, wireless connection, or optic cables, or the like, may also be considered to be a medium carrying software. As used herein, unless tangible "storage" media are limited, other terms referring to the computer or machine "readable medium" represent the media involved in the process of performing any instructions.

The computer program code required for the operation of each part of this manual may be written in any one or more programming languages, including object-oriented programming languages such as Java, Scala, Smalltalk, Eiffel, JADE, Emerald, C++,C#, VB.NET, Python, or the like, and conventional programming languages such as C language, Visual Basic, Fortran 2003, Perl, COBOL 2002, PHP, ABAP, dynamic programming languages such as python, ruby and groovy, or other programming languages. The program code may be completely run on the user's computer, run on the user's computer as a separate software package, partially run on the user's computer and partially run on the remote computer, or completely run on the remote computer or server. In the latter case, the remote computer may be connected to the user computer through any network, such as a local area network (LAN), a wide area network (WAN), connected to an external computer (such as through the Internet), in a cloud computing environment, or used as a service, such as software as a service (SaaS).

Furthermore, the recited order of processing elements or sequences, or the use of numbers, letters, or other designations therefore, is not intended to limit the claimed processes and methods to any order except as may be specified in the claims. Although the above disclosure discusses through various examples what is currently considered to be a variety of useful embodiments of the disclosure, it is to be understood that such detail is solely for that purpose and that the appended claims are not limited to the disclosed embodiments, but, on the contrary, are intended to cover modifications and equivalent arrangements that are within the spirit and scope of the disclosed embodiments. For example, although the implementation of various components described above may be embodied in a hardware device, it may also be implemented as a software only solution, e.g., an installation on an existing server or mobile device.

Similarly, it should be appreciated that in the foregoing description of embodiments of the present disclosure, various features are sometimes grouped together in a single embodiment, figure, or description thereof for the purpose of streamlining the disclosure aiding in the understanding of one or more of the various embodiments. This method of disclosure, however, is not to be interpreted as reflecting an intention that the claimed subject matter requires more features than are expressly recited in each claim. Rather, claim subject matter lies in less than all features of a single foregoing disclosed embodiment.

In some embodiments, the numbers expressing quantities, properties, and so forth, used to describe and claim certain embodiments of the application are to be understood as being modified in some instances by the term "about," "approximate," or "substantially." For example, "about," "approximate" or "substantially" may indicate ±20% variation of the value it describes, unless otherwise stated. Accordingly, in some embodiments, the numerical parameters set forth in the written description and attached claims are approximations that may vary depending upon the desired properties sought to be obtained by a particular embodiment. In some embodiments, the numerical parameters should be construed in light of the number of reported significant digits and by applying ordinary rounding techniques. Notwithstanding that the numerical ranges and parameters setting forth the broad scope of some embodiments of the application are approximations, the numerical values set forth in the specific examples are reported as precisely as practicable.

Each of the patents, patent applications, publications of patent applications, and other material, such as articles, books, specifications, publications, documents, things, and/or the like, referenced herein is hereby incorporated herein by this reference in its entirety for all purposes, excepting any prosecution file history associated with same, any of same that is inconsistent with or in conflict with the present document, or any of same that may have a limiting affect as to the broadest scope of the claims now or later associated with the present document. By way of example, should there be any inconsistency or conflict between the description, definition, and/or the use of a term associated with any of the incorporated material and that associated with the present document, the description, definition, and/or the use of the term in the present document shall prevail.

In closing, it is to be understood that the embodiments of the application disclosed herein are illustrative of the principles of the embodiments of the application. Other modifications that may be employed may be within the scope of the application. Thus, by way of example, but not of limitation, alternative configurations of the embodiments of the application may be utilized in accordance with the teachings herein. Accordingly, embodiments of the present application are not limited to that precisely as shown and described.

What is claimed is:

1. A method for producing a composite crystal, the method being executed in a multi-chamber growth device, the multi-chamber growth device including a plurality of chambers and conveyance assemblies in the plurality of chambers respectively, wherein the plurality of chambers include an in-situ etching chamber, a carbonization chamber, a growth chamber, and a buffer chamber, and the conveyance assemblies in the plurality of chambers include a conveyance assembly in the in-situ etching chamber, a conveyance assembly in the carbonization chamber, a conveyance assembly in the growth chamber, and a conveyance assembly in the buffer chamber, the method comprising:

conveying and processing at least one substrate between the in-situ etching chamber. the carbonization chamber, the growth chamber, and the buffer chamber, successively, wherein the conveyance assembly in the in-situ etching chamber, the conveyance assembly in the carbonization chamber, the conveyance assembly in the growth chamber, and the conveyance assembly in the buffer chamber are connected successively in a head-tail-head-tail manner; and in the growth chamber, obtaining at least one composite crystal by growing a target crystal through vapor deposition, the at least one composite crystal including the at least one substrate and the target crystal, wherein a temperature of the carbonization chamber is pre-adjusted to be close to a temperature of the in-situ etching chamber during conveying the at least one substrate between the in-situ etching chamber and the carbonization chamber, wherein the temperature of the carbonization chamber and the temperature of the in-situ etching chamber are in a range of 1000-1200° C.;

a temperature and a pressure of the growth chamber is pre-adjusted to be close to a temperature and a pressure of the carbonization chamber during conveying the at least one substrate between the carbonization chamber and the growth chamber, wherein the temperature of the growth chamber and the temperature of the carbonization chamber are in a range of 1100-1400° C., and the pressure of the growth chamber and the pressure of the carbonization chamber are in a range of $1\times10^3$-$6\times10^4$ Pa;

a temperature of the buffer chamber is pre-adjusted to be close to a temperature of the growth chamber during conveying the at least one substrate between the growth chamber and the buffer chamber, wherein the temperature of the buffer chamber and the temperature of the growth chamber are in a range of 1400-1700° C.; and processing the at least one substrate in the in-situ etching chamber includes:

maintaining a pressure of the in-situ etching chamber in a range less than $5\times10^{-3}$ Pa and a temperature of the in-situ etching chamber at 400-900° C. for 10-90 min;

introducing hydrogen into the in-situ etching chamber to cause the pressure of the in-situ etching chamber to an atmospheric pressure; and performing an in-situ etching operation by maintaining the temperature of the in-situ etching chamber at 1000-1200° C. for 1-3 min.

2. The method of claim 1, wherein before the conveying and processing at least one substrate between the in-situ etching chamber, the carbonization chamber, the growth chamber, and the buffer chamber successively, the method further includes:

polishing the at least one substrate, or cleaning the at least one substrate.

3. The method of claim 1, wherein the method further includes:

obtaining the target crystal by ultrasonically cleaning, using an etching solution, the composite crystal in a first temperature range for a first time period, a basal plane dislocation density of the target crystal being within a range of 120 to 2000 $cm^{-2}$.

4. The method of claim 1, wherein the method further includes:

before completing the conveying and processing the at least one substrate between the in-situ etching chamber, the carbonization chamber, the growth chamber, and the buffer chamber successively, initiating conveying and processing of another batch of at least one substrate between the in-situ etching chamber, the carbonization chamber, the growth chamber, and the buffer chamber, wherein the substrates of the two batches are conveyed and processed in different chambers of the multi-chamber growth device simultaneously.

5. The method of claim 1, wherein the multi-chamber growth device further includes a vacuum chamber, and the conveyance assemblies in the plurality of chambers further include a conveyance assembly in the vacuum chamber; and the method includes:

placing the at least one substrate in the vacuum chamber before the at least one substrate is processed in the in-situ etching chamber;

adjusting a pressure of the vacuum chamber and a pressure of the in-situ etching chamber to 3-15 Pa, wherein a pressure difference between the vacuum chamber and the in-situ etching chamber does not exceed 5 Pa; and conveying, via the conveyance assembly in the vacuum chamber, the at least one substrate to the in-situ etching chamber.

6. The method of claim 1, wherein processing the at least one substrate in the carbonization chamber includes:

performing a carbonization operation by maintaining a pressure of the carbonization chamber in a range of $1\times10^3$-$6\times10^4$ Pa and a temperature of the carbonization chamber in a range of 1100-1400° C. for 1-3 min.

7. The method of claim 6, wherein the performing the carbonization operation includes:

adjusting the temperature of the carbonization chamber to the range of 1000-1200° C.;

conveying, via the conveyance assembly in the in-situ etching chamber, the at least one substrate to the carbonization chamber;

adjusting the temperature of the carbonization chamber to a range of 800-1000° C. and the pressure of the carbonization chamber to a range less than $1\times10^{-5}$ Pa, and simultaneously introducing propane and hydrogen to cause the pressure of the carbonization chamber to $1\times10^3$-$6\times10^4$ Pa; and performing the carbonization operation by maintaining the pressure of the carbonization chamber in the range of $1\times10^3$-$6\times10^4$ Pa and the temperature of the carbonization chamber in the range of 1100-1400° C. for 1-3 min.

8. The method of claim 7, wherein processing the at least one substrate in the growth chamber includes:

maintaining a temperature of the growth chamber in a range of 1400-1700° C. and a pressure of the growth chamber in the range less than $1\times10^{-5}$ Pa, introducing one or more reaction raw materials, and performing a crystal growth on the at least one substrate by adjusting the pressure of the growth chamber to a range of 30-90 Pa.

9. The method of claim 8, wherein the crystal growth includes:

adjusting the temperature of the growth chamber to the range of 1100-1400° C. and the pressure of the growth chamber to the range of $1\times10^3$-$6\times10^4$ Pa;

conveying, via the conveyance assembly in the carbonization chamber, the at least one substrate to the growth chamber;

adjusting the temperature of the growth chamber to the range of 1400-1700° C. and the pressure of the growth chamber to the range less than $1\times10^{-5}$ Pa;

performing the crystal growth on the at least one substrate by introducing silane, propane, and hydrogen to cause the pressure of the growth chamber to the range of 30-90 Pa; and stopping the crystal growth when a thickness of the target crystal reaches a target thickness.

10. The method of claim 8, wherein processing the composite crystal in the buffer chamber includes:

cooling the composite crystal by maintaining a temperature of the buffer chamber in a range of 500-1200° C. for 2-6 h.

11. The method of claim 10, wherein the cooling the composite crystal includes:

adjusting the temperature of the buffer chamber to the range of 1400-1700° C.;

conveying, via the conveyance assembly in the growth chamber, the composite crystal to the buffer chamber;

adjusting the temperature of the buffer chamber to the range of 500-1200° C.; and cooling the composite crystal by maintaining the temperature of the buffer chamber in the range of 500-1200° C. for 2-6 h.

12. The method of claim 10, wherein the multi-chamber growth device further includes a terminal chamber; and the method further includes:

maintaining a temperature of the terminal chamber at room temperature;

conveying, via the conveyance assembly in the buffer chamber, the composite crystal to the terminal chamber; and cooling the composite crystal to the room temperature.

* * * * *